US008667446B2

(12) United States Patent
Suaya et al.

(10) Patent No.: US 8,667,446 B2
(45) Date of Patent: Mar. 4, 2014

(54) EXTRACTING HIGH FREQUENCY IMPEDANCE IN A CIRCUIT DESIGN USING AN ELECTRONIC DESIGN AUTOMATION TOOL

(75) Inventors: Roberto Suaya, Meylan (FR); Rafael Escovar, Grenoble (FR); Shrinath Thelapurath, Wilsonville, OR (US); Salvador Ortiz, Grenoble (FR); Dusan Petranovic, Cupertino, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 97 days.

(21) Appl. No.: 12/749,237

(22) Filed: Mar. 29, 2010

(65) Prior Publication Data

US 2010/0251191 A1 Sep. 30, 2010

Related U.S. Application Data

(63) Continuation of application No. 11/704,588, filed on Feb. 8, 2007, now Pat. No. 7,689,962.

(60) Provisional application No. 60/771,723, filed on Feb. 8, 2006, provisional application No. 60/855,075, filed on Oct. 27, 2006, provisional application No. 60/861,302, filed on Nov. 27, 2006.

(51) Int. Cl.
*G06F 17/50* (2006.01)

(52) U.S. Cl.
USPC ........... 716/126; 716/129; 716/130; 716/131; 716/132; 716/136; 716/137; 716/138; 716/139

(58) Field of Classification Search
USPC ................ 716/126, 129, 130, 131, 132, 136, 716/137–139
See application file for complete search history.

(56) References Cited

U.S. PATENT DOCUMENTS

| | | | | |
|---|---|---|---|---|
| 5,247,455 | A * | 9/1993 | Yoshikawa | 716/112 |
| 6,381,730 | B1 * | 4/2002 | Chang et al. | 716/134 |
| 6,453,444 | B1 * | 9/2002 | Shepard | 716/102 |
| 6,643,831 | B2 * | 11/2003 | Chang et al. | 716/115 |
| 7,013,442 | B2 | 3/2006 | Suaya et al. | |

(Continued)

OTHER PUBLICATIONS

"ASITIC: Analysis and Simulation of Spiral Inductors and Transformers for ICs," downloaded from http://rfic.eecs.berkeley.edu/~niknejad/asitic.html, 1 p. (document not dated, downloaded on Aug. 15, 2006).

(Continued)

*Primary Examiner* — Stacy Whitmore
(74) *Attorney, Agent, or Firm* — Klarquist Sparkman, LLP

(57) ABSTRACT

Exemplary impedance extraction methods, systems, and apparatus are described herein. In one exemplary embodiment, for instance, a signal-wire segment of a circuit layout is selected. A predetermined number of return paths are identified for the selected signal-wire segment. The selected signal-wire segment and the identified return paths are further segmented into a plurality of bundles, which comprise signal-wire subsegments and one or more associated return-path subsegments that are parallel to and have the same length as the signal-wire subsegments. Loop inductance values and loop resistance values are determined and stored for the signal-wire subsegments in the bundles for at least one frequency of operation. Computer-readable media storing computer-executable instructions for causing a computer to perform any of the disclosed methods or storing data or information created or modified using any of the disclosed techniques are also disclosed.

22 Claims, 26 Drawing Sheets

(56) References Cited

U.S. PATENT DOCUMENTS

| | | | | |
|---|---|---|---|---|
| 7,319,946 | B2 | 1/2008 | Bowen et al. | |
| 7,689,962 | B2 * | 3/2010 | Suaya et al. | 716/122 |
| 2002/0104063 | A1 * | 8/2002 | Chang et al. | 716/4 |
| 2003/0131334 | A1 | 7/2003 | Suaya et al. | |
| 2004/0078176 | A1 | 4/2004 | Bowen et al. | |
| 2005/0120316 | A1 | 6/2005 | Suaya et al. | |
| 2006/0031055 | A1 | 2/2006 | Sheehan | |
| 2006/0143586 | A1 | 6/2006 | Suaya et al. | |
| 2006/0282492 | A1 | 12/2006 | Suaya et al. | |
| 2007/0225925 | A1 | 9/2007 | Suaya et al. | |
| 2007/0226659 | A1 | 9/2007 | Suaya et al. | |
| 2008/0072189 | A1 | 3/2008 | Bowen et al. | |
| 2012/0110539 | A1 * | 5/2012 | Birch et al. | 716/130 |

OTHER PUBLICATIONS

Beatson et al., "A short course on fast multipole methods," in *Wavelets, Multilevel Methods and Elliptic PDEs*, 37 pp. (1997).

Beattie et al., "Efficient Inductance Extraction via Windowing," *Proc. Design, Automation, and Test in Europe*, pp. 430-436 (2001).

Beattie et al., "Hierarchical Interconnect Circuit Models," 7 pp. (also published as Beattie et al., "Hierarchical Interconnect Circuit Models,"*Proc. ICCAD*, pp. 215-221 (Nov. 2000)).

Brassil et al., "The Manhattan Street Network: a high performance, highly reliable metropolitan area network," *Computer Network ISDN System*, vol. 26, No. 6-8, pp. 841-858 (1994).

Cadence Design Systems, Inc., "Assura Parasitic Extraction," 5 pp., downloaded from http://www.cadence.com. (2004).

Cadence Design Systems, Inc., "Assura Parasitic Extraction 3.1.3 Options," 5 pp., downloaded from http://www.cadence.com (2005).

Chen et al., "INDUCTWISE: Inductance-Wise Interconnect Simulator and Extractor," *IEEE Trans. CAD of IC and Systems*, vol. 22, No. 7, pp. 884-894 (2003).

Dennis, Jr. et al., *Numerical Methods for Unconstrained Optimization and Nonlinear Equations*, pp. xi, 68-84 (1996).

Deutsch et al., "When are Transmission-Line Effects Important for On-Chip Interconnections?," *IEEE Trans. on Microwave Theory and Techniques*, vol. 45, No. 10, pp. 1836-1846 (Oct. 1997).

Devgan et al., "How to Efficiently Capture On-Chip Inductance Effects: Introducing a New Circuit Element *K," IEEE*, pp. 150-155 (2000).

Escovar et al., "An Improved Long Distance Treatment for Mutual Inductance," *IEEE Trans. Computer-Aided Design*, vol. 24, No. 5, pp. 783-793 (May 2005).

Escovar et al., "Mutual Inductance Extraction and the Dipole Approximation," ACM, pp. 162-169 (2004).

Escovar et al., "Optimal Design of Clock Trees for Multigigahertz Applications," *IEEE Trans. on Computer-Aided Design of Integrated Circuits and Systems*, vol. 23, No. 3, pp. 329-345 (Mar. 2004).

Escovar et al., "Transmission line design of Clock Trees," *IEEE*, pp. 334-340 (2002).

Greenhouse, "Design of Planar Rectangular Microelectronic Inductors," *IEEE Trans. on Parts, Hybrids and Packaging*, vol. 10, No. 2, pp. 101-109 (Jun. 1974).

Grover, *Inductance Calculations Working Formula and Tables*, pp. 1, 31-61 (1946).

Gupta et al., "The Elmore Delay as a Bound for RC Trees with Generalized Input Signals," *IEEE Trans. on Computer-Aided Design*, vol. 16, No. 1, pp. 95-104 (1997).

Harrington, *Field Computation by Moment Methods*, pp. 1-211 (1993).

He et al., "SPIE: Sparse Partial Inductance Extraction," 4 pp. (also published as He et al., "SPIE: Sparse Partial Inductance Extraction," *Design Automation Conference*, pp. 137-140 (1997)).

Higham, "Factorizing Complex Symmetric Matrices with Positive Definite Real and Imaginary Parts," *Mathematics of Computation*, vol. 67, No. 224, pp. 1591-1599 (Oct. 1998).

Hu et al., "Efficient PEEC-based Inductance Extraction using Circuit-Aware Techniques," *IEEE*, 6 pp. (2002).

Ismail et al., "Effects of Inductance on the Propagation Delay and Repeater Insertion in VLSI Circuits," *IEEE Trans. on VLSI Systems*, vol. 8, No. 2, pp. 195-206 (Apr. 2000).

Ji et al., "KSim: A Stable and Efficient RKC Simulator for Capturing On-Chip Inductance Effect," *IEEE*, pp. 379-384 (2001).

Ji et al., "SPICE Compatible Circuit Models for Partial Reluctance K," *IEEE*, pp. 787-792 (2004).

Kamon et al., "FASTHENRY: A Multipole-Accelerated 3-D Inductance Extraction Program," *IEEE Trans. Microwave Theory Tech.*, vol. 42, No. 9, pp. 1750-1758 (Sep. 1994).

Krauter et al., "Generating Sparse Partial Inductance Matrices with Guaranteed Stability," *IEEE*, pp. 45-52 (1995).

Krauter et al., "Layout Based Frequency Dependent Inductance and Resistance Extraction for On-Chip Interconnect Timing Analyis," *ACM*, pp. 303-308 (1998).

Nabors et al., "FastCap: A Multipole Accelerated 3-D Capacitance Extraction Program," *IEEE Trans. on Computer-Aided Design*, vol. 10, No. 11, pp. 1447-1459 (Nov. 1991).

Niknejad et al., *Design, Simulation and Applications of Inductors and Transformers for SI RF ICs*, pp. 64-69 (2000).

Notice of Allowance dated Jun. 27, 2008, from U.S. Appl. No. 11/704,470 (published as U.S. Publication No. 2007-0225925).

Office action dated Jan. 22, 2008, from U.S. Appl. No. 11/704,470.

Paul, *Analysis of Multiconductor Transmission Lines*, pp. 46-63 (1994).

Ranjan et al., "Use of Symbolic Performance Models in Layout-Inclusive RF Low Noise Amplifier Synthesis," *IEEE*, pp. 130-134 (2004).

Ruehli, "Inductance Calculations in a Complex Integrated Circuit Environment," *IBM J. Res. Develop.*, pp. 470-481 (1972).

Sakurai, "Closed-Form Expressions for Interconnection Delay, Coupling, and Crosstalk in VLSI's," *IEEE Trans. on Electron Devices*, vol. 40, No. 1, pp. 118-124 (Jan. 1993).

Sequence Design, Inc., "Columbus," 2 pp. (2005).

Shepard et al., "Full-chip, three-dimensional, shapes-based RLC extraction," 8 pp. (also published as Shepard et al., "Full-chip, three-dimensional, shapes-based RLC extraction," *IEEE Trans. on Computer-Aided Design of Integrated Circuits and Systems*, vol. 23, No. 5, pp. 711-727 (May 2004)).

Synopsys Inc., "HSpice the Gold Standard for Accurate Circuit Simulation," 4 pp. (2006).

Zhong et al., "Exact Closed Form Formula for Partial Mutual Inductances of On-Chip Interconnects," *IEEE*, pp. 428-433 (2002).

* cited by examiner

2400

3000

EXTRACTING HIGH FREQUENCY IMPEDANCE IN A CIRCUIT DESIGN USING AN ELECTRONIC DESIGN AUTOMATION TOOL

CROSS REFERENCE TO RELATED APPLICATIONS

This application is a continuation of U.S. patent application Ser. No. 11/704,588, filed Feb. 8, 2007 now U.S. Pat. No. 7,689,962, which claims the benefit of U.S. Provisional Patent Application No. 60/771,723, filed Feb. 8, 2006, U.S. Provisional Patent Application No. 60/855,075, filed Oct. 27, 2006, and U.S. Provisional Patent Application No. 60/861,302, filed Nov. 27, 2006, all of which are hereby incorporated herein by reference.

TECHNICAL FIELD

This application pertains generally to the field of analyzing the electrical characteristics of circuit designs. For example, embodiments of the disclosed technology can be used to perform parasitic extraction in a physical synthesis software tool.

BACKGROUND

With integrated circuit frequencies reaching tens of GHz, new high-frequency phenomena are desirably modeled and analyzed during the circuit design process (e.g., during physical verification). As frequency increases, the representation of wires evolves from a single resistance in series with a capacitance to ground, to a distributed version of the same (a concatenation of RC segments or $\pi$ sections), to an R, $\mathcal{L}$, C, distributed circuit. Furthermore, the conventional representations, valid for an isolated wire in the presence of a ground reference, are desirably expanded to include both the nature of the power and ground wires, with physical values for their respective inductance and resistance, as well as the mutual couplings among different wires.

To get an idea of the complexity associated with this problem, consider a typical circuit. A typical leading edge digital circuit at 65 nm contains approximately $O(3*10^9)$ transistors, and approximately $O(10^{10})$ wires. Each wire, on average, contains 10 segments, and the electrical properties of a wire are typically decomposed in terms of their constituent segments. Furthermore, each wire segment has on average a few segments that can be classified as nearest neighbors whose mutual couplings are desirably considered. The global storage demands for a description of this exemplary circuit amount to approximately: (1) $10^{11}$ real numbers for storing resistance values; (2) $10^{11}$ real numbers for storing capacitance to ground values; (3) $10^{22}$ real numbers for storing mutual capacitance values; (4) 10" real numbers for storing self inductance values; and (5) $10^{22}$ complex numbers for storing mutual inductance values.

Because the computational and storage demands for this problem are undesirably large and impractical in real-world applications, computationally efficient, yet accurate, improved modeling and analysis techniques for parasitic effects in high-speed circuits are needed for circuit designers and for electronic design automation (EDA) software vendors that develop the tools used to create, simulate, verify, and optimize integrated circuit designs.

SUMMARY

Described herein are embodiments of methods for extracting various high frequency parameters for a circuit design. Certain embodiments of the disclosed methods are both computationally efficient and support varying degrees of accuracy depending on the application. For example, in certain modes, the embodiments can exhibit field solver accuracy, when such is desirable, whereas in other modes, embodiments of the disclosed technology exhibit more moderate accuracy (e.g., for studies that only require the knowledge of bounds, as in noise applications).

In one exemplary embodiment, a computer-implemented method is described in which at least a portion of a circuit description is loaded. In this embodiment, the circuit description is indicative of a layout (e.g., a geometrical layout) of signal-wire segments, ground-wire segments, and power-wire segments. A signal-wire segment of a signal wire is selected. A predetermined number of return paths are identified for the selected signal-wire segment. The return paths comprise ground-wire segments, power-wire segments, or both ground-wire segments and power-wire segments. The selected signal-wire segment and the identified return paths are further segmented into a plurality of bundles, which comprise signal-wire subsegments and one or more associated return-path subsegments that are parallel to and have the same length as the signal-wire subsegments. Loop inductance values and loop resistance values are determined for the signal-wire subsegments in the bundles for at least one frequency of operation. The loop inductance values and the loop resistance values are stored for the signal-wire segments in one or more computer-readable media. In certain embodiments, a combined loop inductance value and a combined loop resistance value can be determined and stored for the selected signal-wire segment. The act of determining the combined loop inductance value and the combined loop resistance value can comprise, for example, determining a mutual loop inductance between two adjacent bundles to account for forward coupling. In some embodiments, a bundle having a length greater than a predetermined amount can be determined and segmented into two or more bundles of lesser length. In certain embodiments, the act of determining the loop inductance values and the loop resistance values comprises solving Kirchoff equations for one or more of the bundles. In certain embodiments, the predetermined number of return paths is n (e.g., 1, 2, 3, and so on), and the return paths identified are the nearest n of the ground—wire segments and power-wire segments to the selected signal-wire segment. Furthermore, in some embodiments, a user interface is provided whereby a user can select the predetermined number of return paths. In certain embodiments, the signal wires in the circuit description are evaluated to identify signal wires not to select for impedance extraction. This evaluation can be based at least in part on one or more of a length of the signal wires, a strength of drivers driving the signal wires, and a resistance of the signal wires. A filtered list of signal wires can be created based on the evaluation. Further, in some embodiments and for two or more of the bundles, values representative of the mutual inductance between at least two of the bundles can be determined. In certain embodiments, loop inductance and loop resistance values are determined for a frequency of operation above which skin effects appear. In such embodiments, the act of determining loop inductance values and loop resistance values can further include representing the signal-wire subsegment of one or more of the bundles as a plurality of filaments. In some embodiments, the circuit description is further indicative of one or more ground planes. In such embodiments, the act of identifying the predetermined number of return paths can further comprise partitioning one or more of the ground planes into a plurality of return paths, and the identified return paths can further comprise one or more return paths from the partitioned one or more of the ground planes. In certain embodiments, a netlist representative of the electrical characteristics of the circuit design is generated and stored. The netlist can comprise, for example, values determined at least in part from the loop inductance values and the loop resistance values. The netlist can further further comprise values representative of the mutual inductance between at least two of the signal-wire segments. In certain embodiments, the size of the netlist is reduced using model order reduction techniques.

In another disclosed embodiment, a user interface is provided that allows a user to select a maximum number of paths to be used as return paths for signal-wire segments during an impedance extraction process. A signal-wire segment is selected from a circuit description. In this embodiment, the circuit description is indicative of a layout of signal-wire segments, ground-wire segments, and power-wire segments in a circuit design. Return paths for the selected signal-wire segment are identified. The return paths comprise, for example, ground-wire segments, power-wire segments, or both ground-wire segments and power-wire segments. Further, in this embodiments, the number of return paths identified is limited by the maximum number selected by the user. One or more inductance values and one or more resistance values are determined for the signal-wire segment and stored. In this embodiment, the determination is based at least in part on the identified return paths. In certain embodiments, the user selectable number of return paths is n, and the return paths identified are the nearest n of the ground-wire segments, power-wire segments, or both ground-wire segments and power-wire segments to the selected signal-wire segment.

In another disclosed embodiment, at least a portion of a circuit description is loaded. In this embodiment, the circuit description is indicative of the layout of at least signal wires, signal-wire segments, ground wires, ground-wire segments, power wires, and power-wire segments in the circuit design. A signal wire is selected. One or more neighboring signal wires that could electrically couple with the signal wire through mutual impedance are identified. For example, the wires can be identified by generating one or more three-dimensional regions centered on respective signal-wire segments of the signal wire, and searching the three-dimensional region for neighboring signal wires that are at least partially within the three-dimensional region. One or more values representative of the mutual impedance between the signal wire and the identified neighboring signal wires are determined and stored. In this embodiment, the mutual impedance is the mutual inductance, the mutual resistance, or both the mutual inductance and the mutual resistance between the signal wires. In certain embodiments, the three-dimensional region is a cylindrically shaped region having a predetermined diameter (e.g., a user-selected diameter). In some embodiments, the act of identifying further comprises selecting from the neighboring signal wires that are at least partially within the three-dimensional region those neighboring signal wires that have a predetermined percentage (e.g., a user-selectable percentage) or more of their respective lengths within the three-dimensional region. In certain embodiments, the act of determining the one or more values representative of the mutual impedance between the signal wire and the identified neighboring signal wires comprises, for a selected signal-wire segment, further segmenting the signal wire into a plurality of interaction regions that have a length no greater than a predetermined value. In some embodiments, the act of determining the one or more values representative of the mutual impedance between the signal wire and the identified neighboring signal wires further comprises, for a selected interaction region, further segmenting the signal wire into a plurality of bundles, the bundles comprising signal-wire subsegments and one or more neighboring-signal-wire subsegments, the neighboring-signal-wire subsegments being parallel to and having the same length as a corresponding signal-wire subsegment. Further, in certain embodiments, the act of determining the one or more values representative of the mutual impedance between the signal wire and the identified neighboring signal wires further comprises, computing mutual impedance values for two or more of the bundles, and adding the mutual impedance values together to form a combined mutual impedance value for the two or more bundles. In some embodiment, a netlist representative of the electrical characteristics of the circuit design is generated and stored. The netlist can comprise, for example, the one or more values representative of the mutual impedance between the signal wire and the identified neighboring signal wires. In some embodiments, the netlist further comprises values representative of self impedance of the signal wire and capacitance couplings of the signal wire to ground.

In another disclosed embodiment, at least a portion of a circuit description is loaded. In this embodiment, the circuit description is indicative of a layout of at least signal-wire segments, ground-wire segments, and power-wire segments in a circuit design. A signal-wire segment is selected. Loop inductance values and loop resistance values for the signal-wire segment are determined at least a first frequency of operation and a second frequency of operation. Values for one or more inductance components and one or more resistance components of a broadband representation of the signal-wire segment are computed and stored. In this embodiment, the broadband representation comprises at least one but no more than two parallel-coupled resistance components and inductance components, the values computed being based at least in part on the determined loop inductance values and loop resistance values. In some embodiments, the values for the one or more inductance components and the one or more resistance components are constant values. In certain embodiments, each of the parallel-coupled resistance components and inductance components is a Foster pair. In some embodiments, the broadband representation further comprises an inductance component and a resistance component coupled in series with the one but no more than two parallel-coupled resistance components and inductance components. Further, in certain embodiments, the broadband representation comprises only one parallel-coupled resistance component and inductance component, and further comprises a resistance component and an inductance component coupled in series with the parallel-coupled resistance component and inductance component. In some embodiments, the broadband representation is selected from among a plurality of possible broadband representations prior to the act of computing. Furthermore, in certain embodiments, the first frequency is lower than the second frequency, and the second frequency is equal to or substantially equal to the inverse of the rise time for the selected wire segment. In some embodiments, the first frequency is lower than the second frequency, and the first frequency is a frequency below which proximity effects or skin effects begin to appear in the circuit design, and the second frequency is a frequency above which proximity effects or skin effects begin to appear in the circuit design. Further, in certain embodiments, a netlist representative of the electrical characteristics of the circuit design is generated and stored. The netlist can comprise, for example, the broadband representation of the signal-wire segment.

In another disclosed embodiment, at least a portion of a circuit description is loaded. In this embodiment, the circuit description is indicative of a layout of at least signal-wire segments, ground-wire segments, and power-wire segments in a circuit design. A signal-wire segment is selected. Loop inductance values and loop resistance values for the signal-wire segment at a plurality of different frequencies of operation are determined. A determination is made as to whether one or more step transitions in the loop inductance and loop resistance of the signal-wire segment occur between frequencies of the plurality of different frequencies. A representation of the signal-wire segment is generated and stored using one of a plurality of different representation types. In this embodiment, the representation type used is dependent at least in part on the number of step transitions determined. The plurality of different representation types can consist of, for example, a representation with no Foster pair, a representation with one and only one Foster pair, and a representation with two and only two Foster pairs. In certain embodiments, the act of generating the representation further comprises using the representation with no Foster pairs if no step transition occurs between frequencies of the plurality of different frequencies; using the representation with one and only one Foster pair if one step transition occurs between frequencies of the plurality of different frequencies; or using the representation with two and only two Foster pairs if two step transitions occur between frequencies of the plurality of the different frequencies. Furthermore, in some embodiments, the act of determining the occurrence of one or more step transitions further comprises, when two step transitions are determined to occur, determining whether the two step transitions have respective characteristic frequencies that are indistinct from each other based at least in part on a predetermined criteria, and generating a representation of the signal-wire using a representation with one and only one Foster pair if the respective characteristic frequencies are determined to be indistinct. Moreover, in some embodiments, a first of the frequencies in the plurality of frequencies is a frequency below which skin effects (and/or proximity effects) begin to appear, and a second of the frequencies in the plurality of frequencies is a frequency above which skin effects (and/or proximity effects) begin to appear. Further, in some embodiments, a netlist representative of the electrical characteristics of the circuit design is generated and stored. The netlist can comprise the representation of the signal-wire segment.

In another disclosed embodiment, a user interface is provided that allows a user to select whether to perform an impedance extraction process for a single frequency or for a range of frequencies. Impedance extraction is performed for the single frequency or the range of frequencies responsive to the selection made by the user via the user interface. A netlist is generated and stored comprising electrical parameters indicative of at least inductance and resistance of signal-wire segments in a circuit design. In this embodiment, the netlist includes signal-wire representations that have values determined by the impedance extraction. In certain embodiments, the act of performing impedance extraction comprises generating broadband representations for respective signal-wire segments when impedance extraction is performed for a range of frequencies. Furthermore, in some embodiments, the broadband representations can consist of broadband representations having no more than two Foster pairs.

Any of the disclosed methods may be performed by a computer program, such as an electronic-design-automation (EDA) software tool comprising computer-executable instructions stored on one or more computer-readable media. All such media are considered to be within the scope of this disclosure. Any of the disclosed methods implemented in a computer environment can also be performed by a single computer or via a network. Any of the disclosed methods can be used to generate and store one or more data structures or databases (e.g., a Spice or Spice-type netlist) having impedance information (or intermediate impedance information) determined using any of the disclosed methods. All such data structures and databases (stored, for example, on one or more computer-readable media) are considered to be within the scope of this disclosure. The disclosed methods can also be used at least in part to modify or design a circuit represented as circuit design information stored on a computer-readable medium. The circuit design information can comprise, for example, a circuit design file (such as a GDSII or Oasis file). All such types of circuit design information are considered to be within the scope of this disclosure.

The foregoing and additional features and advantages of the disclosed embodiments will become more apparent from the following detailed description, which proceeds with reference to the following drawings.

DETAILED DESCRIPTION

1. General Considerations

Figure 1A:
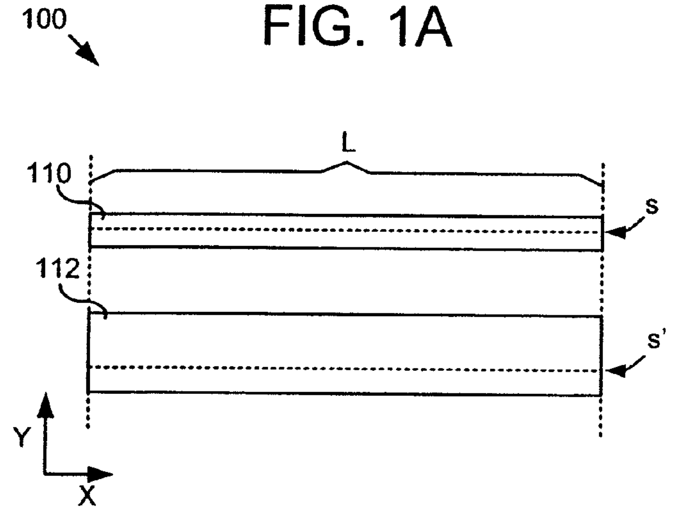
FIG. 1A is a schematic block diagram showing a top view of a first set of exemplary wire segments and certain parameters of the segments.

Disclosed below are representative embodiments of methods for extracting impedance in a circuit design. The disclosed methods should not be construed as limiting in any way. Instead, the present disclosure is directed toward all novel and nonobvious features and aspects of the various disclosed embodiments, alone and in various combinations and subcombinations with one another. The methods are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "receive" and "group" to describe the disclosed methods. These terms are high-level abstractions of the actual operations that are performed. The actual operations that correspond to these terms will vary depending on the particular implementation and are readily discernible by one of ordinary skill in the art.

The disclosed technology can be used, for example, to analyze impedance effects on digital, analog, or mixed-signal integrated circuits. The disclosed technology can be applied, for example, to any circuit or situation where parasitic impedance effects may affect signal delay or signal integrity. For instance, the disclosed embodiments can be used to analyze the high-frequency behavior of wires or interconnect in an integrated circuit design (e.g., an application-specific integrated circuit (ASIC), a programmable logic device (PLDs) such as a field progjammable gate array (FPGA), a system-on-a-chip (SoC), or a microprocessor) or in the off-chip interconnect at the board or package level (e.g., multilayered packages or printed circuit boards).

Any of the disclosed methods can be performed using software stored on a computer-readable medium and executed on a computer. Such software can comprise, for example, an electronic-design-automation (EDA) software tool used, for instance, for physical verification or synthesis. Such software can be executed on a single computer (e.g., any suitable commercially available computer) or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in detail.

Further, any of the disclosed methods can be used to generate a representation of the electrical characteristics of a circuit, such as a Spice or Spice-like netlist. Any of the disclosed methods can also be used to modify or design a circuit represented as circuit design information stored on computer-readable media. The circuit design information can comprise, for example, one or more design files or data structures (such as a GDSII or Oasis file) and can be created or modified on a single computer or via a network. Additionally, impedance information or any intermediate information determined using any of the disclosed methods may be stored in one or more data structures or design databases stored on computer-readable media.

The disclosed methods can be used at one or more stages of an overall synthesis scheme. For example, any of the inductance extraction methods disclosed can be used during physical synthesis (e.g., during the physical verification process) in order to evaluate and improve the implemented design.

2. Exemplary Pre-Processing Techniques

In certain exemplary embodiments of the disclosed technology, the input data is given in terms of the layout of the integrated circuit (IC). In addition, a technology file quantifying the relative positions of the layers, including the substrate, their conductivities and dielectric constants can also be input. For example, in exemplary embodiments, the layout file is a GDSII or OASIS file, and the technology file is a Standard Verification Rules Format (SVRF) file.

2.1. Layout Versus Schematics (LVS) Checking

As an additional preprocessing step, a standard LVS checking can be performed. LVS checking can comprise, for example, reading the layout file and discriminating devices from interconnects. Information about interconnects can be stored in a database, such as a so-called persistent hierarchical database (PHDB). Electrical information about the devices can be stored in a netlist (e.g. Eldo®, Spice).

2.2. Parasitics Database

The PHDB can be processed in order to extract geometrical information about the interconnect wires. According to one exemplary embodiment, shapes in the PHDB belonging to wire nets are broken (or fractured) in such a way as to have straight segments of wire with their entire volume in the same layer and with constant width. This can be done, for example, by searching for discontinuities such as changes in direction and changes in width. For instance, each time a discontinuity is found, the wire can be decomposed at that point. The broken layout can be represented using a database where geometrical information for each of these wire segments is stored. In one exemplary embodiment, each wire segment is represented by the center line coordinates of the extremes, width, layer and resistivity. Additional placeholders for electrical parameters can also be created and used downstream to store electrical parameters. For example, the following electrical parameters can be created: frequency, resistance R, and inductance L. At the end of each wire segment, a linking table pointing to other wire segments' nodes can be used to store the capacitance to ground C, and both the coupling capacitance CC and coupling impedance K with these other wire segments. The database resulting from this exemplary technique is referred to herein as the database "Parasitic Database" (PDB).

2.3. Capacitance Extraction

According to one exemplary embodiment of the disclosed technology, the capacitance to ground for each wire segment and the coupling capacitance among signal-wire segments are extracted before impedance extraction is performed (see, e.g., *Performing Hierarchical Parasitic Extraction and Netlisting*, Mentor Graphics Corporation (2005)). The capacitance values computed can be stored, for example, in the corresponding placeholders (or fields) found in the PDB.

3. Impedance Extraction, in General

In this section, the industry standard practice of providing a layout in two orthogonal directions (x,y) as recommended for lithography considerations is discussed first. This layout is usually referred to as a Manhattan layout. Subsequently, more general layout styles will be considered.

3.1. Impedance Formulae, in General

The impedance of a closed wire loop at a frequency f is given by:

$$Z=R+j2\pi f\mathcal{L} \tag{1}$$

with R and $\mathcal{L}$ the resistance and inductance of the wire, respectively. Closed wire loops of rectangular cross sections can be decomposed into constituent rectilinear segments. Consider one such segment, of cross-section area a and length L. Its D.C. resistance can be given by:

$$R_{dc}=\frac{L}{\sigma a}, \tag{2}$$

with σ the wire conductivity. Upon decomposing the segment into thin filaments parallel to the current direction, the partial mutual inductance between two parallel filaments is given by:

$$\mathcal{M}_{fil}=\frac{\mu_0}{4\pi}\int_0^L\int_0^L\frac{1}{\sqrt{(l-l')^2+d^2}}\,dl\,dl' \tag{3}$$

with d the distance between the filaments, and $\mu_0$ the magnetic permeability of the vacuum ($\mu_0=4\pi\times10^{-7}$ H/m).

The more exact solution to the above integral is:

$$\mathcal{M}_{fil} = \frac{\mu_0 L}{2\pi}\left[\ln\left(\frac{L}{d} + \sqrt{1 + \frac{L^2}{d^2}}\right) - \sqrt{1 + \frac{d^2}{L^2}} + \frac{d}{L}\right]. \tag{4}$$

To obtain the partial self inductance of a wire with finite cross-section, expression (4) can be integrated twice across its cross-section. The resulting partial self inductance can be given by:

$$\mathcal{L} = \frac{\mu_0 L}{2\pi}\int_S\int_S\left[\ln\left(\frac{L}{\|x - x'\|} + \sqrt{1 + \frac{L^2}{\|x - x'\|^2}}\right) - \sqrt{1 + \frac{\|x - x'\|^2}{L^2}} + \frac{\|x - x'\|}{L}\right]ds\,ds' \tag{5}$$

with S the wire's cross-section.

Figure 1B:
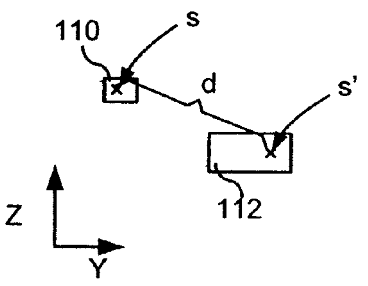
FIG. 1B is a schematic block diagram showing a cross-sectional view of the exemplary wire segments of FIG. 1A.

Analogously, to obtain the partial mutual inductance between two parallel wires with finite cross-sections and sharing the same perpendiculars, expression (4) can be integrated across the two cross-sections:

$$\mathcal{M} = \frac{\mu_0 L}{2\pi}\int_S\int_{S'}\left[\ln\left(\frac{L}{\|x - x'\|} + \sqrt{1 + \frac{L^2}{\|x - x'\|^2}}\right) - \sqrt{1 + \frac{\|x - x'\|^2}{L^2}} + \frac{\|x - x'\|}{L}\right]ds\,ds' \tag{6}$$

with S and S' being the respective wire cross-sections. FIGS. 1A and 1B are diagrams 100, 102 illustrating a first wire 110 and a second wire 112 of length L and constant cross section. Both the first wire 110 and the second wire 112 share the same perpendicular and exhibit a partial mutual inductance that can be calculated using Equation (6).

There are more exact solutions for both expressions (5) and (6) for the case of rectangular cross-sections. For example, the solution for the partial self inductance of rectangular wires is attributable to Ruehli (see, e.g., A. E. Ruehli, "Inductance calculations in a complex circuit environment," *IBM JRes.Develop., vol.* 16, pp. 470-481 (1972)) and is given by:

$$\mathcal{L} = \frac{2\mu_0 L}{\pi}\left\{\frac{1}{4}\left[\frac{1}{W}\sinh^{-1}\frac{W}{\alpha_t} + \frac{1}{T}\sinh^{-1}\frac{T}{\alpha_w} + \sinh^{-1}\frac{1}{r}\right] + \frac{1}{24}\left[\frac{T^2}{W}\sinh^{-1}\frac{W}{T\alpha_t(r+\alpha_r)} + \frac{W^2}{T}\sinh^{-1}\frac{T}{W\alpha_w(r+\alpha_r)} + \frac{T^2}{W^2}\sinh^{-1}\frac{W^2}{Tr(\alpha_t+\alpha_r)} + \frac{W^2}{T^2}\sinh^{-1}\frac{T^2}{Wr(\alpha_w+\alpha_r)} + \frac{1}{WT^2}\sinh^{-1}\frac{WT^2}{\alpha_t(\alpha_w+\alpha_r)} + \frac{1}{TW^2}\sinh^{-1}\frac{TW^2}{\alpha_w(\alpha_t+\alpha_r)}\right] - \frac{1}{60}\left[\frac{T^2(\alpha_r + r + T + \alpha_t)}{(r+\alpha_r)(r+T)(T+\alpha_t)(a_t+\alpha_r)} + \frac{W^2(\alpha_r + r + W + \alpha_w)}{(r+\alpha_r)(r+W)(W+\alpha_w)(\alpha_w+\alpha_r)} + \frac{\alpha_r + \alpha_w + \alpha_t + 1}{(\alpha_w+\alpha_r)(\alpha_t+\alpha_r)(\alpha_w+1)(\alpha_t+1)}\right] - \right. \tag{7}$$

-continued $$\left. \frac{1}{6}\left[\frac{1}{WT}\tan^{-1}\frac{WT}{\alpha_r} + \frac{T}{W}\tan^{-1}\frac{W}{T\alpha_r} + \frac{W}{T}\tan^{-1}\frac{T}{W\alpha_r}\right] - \frac{1}{20}\left[\frac{1}{r+\alpha_r} + \frac{1}{\alpha_w+\alpha_r} + \frac{1}{\alpha_t+\alpha_r}\right]\right\}$$

where $W = w/L$, $T = t/L$, $r = \sqrt{W^2 + T^2}$, $\alpha_w = \sqrt{W^2 + 1}$, $\alpha_t = \sqrt{T^2 + 1}$ and $\alpha_r = \sqrt{W^2 + T^2 + 1}$.

Figure 2:
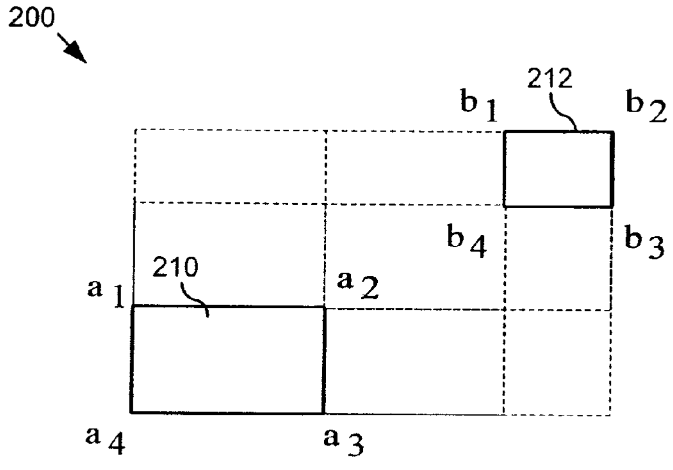
FIG. 2 is a schematic block diagram showing a cross-sectional view of a second set of exemplary wire segments and certain parameters of the segments.

Expression (6) for rectangular wires can be expressed more exactly as a weighted sum of 16 partial self inductance values. This result is attributable to Zhong and Koh (see, e.g., G. Zhong and C.-K. Koh, "Exact closed form formula for partial mutual inductances of on-chip interconnects," in *IEEE Int. Conf on Computer Design* (*ICCD*) pp. 428-433 (2002)). The expression for the partial mutual inductance between parallel wires of length L and respective cross-section areas $w_a \times t_a$ and $w_b \times t_b$ is given by:

$$\mathcal{M}_{a,b} = \frac{1}{8w_a w_b t_a t_b}\sum_{i=1}^{4}\sum_{j=1}^{4}(-1)^{i+j}S_{a_i,b_j}^2\mathcal{L}_{a_i,b_j} \tag{8}$$

with $\mathcal{L}_{a_i,b_j}$ being the partial self inductance of the segment of length L and cross-section equal to the rectangle formed with vertices $a_i$ and $b_j$ and the value $S_{a_i,b_j}$ being the area of this rectangle. FIG. 2 is a schematic diagram 200 illustrating the cross section of two parallel wires (a first wire 210 and a second wire 212) using the notation of Equation (8). For the general case in which the parallel segments are located in any disposition, the corresponding expression becomes a weighted sum of 64 partial self inductance values.

3.1.1. Wires with Length Larger than Transverse Dimensions

When L» d (for example, L>10d suffices), expression (4) can be approximated by:

$$\mathcal{M}_{fil} \approx \frac{\mu_0 L}{2\pi}\left[\ln\left(\frac{2L}{d}\right) + \frac{d}{L} - 1\right]. \tag{9}$$

The partial self inductance of the wire segment can be obtained by integrating expression (9) twice over the conductor's cross-section. Also of interest is the partial mutual inductance between two parallel segments of the same length (see, e.g., FIGS. 1A and 1B). The approximated expression for either one is:

$$\mathcal{M} = \frac{\mu_0 L}{2\pi}\left[\ln\left(\frac{2L}{d_g}\right) + \frac{d_a}{L} - 1\right] \tag{10}$$

with $d_g$ and $d_a$, respectively, being the 2D geometric and arithmetic mean distances between the conductors' cross-sections for the partial mutual inductance and between the conductors' cross-section to itself for the partial self inductance. These mean distances values can be given by:

$$\ln(d_g) = \frac{1}{SS'}\int_S\int_{S'}\ln\|x - x'\|\,ds\,ds', \tag{11}$$

and

-continued $$d_a = \frac{1}{SS'}\int_S\int_{S'}\|x - x'\|\,ds\,ds'. \quad (12)$$

with S and S' being the cross-sectional areas of the segments. The corresponding values for the self inductance are obtained by integrating twice over the same surface. An exemplary recursive method for computing $d_g$ between rectangular cross-sections as may be used herein is presented in R. Escovar and R. Suaya, "Transmission line design of clock trees," in *Proc. IEEE/ACM International Conference on CAD*, pp. 334-340 (November 2002).

The partial self inductance is well approximated by the following:

$$\mathcal{L} = \frac{\mu_0 L}{2\pi}\left[\ln\left(\frac{2L}{w \times t}\right) - 1.5\right] \quad (13)$$

with w and t the wire's width and thickness of the rectangular cross section, respectively.

3.1.2. Partial Self Inductance for Wires with Lengths not Larger than their Transverse Dimensions For wires where L≤10 w and/or L≤10 t, expression (7) can be used. Expression (7) becomes instable for large values of L, and is desirably not used in those cases.

3.1.3. Partial Mutual Inductance of Wires with Lengths not Larger than One Transverse Dimension When w≥d/10 and/or t≥d/10, expression (8) can be used together with expression (7).

3.1.4. Partial Mutual Inductance in 3D

The previous treatments can be extended to compute the partial inductance of 3D configurations (for example, wires with different lengths placed in any relative position). For these configurations, the problem can be decomposed into at least two cases: parallel wires and nonparallel wires.

3.2. Unequal Length, Parallel Wires

Figure 3:
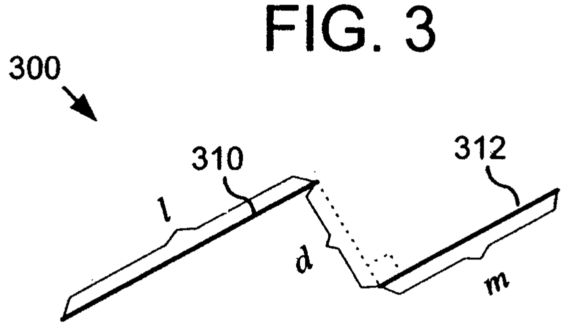
FIG. 3 is a schematic block diagram illustrating a configuration between a first filament and a second filament where the end of one filament is at the same orthogonal line as the start of the other filament.

Filaments are discussed first. Consider first the case where the end of one filament is at the same orthogonal line as the start of the other filament. FIG. 3, for example, is a schematic diagram 300 illustrating such a configuration between a first filament 310 and a second filament 312. The partial mutual inductance between these two filaments 310, 312 can be written as a linear combination of 2D partial mutual inductance calculations:

$$\mathcal{M} = \frac{M_{l+m;d} - (M_{l;d} + M_{m;d})}{2} \quad (14)$$

where $M_{l;d}$ is defined as the 2D partial inductance of two parallel filaments with length l and separation d, as shown in FIG. 3. By definition, $M_{l;d}=0$ for l=0.

Figure 4:
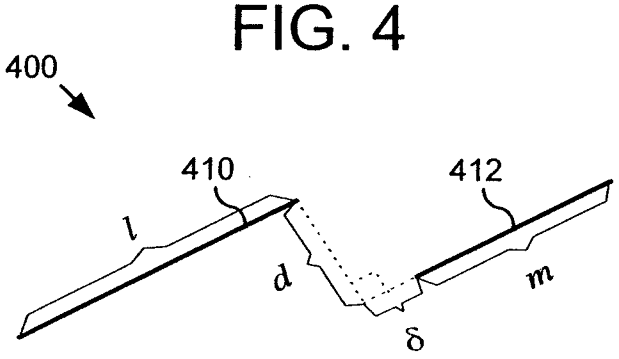
FIG. 4 is a schematic block diagram illustrating a configuration between a first filament and a second filament where the end of one filament is offset from the start of the other filament.

Consider next, an analogous configuration, shifted by a distance δ. FIG. 4, for example, is a schematic diagram 400 illustrating such a configuration between a first filament 410 and a second filament 412. The result for this configuration is:

$$\mathcal{M} = \frac{M_{l+m+\delta;d} + M_{\delta;d} - (M_{l+\delta;d} + M_{m+\delta;d})}{2}. \quad (15)$$

For overlapping filaments, where δ<0, expression (15) can continue to be used. The same expression applies, but the lengths are computed from absolute values as shown, for example, by:

$$\mathcal{M} = \frac{M_{|l+m+\delta|;d} + M_{|\delta|;d} - (M_{|l+\delta|;d} + M_{|m+\delta|;d})}{2}. \quad (16)$$

Figure 5:
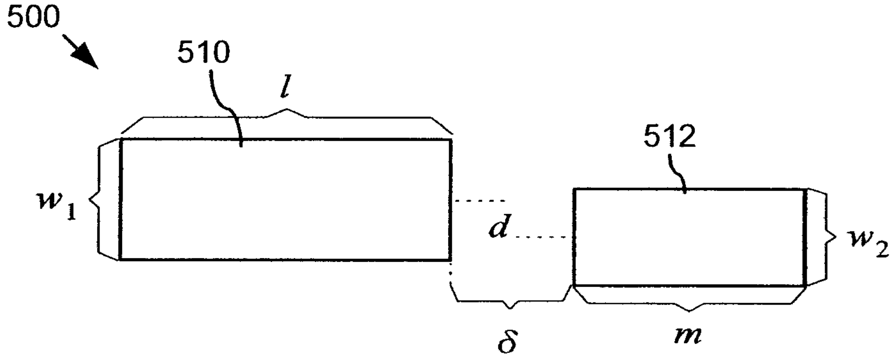
FIG. 5 is a schematic block diagram showing a first wire and a second wire wherein the wires have different widths that are offset from one another but partially overlap.

The transverse dimensions of physical wires can now be incorporated. The filamentary expressions can be integrated across the wires' cross-sections and divided by the total cross-sectional areas. In the case of wires with finite cross-sections, it may be possible to encounter a configuration such as the one in FIG. 5. In particular, FIG. 5 is a schematic diagram 500 showing a first wire 510 and a second wire 512 wherein the wires have different widths that are offset from one another but partially overlap. The first term of expression (15) for the configuration shown in FIG. 5 corresponds to the mutual inductance between two wires with center-center distance d greater than zero, but with their cross-sections sharing space. Although this kind of configuration is unphysical, its corresponding double volumetric integral is solvable and, furthermore, the expression due to Zhong and Koh is the exact solution to this integral.

When computing the mutual inductance for two collinear wires (d=0) with identical cross-section, expression (15) will result in the calculation of the mutual inductance of two identical wires with zero center-center distance, which becomes the self inductance of one of the wires. For this particular case, expression (15) changes to:

$$\mathcal{M} = \frac{L_{l+m+\delta} + L_{\delta} - (L_{l+\delta} + L_{m+\delta})}{2}, \quad (17)$$

with $L_l$ defined as the partial self inductance of the wire of length l and cross-section identical to that of the two original wires.

When the wires do not have identical cross-sections, expression (15) will result in the calculation of partial mutual inductance between two concentric wires with different cross-sections. The expression due to Zhong and Koh, previously referred to is desirably used.

3.2.1. Nonparallel Wires

Figure 6:
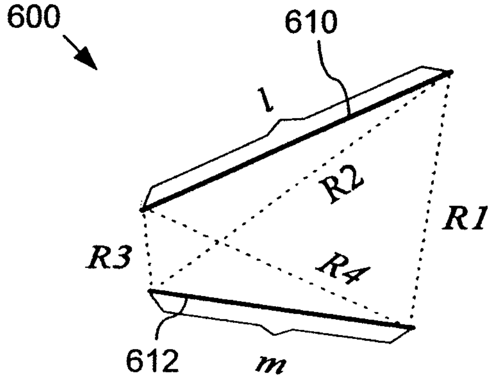
FIG. 6 is a schematic block diagram of two nonparallel filaments and various parameters between the filaments.

Consider the two nonparallel filaments (first filament 610 and second filament 612) shown in the schematic diagram 600 of FIG. 6.

In FIG. 6, R1, R2, R3 and R4 are the respective distances between the ends of the first filament 610 and the second filament 612. It should further be noted that the filaments 610, 612 are not necessarily located on the same plane. The mutual inductance between these two filaments 610, 612 is given by:

$$\mathcal{M} = \frac{\mu_0 k}{2\pi}\left[(u+l)\tanh^{-1}\frac{m}{R_1+R_2} + (v+m)\tanh^{-1}\frac{l}{R_1+R_4} - u\tanh^{-1}\frac{m}{R_3+R_4} - v\tanh^{-1}\frac{l}{R_2+R_3} - \frac{\Omega\beta}{2\sqrt{1-k^2}}\right] \quad (18)$$

where $$\Omega = \tanh^{-1}\frac{\beta^2 k + (u+l)(v+m)(1-k^2)}{\beta R_1\sqrt{1-k^2}} - \tanh^{-1}\frac{\beta^2 k + (u+l)v(1-k^2)}{\beta R_2\sqrt{1-k^2}} + \tanh^{-1}\frac{\beta^2 k + uv(1-k^2)}{\beta R_3\sqrt{1-k^2}} - \tanh^{-1}\frac{\beta^2 k + u(v+m)(1-k^2)}{\beta R_4\sqrt{1-k^2}},$$

-continued $$k = \frac{\alpha^2}{2lm}, \tag{19}$$

$$\alpha^2 = R_4^2 - R_3^2 + R_2^2 - R_1^2,$$

$$\beta^2 = R_3^2 - u^2 - v^2 + 2uvk,$$

$$u = \frac{2m^2l(R_2^2 - R_3^2 - l^2) + \alpha^2 l(R_4^2 - R_3^2 - m^2)}{4l^2m^2 - \alpha^4},$$

$$v = \frac{2l^2m(R_4^2 - R_3^2 - m^2) + \alpha^2 m(R_2^2 - R_3^2 - l^2)}{4l^2m^2 - \alpha^4}.$$

3.2.2. Summary

Tables 1 and 2 provide a quick reference to the expressions used in certain desirable embodiments of the disclosed technology for computing partial self and mutual inductance for the cases described above:

TABLE 1

Partial self inductance expressions for each case

| Type of configuration | Expression used |
|---|---|
| Thin wire (w, t << L) | (13) |
| Otherwise | (7) |

TABLE 2

Partial mutual inductance expressions for each case

| Type of configuration | Expression used |
|---|---|
| 2D thin and near wires (w, t, d << L) | (10) |
| 2D short wires (w, t << d) | (4) |
| 2D short wires (w, t ≈ d) | (8) |
| 3D wires: parallel | (14)-(16) |
| 3D wires: collinear | (17) |
| 3D wires: nonparallel | (18) |

3.3 PEEC vs Loop Treatment

Inductance is a property of current loops. The specification of what constitutes a loop within an IC is not always self evident when analyzing the layout. This possible ambiguity led the authors in A. E. Ruehli, "Inductance calculations in a complex circuit environment," *IBM J. Res. Develop., vol.* 16, pp. 470-481 (1972), to develop a treatment for the computation of the electrical parameters inductance and resistance in terms of the contributions of each and every segment in a layout without distinguishing which segment is associated with which loop. According to their technique (known as the Partial Electrical Equivalent Circuit or PEEC technique), the entire signal and power/ground network is represented as a very large matrix that characterizes the whole circuit. Each segment contributes to partial resistance, partial self inductance, and partial mutual inductance. Then, during circuit simulation, the frequency dependent currents branches are computed. Once the current branches are identified, the entire system can be solved. The partial inductance matrix is positive definite, but it is not diagonally dominant. The ratio of nondiagonal elements to diagonal elements decreases with distance as the inverse of the logarithm of the relative distance. This fall off is too slow, however, and is a direct consequence of the nonlocality associated with the partial inductance formulation. (See, e.g., R. Escovar, S. Ortiz, and R. Suaya, "An improved long distance treatment for mutual inductance," *IEEE Trans. Computer-Aided Design*, vol. 24, no. 5, pp. 783-793 (May 2005).) The main consequence of the slow fall off is the inability to neglect small off diagonal terms in the dense partial inductance matrix. More specifically, one cannot neglect these terms without bringing into question the positiveness of the eigenvalues. Thus, the resulting approximations can violate passivity of the circuit. It is for systems that are positive definite and diagonally dominant that neglecting the small nondiagonal terms in the matrix does not alter the sign of the lowest eigenvalues—they remain positive and, as such, a passive system remains passive after reduction. Thus, one consequence of using a PEEC formalism is having to deal with matrices of an unbound nature. In general, the matrix dimensionality for frequencies below the emergence of the skin effect is determined by the total number of segments on the layout. At higher frequencies, this number is multiplied by the number of filaments in a segment used to describe the nonuniform current distribution.

In contrast to the PEEC approach, the loop impedance approach considers individual circuit loops formed by signal wires and their corresponding return paths. In the printed circuit board world, loops are easily identifiable, as the grounded backplane provides the natural return path. In the integrated circuit world, however, the problem is not that simple, as there are multiple routes that can make up the current loop. The substrate, being low conductivity media, is one of many possible return paths for the signal currents, giving often negligible contribution to the return path current.

Thus, one aspect of a loop impedance approach is identifying which return paths among multiple choices provide a sufficiently correct answer. The problem is often viewed as a circular problem: The computation of the inductance value demands the identification of the return path. To know if the inductance is important in the timing discipline, however, one typically must know the inductance value, ergo the return path.

The embodiments described herein use the loop impedance approach. Furthermore, it should be noted that while the embodiment discussed below focus on loops formed between a signal wire and its return path(s), the described techniques are readily applicable to a power line and its return path(s).

3.4 An Exemplary Overall Extraction Flow

Figure 31:
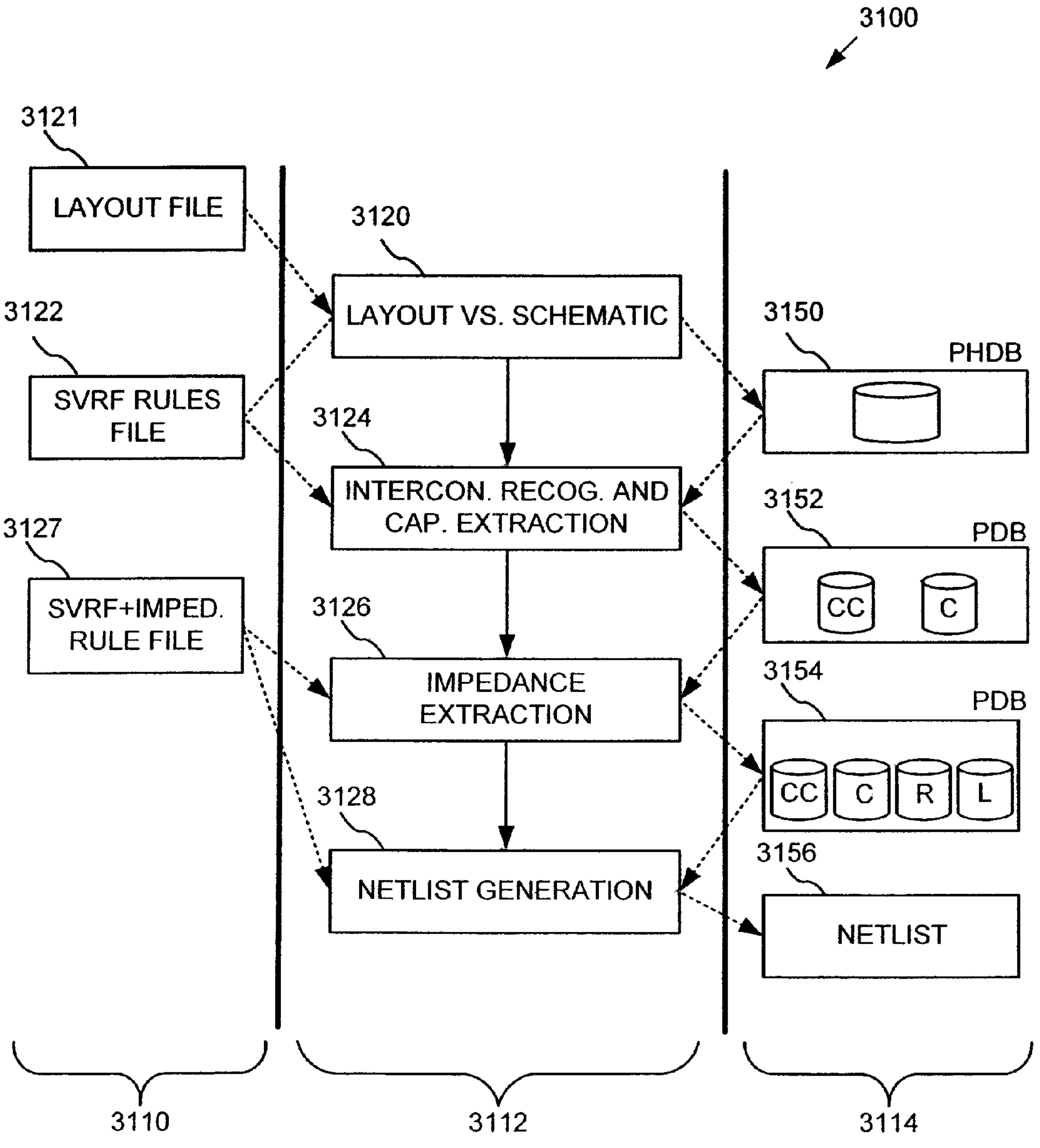
FIG. 31 is a schematic block diagram illustrating an overall impedance extraction method according to an exemplary embodiment of the disclosed technology.

FIG. 31 is a block diagram 3100 showing a high-level block diagram illustrating an exemplary embodiment of an overall extraction flow. In particular, the block diagram 3100 illustrates the files used during the exemplary technique in region 3110, the general procedures performed in region 3112 (which may be performed, for example, by separate software components or the same software component), and the files and data structures generated during the implementation of the exemplary technique in region 3114.

At 3120, a layout file 3121 is received and loaded (e.g., a GDSII or an Oasis file) and a layout-versus-schematic procedure performed. As noted above, the layout-versus-schematic procedure discriminates devices from interconnects. Information about interconnects can be stored in a database, such as a persistent hierarchical database (PHDB) 3150. One or more SVRF rules files 3122 can also be used during this procedure.

At 3124, an interconnection recognition and capacitance extraction procedure is performed. For example, the PHDB can be processed in order to extract geometrical information about the interconnect wires. According to one exemplary embodiment, and as noted above, shapes in the PHDB belonging to wire paths or nets are broken (or fractured) in such a way as to have straight segments of wire with their entire volume in the same layer and with constant width. In the illustrated embodiment, the database "Parasitic Database" (PDB) 3152 is generated. In the illustrated embodiment, capacitance extraction is also performed, resulting in capacitance values C for the capacitance to ground for each wire segment and values CC for the coupling capacitance among signal-wire segments being stored in the PDB 3152.

At 3126, impedance extraction is performed. Impedance extraction can be performed using any of the exemplary techniques described herein and can include one or more of mutual inductance extraction or parasitic self-impedance extraction, as explained below. In the illustrated embodiment, a SVRF and impedance rule file 3127 is used in connection with the impedance extraction. As illustrated in the PDF 3154 (updated from the PDB 3152), impedance extraction generates resistance R and inductance $\mathcal{L}$ values.

At 3128, a netlist generation procedure is performed to create a representation of the electrical characteristics of the layout using the R, $\mathcal{L}$, C, CC values stored in the PDB 3154. In certain desirable embodiments, model order reduction techniques are applied to the netlist. A netlist 3156 representative of the electrical characteristics (e.g., a Spice netlist) is generated and stored. The netlist 3156 can subsequently be used to perform, for example, timing simulation to help verify the physical design of the circuit.

The above-described flow should not be construed as limiting in any, however, as in other exemplary embodiments, any subset of these method acts is performed. In still other embodiments, any one or more of the method acts are performed individually or in various other combinations and subcombinations with one another.

4. Exemplary Techniques for Computing Self Impedance

In this section, exemplary methods for self impedance extraction as introduced above are described. Embodiments of the exemplary methods can exhibit a variety of desirable features, alone or in combination with one another. For example, embodiments of the methods can: (1) incorporate a physically realizable model based on the loop treatment; (2) perform impedance extraction with the same accuracy as the FastHenry field solver from MIT; (3) lead to linear sparse systems of low dimensionality; (4) satisfy the physical demands of self inductance that falls off with frequency; (5) satisfy the physical demand of dynamic resistance that increases with frequency; (6) produce results that require no external validation; (7) produce inductance per unit length and resistance per unit length that is scale invariant, permitting the attachment of the parameters to different partitions in the layout; (8) receive capacitance data from a capacitance extraction engine (for example, the xRC engine from Mentor Graphics Corporation ("Mentor Graphics")) and output a realizable R, $\mathcal{L}$, C, CC circuit; (9) incorporate Foster pair representation for broad band simulation; (10) generate a frequency-dependent circuit description whose parameters are frequency independent, further facilitating the timing simulation of a passive system with constant coefficients; (11) produce a Spice/Eldo file for timing simulation, containing inductance information for those lines where inductance matters (e.g., only for those lines where inductance matters); (12) reduce the size of the Spice file using realizable MOR techniques; in other words, the reduced circuit can be represented in terms of R, $\mathcal{L}$, C circuit elements.

Figure 32:
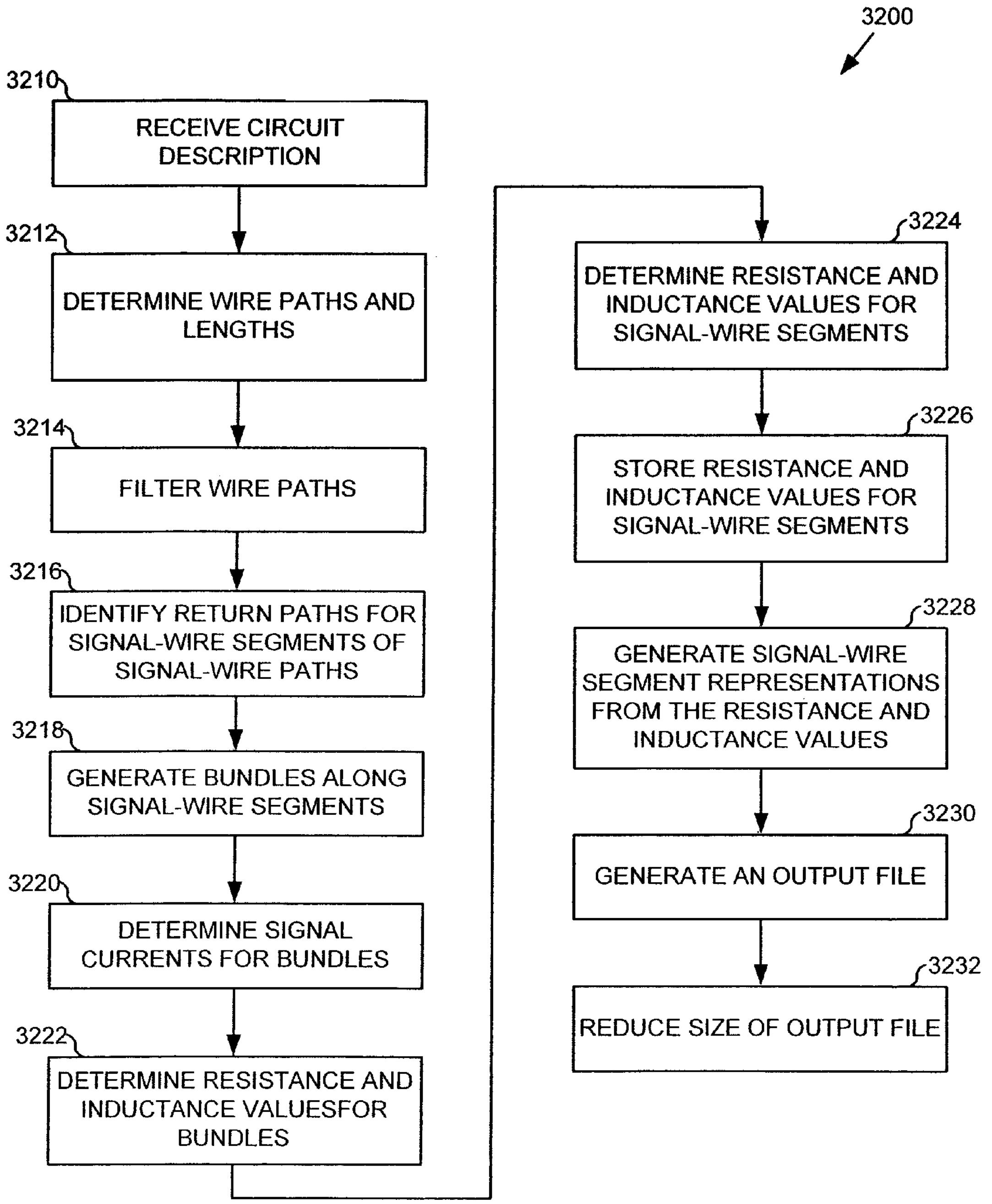
FIG. 32 is a flowchart illustrating an exemplary method of performing self-impedance extraction according to embodiments of the disclosed technology.

FIG. 32 is a flowchart 3200 showing an overall technique for computing loop inductance in an IC layout according to one exemplary embodiment of the disclosed technology. The particular embodiment shown in FIG. 32, however, should not be construed as limiting in any way, as any of the illustrated method acts can be performed alone or in various other combinations and subcombinations that are shown in FIG. 32. Some of the method acts shown in FIG. 32 are more specifically described in the subsequent sections.

At 3210, a database or other circuit description representative of the geometry of the IC layout is received. For example, the "Parasitic Database" (PDB) discussed above can be received and stored.

At 3212, the signal-wire paths and the wire lengths of the signal-wire paths are determined. In one exemplary embodiment, a signal-wire path is defined as the path between two terminal devices with one source and one destination, and includes one or more signal segments. A wire net (a signal wire with one or more branches) can have multiple paths and can be broken down into its individual wire paths. The signal-wire paths and the signal-wire paths can be stored, for example, in an initial list.

At 3214, data reduction (or filtering) is performed. For example, in certain exemplary embodiments, wire paths that are not sensitive to high frequency impedance effects are removed from the list. In one particular embodiment, each wire is selected and a determination is made as to whether the wire path length is sensitive to inductance effects for a particular frequency or frequency range of interest. If the wire length is determined to not be sensitive to inductance effects, the wire can be removed from the list. The remaining wires can be stored in a so-called "prequalified list."

At 3216, for one or more wire path segments of one or more wire paths (for example, for each wire path segment of each wire path), the closest return paths from the power/ground layout list are identified. The wire path segments can be selected (e.g., one at a time) from the prequalified list. Furthermore, in particular embodiments, the closest return paths up to a number n are identified. The number n can be, for example, a predetermined number or a user-defined number. In certain embodiments, 3D scanning is performed to identify the return paths. The 3D scan can be performed in two separate sweeps of the geometry of a wire path: one in the X direction, the other in the Y direction.

At 3218, a bundle generation technique is performed for one or more of the wire path segments of one or more of the wire paths (for example, for each wire path segment of each wire path). The bundle generation technique can be performed using the n return paths identified. As more fully explained below, bundle generation produces systems of signal-wire subsegments and return-path subsegments (from among the neighboring ground-wire segments and power-wire segments) that have the same length as and are parallel to the signal-wire segment. Bundle generation can be repeated as necessary for new signal-wire segments created during the bundling process.

At 3220, for one or more of the bundles (e.g., for each bundle in each signal-wire segment), the Kirchoff Voltage Laws (KVL) are solved and the signal current or signal voltage for the bundles extracted. In particular embodiments, the Kirchoff Voltage Laws are solved at different frequencies (e.g., a low, medium, and high frequency). The multiple values can be used to create broadband representations (frequency-dependent representations) of the wire segments that are associated with the bundles. Exemplary embodiments of such broadband representations (e.g., representations using one or two Foster pairs) are discussed in more detail below.

At 3222, R and $\mathcal{L}$ values for loop(s) associated with the bundles are determined. In particular embodiments, multiple values of R and $\mathcal{L}$ are determined for different frequencies (e.g., a low, medium, and high frequency). As noted, the multiple values can be used to create broadband representations of the wire segments that are associated with the bundles. In one particular embodiment, the broadband representation accurately represents the general principle that the value of R monotonically increases with frequency while $\mathcal{L}$ decreases with frequency towards a value that corresponds to that of the minimum of the inductance as a function of the number of neighbors (say n') for a configuration comprising up to n neighbors with uniform current distribution. In this fashion, the variation of R and $\mathcal{L}$ with frequency that is associated with proximity effects can be taken into account.

In certain embodiments, and as discussed more fully below, method act 3222 can further include a computation of the estimated skin depth for the frequency under consideration. If the skin effect is important, the bundle can be divided into sufficient filaments to capture accurately the skin effect, the resulting system can be solved, and R and $\mathcal{L}$ values extracted.

At 3224, the bundles' contributions are added to create R and $\mathcal{L}$ values for one or more of the wire segments. For example, the bundles' contributions can be added into segment loop contributions using linearity properties. In certain exemplary embodiments, for short segments, forward coupling values are computed and used to perform a 3D correction.

At 3226, the resulting loop resistance and loop inductance values for the one or more signal-wire segments are stored. For instance, in certain embodiments, different results can be store and output for narrow band application than are stored and output for broad band applications. Specifically, single frequency results can be output for narrow band applications, and a set of low, medium and high frequency results can be output for broadband applications. In other embodiments, different numbers of results for broadband applications are output (e.g., two, four, or more results).

At 3228, representations of the signal-wire segments are generated and stored. For example, in exemplary embodiments, one or more broadband representations of the signal-wire segments are generated for broad band applications. Specifically, in certain embodiments, representations comprising one or more Foster pairs (an inductance component coupled in parallel to a resistance component) are generated.

At 3230, an output file (e.g., a netlist) is generated and stored (e.g., for timing simulation). For example, in certain embodiments, a Spice netlist or Spice-like netlist is generated for timing simulation.

At 3232, Model Order Reduction (MOR) techniques can be performed to reduce the size of the netlist. The resulting reduced netlist can be stored. In certain desirable embodiments, the model order reduction techniques described in U.S. Patent Application Publication No. 2006/0031055 (which is hereby incorporated herein by reference) are used.

As noted, in other exemplary embodiments, any subset of these method acts is performed. In still other embodiments, any one or more of the method acts are performed individually or in various other combinations and subcombinations with one another.

One particular implementation of the exemplary method for computing loop impedances is expressed in the following pseudocode, which uses as an input a description of the layout of an IC (e.g., a GDSII or Oasis file):

```
for all signal paths
     do  {  compute length of path
            if L_path < L_min or L_path > L_max
               then Eliminate path from list
Store prequalified list of signal paths
for each path in the prequalified list
```

-continued

```
     {  for X and Y
do   {          {  Perform 3D scan line
     {          {  form bundles
     {          {  for each bundle
     {    do    {       do solve ZI = V
     {          {  aggregate bundles
     {          {  do forward coupling correction
     {          {  Store impedance for each wire segment
     {          {  in the PDB
```

This exemplary implementation leads to solutions to sets of $n_1 \times n_1$ matrices. The number of such systems is given by the number of bundles within each wire path. This is to be contrasted with the solving of one huge system as described above in connection with the PEEC technique. Furthermore, and for certain embodiments, the long distance behavior of the inductance can be described as that of the circulation of the magnetic vector potential generated by a dipole: a closed planar current loop. Consider, for example, a dipole at the origin. The vector potential at observation point $\vec{r}$ is given by:

$$\vec{A} = \frac{\vec{p}\times\vec{r}}{r^3} \tag{20}$$

with $\vec{p}$ the dipole moment. (See, e.g., R. Escovar, S. Ortiz, and R. Suaya, "An improved long distance treatment for mutual inductance," *IEEE Trans. Computer-Aided Design*, vol. 24, no. 5, pp. 783-793 (May 2005).) Computing the circulation around a current loop C gives the following result:

$$\mathcal{M} \propto \oint_C \frac{\vec{p}\times\vec{r}}{r^3}\cdot dl_j \tag{20}$$

The loop mutual inductance falls off as 1/r, for 2D problems and as $1/r^2$ for 3D problems at long distances (see, e.g., R. Escovar, S. Ortiz, and R. Suaya, "An improved long distance treatment for mutual inductance," IEEE Trans. Computer-Aided Design, vol. 24, no. 5, pp. 783-793 (May 2005)), thus permitting one to neglect long distance contributions. In the PEEC method, by contrast, the fall off is logarithmic with distance. The difference arises from field cancellation due to the presence of two opposite currents, one on the signal segment the other on the return-path segment.

Thus, according to one exemplary and computationally efficient approach, impedance extraction is performed by applying the loop formalism complemented with a consistent solution of the Kirchhoff Voltage equations.

4.1. Generation of the Prequalified List

In this section, exemplary embodiments of generating the prequalified list are described. These embodiments can be performed, for example, at method act 3212 in FIG. 32.

In general, there are limited ranges of values for wire parameters (e.g., length, thickness, and sheet resistance) that produce inductance effects that are desirably considered during timing analysis. Thus, the number of wire path segments to be considered for impedance extraction can be reduced by eliminating wire path segments that produce no significant impedance effects and thus do not significantly affect timing analysis.

In certain exemplary embodiments of the disclosed technology, the length of a wire path segment is used as a criteria for filtering the wire paths to be considered. In particular embodiments, the lower and upper limits for the lengths of signal paths ($L_{min}$ and $L_{max}$, respectively) for a given frequency f where inductance is significant can be expressed as follows: The lower bound $L_{min}$ can be determined, for example, from the condition that:

$$L_{min} = \frac{T_{rise} v}{2} \tag{22}$$

(see, e.g., R. Escovar and R. Suaya, "Transmission line design of clock trees," in *Proc. IEEE/ACM International Conference on CAD*, pp. 334-340 (November 2002)). Simply put, expression (22) states that the delay of a signal propagating at the speed of light in the medium (v) after one reflection at the end is smaller or equal to the signal rise time.

The upper bound length $L_{max}$ results, for example, when considering the length for which the propagation delay becomes equal to the RC ($\delta_{RC}$) diffusion delay:

$$\delta_{RC} = \delta_{LC} \Rightarrow \frac{rcL^2}{2} = \sqrt{lcL} \Rightarrow L_{max} = \frac{2}{r}\sqrt{\frac{l}{c}} \tag{23}$$

where r, l, and c are the wire's per unit length resistance, capacitance, and inductance, respectively.

It should be noted that for the range of wire lengths where inductance is important, the signals are desirably not treated as lumped objects, where standard circuit theory applies. It is typical to treat wires using lumped circuit elements for lengths that are smaller than $$\frac{\lambda}{10}$$

with λ the wave length, which is given by $$\lambda = \frac{v}{f}. \tag{24}$$

$$L_{min} \approx \frac{\lambda}{6}. \tag{25}$$

Notice that:

Thus, according to one exemplary embodiment, and for a wire length where inductance effects are important, it is desirable to treat the circuit containing the wire as a distributed R, L, C circuit. When inductance effects are important, time delay models including inductance based on lumped circuit descriptions are typically invalid.

In an exemplary embodiment of the disclosed technology, the process of filtering comprises identifying and storing in the prequalified list the signal paths whose length from source to destination satisfy (or substantially satisfy) the bounds introduced above. Signals not belonging to this interval are considered insensitive to dynamic impedance and can be treated as distributed R, C networks, or alternatively as single lumped π sections, depending on their length. For example: for small lengths, propagation can be considered as instantaneous and a lumped description applies. For very long wires, there is usually too much attenuation due to multiple reflections that make the inductance effects disappear. Using the exemplary limits described above, usually only a small percentage of the total number of signals typically survives the filtering scheme. (Due to expression (25), wires in the prequalified list are generally treated as distributed circuits or alternatively as lossy transmission lines.)

In one exemplary embodiment, the filtering is the first active computational step in the impedance extraction methodology and involves computation of the length of wire paths. In certain embodiments, there are further reductions that can be made to the database, but these reductions typically involve taking into account the source and destination devices and as such are usually left to postprocessing steps. For example, additional filtering criteria can include: (1) keeping lines driven by transistors whose resistance $R_{tr}$ is such that: $R_{tr} \leq < 3Z_0$, where $Z_0$ is the impedance of the line; and (2) keeping lines such that the capacitance load at their end, $C_{load}$, is significantly smaller than the effective capacitance of the line. A fixed or user-defined ratio can be used—for example, 1/10.

4.1.1. Frequency Selection

In general, impedance extraction is better physically represented in the frequency domain than in the time domain. Both the real and imaginary parts of the impedance matrix are frequency dependent. In certain embodiments of the disclosed technology, there can be two choices for impedance extraction: narrow band extraction for which one fixes one frequency, and broadband extraction for which one fixes a maximum frequency. The choice of either narrow or broadband can be made by the user (e.g., via a user interface) before impedance extraction is performed. Furthermore, in certain embodiments, when broadband extraction is selected, the user can select a maximum frequency (e.g., via a user interface). Broadband extraction can be useful for simulation of digital systems. In the broadband mode, extraction can be performed such that it is valid for the open interval Ω, where:

$$\Omega = \left\{ f : 0 < f < f_0 = \frac{1}{\pi * T_{rise}} \right\} \tag{26}$$

with $T_{rise}$ being the minimum rise time of signals on the circuit.

The previous expression is the result of computing a realistic upper limit to the signal content of a finite pulse. The low frequency part of the spectrum generally provides unimportant contributions to impedance since $\omega L \ll R$.

4.1.2. The Power Grid

The power and ground grid in their totality (or power and ground separately) are desirably loaded and considered for impedance computations. In one exemplary embodiment, in the presence of multiple power/grounds, just the power and/or ground attached to the wire being analyzed is loaded. In the following discussion, the term "ground" is used indistinctly to label ground or power wires.

In exemplary embodiments of the disclosed technology, the signal lines that survive filtering are loaded (for example, simultaneously loaded). The circuit can then be separated or partitioned into individual configurations that contain one signal wire and a set of parallel ground wires of the same length. For purposes of this discussion, these configurations are referred to as "bundles" and can be generated, for example, at method act 3218 of FIG. 32. In general, this procedure is performed to increase the use of 2D expressions for inductance (for example, the expressions discussed above in Section 2) and to help ensure linearity in length of the resulting R and $\mathcal{L}$ parameters.

An exemplary bundling technique is described below with respect to FIG. 33. The exemplary technique is described as being applied to a single signal wire. In practice, however, the bundling technique can be applied to individual signal wires or to multiple signal wires. For example, bundle generation can be performed for many signal wires in a single pass. In general, bundling multiple signal wires during a single application of the technique is computationally simpler.

4.2 Bundle Generation

In this section, exemplary methods of fracturing the layout and generating bundles are explained. The exemplary methods can be used, for example, at method act 3218 of FIG. 32 above. In certain exemplary embodiments of the disclosed technology, each wire path from source to destination is considered. The source and destination are located at the coordinates where one attaches ports that identify regions where active devices are located. Between the sources and destinations, an ordered list of segments oriented along the x or y axis can be generated. For wires that change planes, the resistance of the vertical segment (the via) can be conserved. The reactance, being proportional to the length of the via, is usually negligible for all frequencies of interest and, in certain exemplary embodiments, can be ignored. In certain situations, however, via inductance is desirably accounted for (e.g., when analyzing package layouts).

Each plane can be treated separately while keeping track of the connectivity information captured during preprocessing. Since there is no inductance coupling between horizontal and vertical wires, the vertical (in Y) and horizontal (in X) wires segments can be fractured separately. For example, in one exemplary embodiment, wire segments are first fractured in the X direction and then in the Y direction, whereas in other embodiments, the wire segments are first fractured in the Y direction and then in the X direction.

The process of fracturing can be performed as a series of 2D sweeps, one for each metal plane. Manhattan distance can be used, for example, as the metric to order the queue. A virtual copy of the signal segment can be placed on each layer being swept. The end coordinates of the signal segment, as well as those of the ground lines can be incorporated into the queue. For example, the horizontal wire segments can be ordered from left to right and the vertical ones from top to bottom.

In an exemplary embodiment of the disclosed technology, the ordered queue is read by looking for start and end coordinates of signal-wire segments. Once a signal-wire segment starts, a fixed number n of return-path segments are identified (e.g., from among the ground-wire segments and power-line segments in the neighborhood of the signal-wire segments). In certain embodiments, a predetermined or user-defined number n of return-path segments are identified. In certain exemplary implementations, the signal-wire segments are then further segmented (or partitioned) at a distance from their start equal to the length of the shortest return-path segment in the collection of the return-path segments identified. The resulting system comprises a subsegment (or subpartition) of a signal-wire segment together with corresponding return-path subsegments that are parallel to and have the same length as the signal-wire subsegment. This system is referred to herein as a "bundle."

Figure 7A:
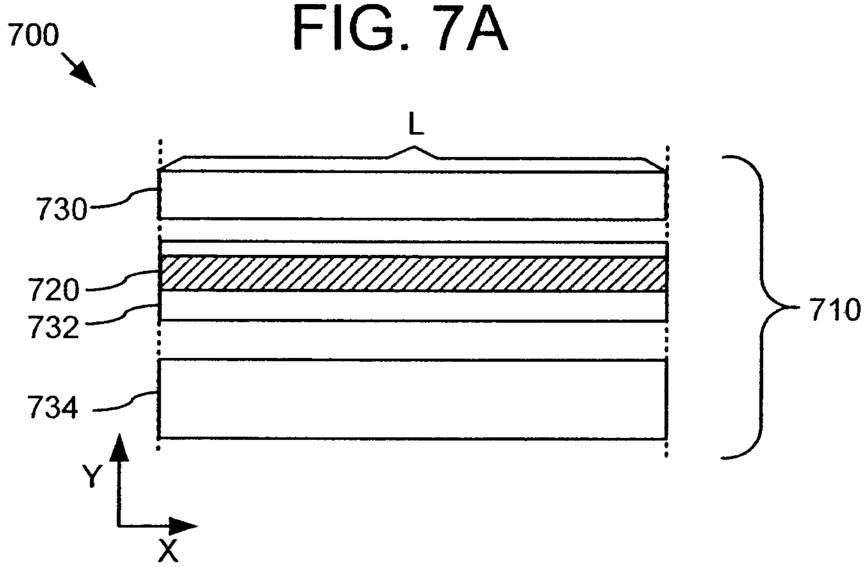
FIG. 7A is a schematic block diagram showing a top view of an exemplary signal-wire segment in the presence of multiple return-path segments.
Figure 7B:
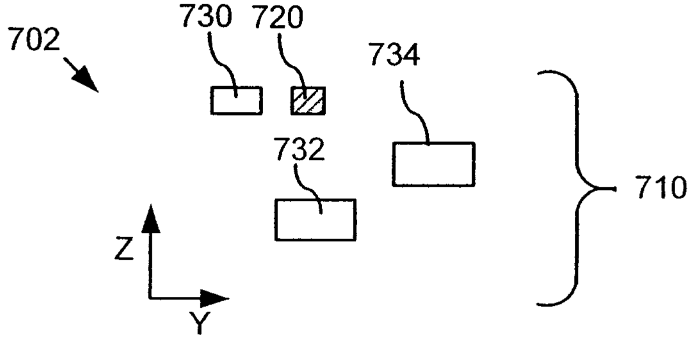
FIG. 7B is a schematic block diagram showing a cross-sectional view of the configuration illustrated in FIG. 7A.

FIGS. 7A and 7B are schematic block diagrams 700, 702 showing an exemplary bundle 710. In particular, FIG. 7A is a top view the bundle 710 along the X-Y plane, whereas FIG. 7B is a cross-sectional view of the bundle 710 along the Z-Y plane. In both FIGS. 7A and 7B, the illustrated bundle 710 includes a signal-wire subsegment 720 and three neighboring ground-wire subsegments 730, 732, 734.

Figure 8:
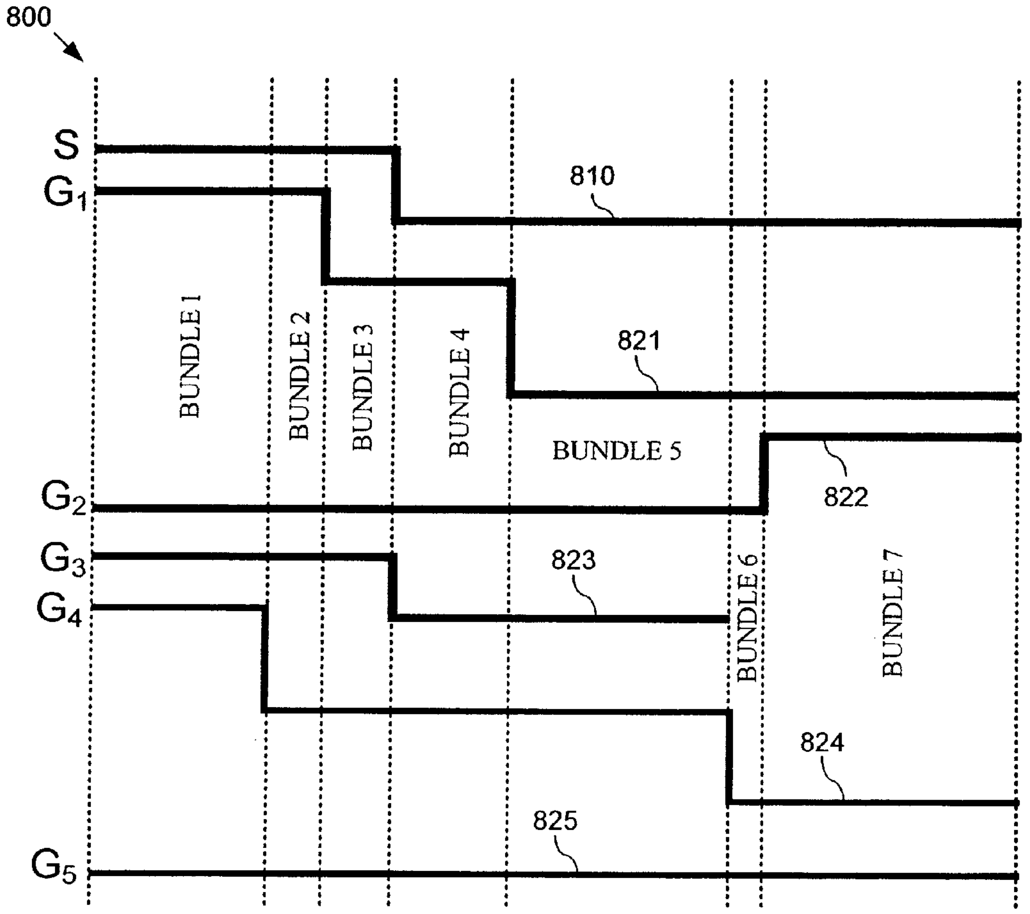
FIG. 8 is a schematic block diagram illustrating a plurality of bundles formed in a portion of an exemplary circuit layout according to exemplary embodiments of the disclosed technology.

FIG. 8 is a schematic block diagram 800 showing multiple bundles along a signal path. In particular, FIG. 8 shows a signal wire 810 (S) in the presence of five neighboring ground wires 821 ($G_1$), 822 ($G_2$), 823 ($G_3$), 824 ($G_4$), and 825 ($G_5$). FIG. 8 also illustrates that the process of bundle creation desirably creates bundles wherein each bundle has wires of equal length. Thus, the dotted lines in FIG. 8 illustrate where a partition between bundles has been created in order to create bundles having signal-wire subsegments and parallel return-path subsegments of equal length. In this particular example, seven bundles are present in the illustrated signal-wire path.

In the exemplary embodiments described, a bundle is used as the minimal data structure. A bundle can be described, for example, as a set comprising parallel wire segments, in multiple metal planes, including one signal-wire subsegment (or segment) plus a collection of n or fewer return-path subsegments (or segments). The set of return-path subsegments within a bundle are the n closest parallel neighbors to that signal-wire subsegments in Euclidian distance. Bundles generally (though not necessarily) have the same maximum number of return-path subsegments. Some bundles may comprise of just the signal-wire subsegments alone, however, if no such neighbors exist, or fewer than n return-path subsegments if only a few ground wire or power wires are around the signal wire. Further, the subsegments of a bundle typically have the same length. (As used herein and in the claims, reference to the return-path subsegments being the same length or of equal as the corresponding signal-wire subsegment includes some insubstantial deviation in lengths (typically, less than 10%).)

Figure 33:
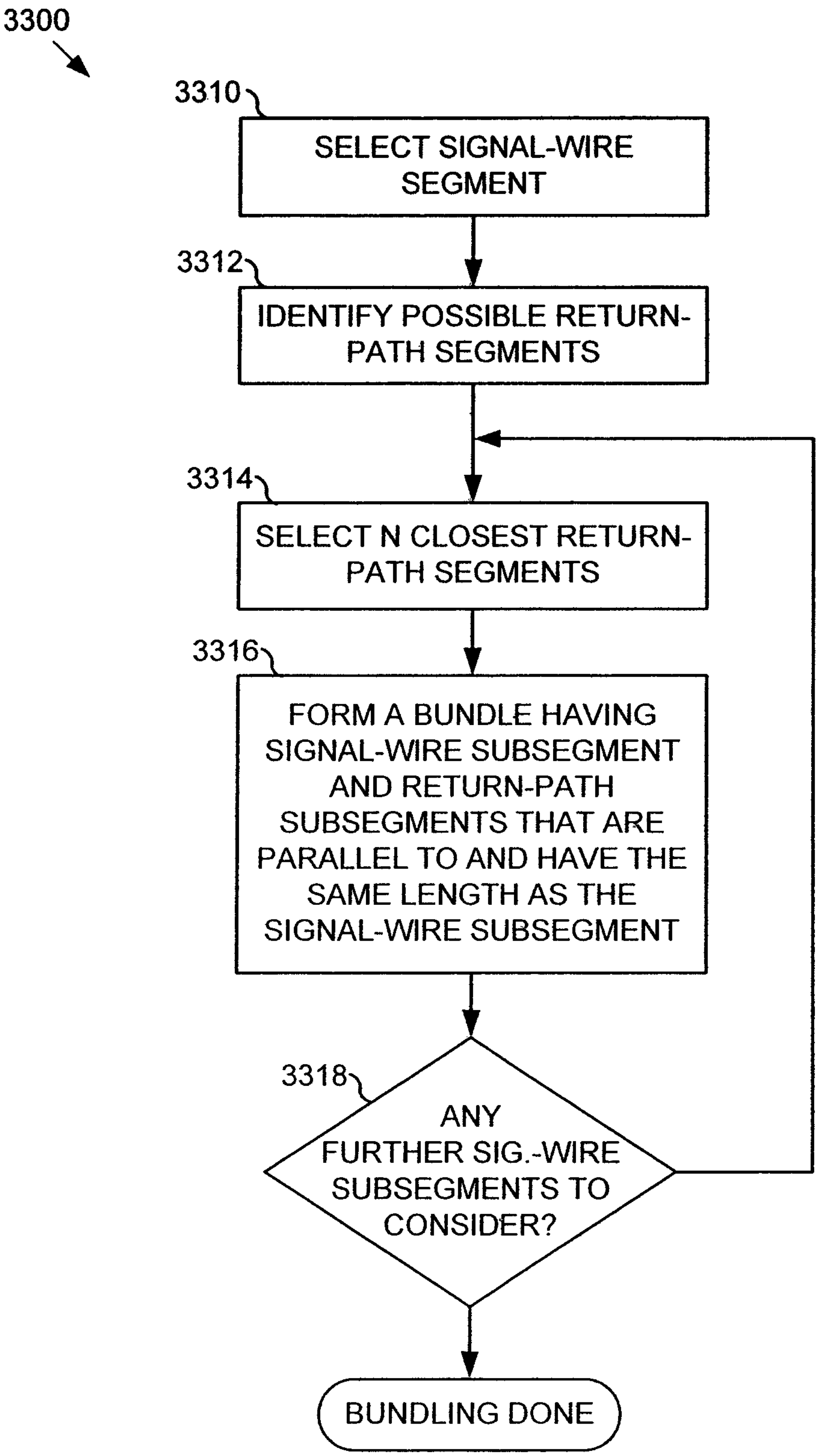
FIG. 33 is a flowchart illustrating an exemplary bundling technique according to the disclosed technology as may be used during the impedance extraction of FIG. 32.

FIG. 33 is a flowchart 3300 showing an exemplary technique for performing bundle generation. The particular embodiment shown in FIG. 33, however, should not be construed as limiting in any way, as any of the illustrated method acts can be performed alone or in various other combinations and subcombinations that are shown in FIG. 33.

At 3310, a signal-wire segment is selected. For example, the next signal-wire segment from the prequalified list in the PDB is selected.

At 3312, possible return-wire segments are identified. For example, a scan can be performed along the length of the selected signal wire to determine the ground-wire or power-wire segments that are parallel to the signal-wire segment along the length of the signal-wire segment. The scan can be performed by identifying wires intersected by a Y-direction scan line (when analyzing a signal wire extending in the X dimension) or by identifying wires intersected by an X-direction scan line (when analyzing a signal wire extending in the Y dimension). The identified return-wire segments can be stored in a list.

At 3314, the n closest return-path segments are identified for inclusion in the bundle. As noted, n can be a predetermined number or a user-selected number. The Euclidean distance between the wires' centers can be used as the relevant metric for this determination.

At 3316, the n return-path segments are broken to form a bundle comprising a signal-wire subsegment and return-path subsegments having a length equal to that of the shortest wire segment in the identified group of return-path segments from 3314.

At 3318, a determination was made as to whether the signal-wire segment was broken to form the bundle. If so, then the process is repeated for the next subsegment of the signal-wire segment under consideration. If not, then the process is complete for the selected signal-wire segment, and a next signal-wire segment is selected.

According to one particular implementation, this exemplary technique for performing bundle generation can be expressed in the following pseudocode, which uses signal segment coordinates as its input (e.g., segments from the prequalified list):

```
for horizontal and vertical wires
    for each signal segment in the prequalified list
        store in a list the ground wire segments intersected by the
        scan lines
        choose from the list the n closest return wire segments
        break all wire segments and form the bundle
        if the signal segment was broken
            repeat bundling from the coordinate where the signal was
            cut
        else continue
    end
end
```

The following pseudocode also represents an embodiment of the bundling procedure:

```
for horizontal and vertical wires
do { for each node in the ordered queue of coordinates
     do { if the node is the beginning of a signal segment
          then { search the n closest return wire segments in Manhattan distance
                 break the n closest return wire segments at the current coordinate
                 mark return and signal wire segments as belonging to the same bundle
          else if the node is the end of a return or signal segment
          then { search all wires belonging to the same bundle as the current wire segment
                 break all wires segments in the bundle at the current coordinate
```

4.3. Loop Impedance of a Bundle

Given a bundle, Kirchoff voltage laws can be applied to it at angular frequency $\omega=2\pi f$, with f the frequency:

$$\begin{bmatrix} R_s + j\omega\mathcal{L}_s & j\omega\mathcal{L}_{s,g_1} & \cdots & j\omega\mathcal{L}_{s,g_n} \\ j\omega\mathcal{L}_{g_1,s} & R_{g_1} + j\omega\mathcal{L}_{g_1} & \cdots & j\omega\mathcal{L}_{g_1,g_n} \\ \vdots & \vdots & & \vdots \\ j\omega\mathcal{L}_{g_n,s} & j\omega\mathcal{L}_{g_n,g_1} & \cdots & R_{g_n} + j\omega\mathcal{L}_{g_n} \end{bmatrix} \begin{bmatrix} I_s \\ I_1 \\ \vdots \\ I_n \end{bmatrix} = \begin{bmatrix} V_{in} - V_{out} \\ -V_{out} \\ \vdots \\ -V_{out} \end{bmatrix} \quad (27)$$

$$Z(\omega)I(\omega) = V(\omega)$$

where $R_s$ and $\mathcal{L}_s$ are the static resistance and partial self inductance of the signal wire, respectively; $R_{g_i}$ and $\mathcal{L}_{g_i}$ are the static resistance and partial self inductance of the i-th ground wire, respectively; and $\mathcal{L}_{i,j}$ is the partial mutual inductance between wires i and j.

The loop impedance of this circuit is the scalar complex value solution $Z_{loop}=R_{loop}+j\omega\mathcal{L}_{loop}$ that satisfies the relationship:

$$Z_{loop}I_s=V_{in} \quad (28)$$

Figure 9:
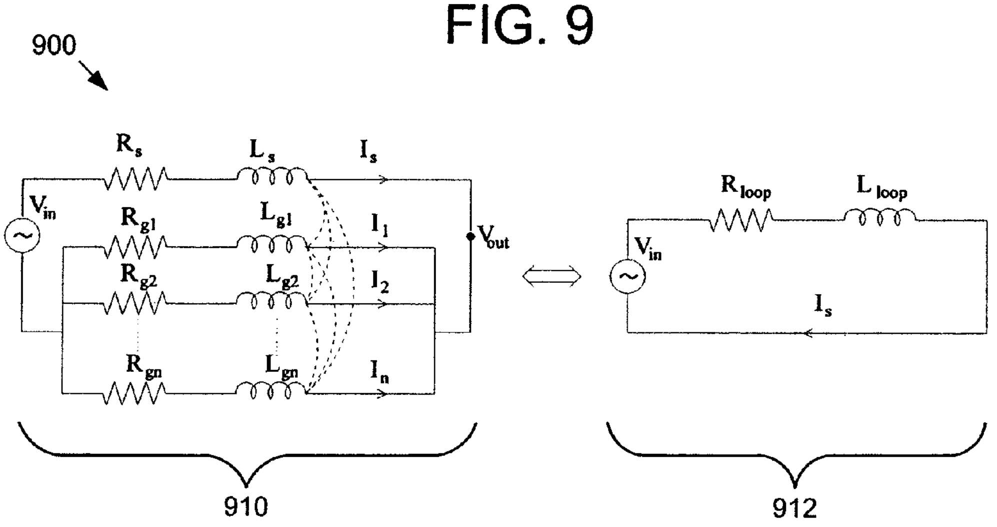
FIG. 9 is a schematic block diagram illustrating the reduction of an exemplary bundle with its individual partial inductance components to a bundle using the loop inductance equivalent according to exemplary embodiments of the disclosed technology.

The exemplary loop treatment, as defined here, reduces the full circuit, into an equivalent and much simpler representation. FIG. 9, for example, is a schematic block diagram 900 illustrating the reduction of a bundle with its individual partial inductance components (representation 910) to a bundle using the loop inductance equivalent (representation 912). The reduction from the partial inductance formulation to the loop formulation is considerable. In the simplest case of a single return path, one recovers the expected result that the loop inductance is $$\mathcal{L}_{loop}=\mathcal{L}_s+\mathcal{L}_{g_i}-2\mathcal{L}_{s,h_i} \quad (29)$$

The general solution to expression (28) is not an analytical expression except at very low frequencies. Once the solution for the system (27), for a particular frequency and for $V_{in}=1$ v has been found, the loop impedance $Z_{loop}$ for that frequency is given by $Z_{loop}=I_s^{-1}$ (the inverse of the current going through the signal).

For the general numerical solution to expression (27) representing a system of n+1 equations with n+2 unknowns (the n+1 currents and the potential $V_{out}$), the system can be completed with Kirchoff's current law:

$$I_s + \sum_{i=1}^{n} I_i = 0. \quad (30)$$

To solve this problem, expression (27) can be rewritten as $$ZI = \begin{bmatrix} 1 \\ 0 \\ \vdots \\ 0 \end{bmatrix} - V_{out}\begin{bmatrix} 1 \\ 1 \\ \vdots \\ 1 \end{bmatrix}, \quad (31)$$

The two associated systems can be solved:

$$Zx = \begin{bmatrix} 1 \\ 0 \\ \vdots \\ 0 \end{bmatrix} \text{ and } Zy = \begin{bmatrix} 1 \\ 1 \\ \vdots \\ 1 \end{bmatrix}.$$

which can be rewritten as:

$$I=x-V_{out}y \quad (32)$$

Summing the rows on both side of (32) and using (30) results in:

$$V_{out} = \frac{\sum x_i}{\sum y_i},$$

giving $$I_s = x_1 - \frac{\sum x_i}{\sum y_i} y_1.$$

By virtue of expression (28), $$Z_{loop} = \left( x_1 - \frac{\sum x_i}{\sum y_i} y_1 \right)^{-1}.$$

In this exemplary approach, two linear systems need to be solved, one for x the other for y. Both systems involve the same matrix Z. For this, a matrix factorization scheme can be used that takes advantage of the symmetry of the matrix—for instance, the $LDL^T$ factorization method. The size of $Z_{loop}$ in practical applications does not typically exceed 11×11 matrices. Given its low dimensionality, direct solver methods can be used instead of iterative methods.

The current coefficients $\alpha_i$ for each wire in the bundle can be stored for future reference. In the exemplary approach described here, for example, these coefficients can be given by $$\alpha_i = -\frac{I_i}{I_s} \text{ and } \alpha_s = 1 \quad (33)$$

which are complex coefficients that are frequency dependent.

4.4. Loop Self Impedance of a Signal Segment

The loop self impedance of a signal segment can be computed using, for example, a divide-and-conquer scheme. For instance, a signal segment (e.g., each signal segment) can be partitioned into a series connection of bundles for which the loop impedance is computable. The loop impedance of a circuit comprising two elements in series can be computed as the sum of the loop impedance of each element plus twice the mutual impedance between the elements (that is, the mutual impedance between subsegments of the same signal-wire segment). In other words, and in one desirable embodiment, the self impedance of a signal-wire segment in the database can be computed as the sum of the loop self impedances of the bundles into which it was partitioned plus twice the mutual impedance among all bundles. For purposes of this disclosure, the mutual impedances between bundles belonging to the same signal-wire segment are called "forward coupling."

In general, the forward coupling between bundles decays quadratically with distance. (See, e.g., R. Escovar, S. Ortiz, and R. Suaya, "An improved long distance treatment for mutual inductance," *IEEE Trans. Computer-Aided Design*, vol. 24, no. 5, pp. 783-793 (May 2005).) Further, the forward coupling between two bundles is negligible when the length of the bundles is much larger than their transverse dimensions.

As explained above, a signal path that survives filtering can be represented by a distributed $R\mathcal{L}C$ circuit. To avoid the accumulation of capacitive effects, the signal-wire segments in a path are desirably shorter than a tenth of the wavelength. In certain exemplary embodiments, this property can be achieved by setting a maximum length for signal-wire segments in the preprocessing step. In the discussion below, for instance, it is assumed that the maximum frequency was on the order of 50 GHz. For this frequency, the wavelength is approximately 3 mm. After preprocessing, wire segments in the PDB are typically much shorter than a tenth of the wavelength ($L_{crit}=\pi/10=300$ μm). This implies that bundles formed during extraction are even shorter. In many cases their length is much smaller than their transverse dimension. In such cases, the forward coupling between bundles is desirably taken into account to ensure accuracy in the self impedance of the wire segment.

4.4.1. Forward Coupling Corrections

This section describes exemplary methods for computing the mutual interaction among bundles along a signal-wire path—for example, a 3D correction to the 2D results. In exemplary implementations of the disclosed technology, the number of 3D corrections performed is reduced on account of the decomposition into bundles. Thus, in one exemplary embodiment, 3D corrections for self inductance are performed for a limited number of forward bundles, which are either nearest neighbors or neighbors within some threshold distance. Because the coupling between bundles decreases as a power of the separation between the bundles, this exemplary method produces desirably precise results with reduced computational complexity.

One exemplary technique for forward coupling correction comprises the following method acts. Given a signal-wire path from source to destination and broken into segments, each segment is further partitioned into multiple subsegments to form a nonoverlapping set of bundles. The fact that in the loop formalism the mutual inductance between bundles falls off as a power of the separation of the bundles can be restated for purposes of computing the forward coupling as follows: the farther one bundle is from the other, the smaller the correction to the self inductance due to mutual couplings between bundles. For segments longer than $L_{crit}$, for example, the segment can be broken into pieces of length smaller than $L_{crit}$. The value of $L_{crit}$ scales down linearly with the process scaling factor or lithography generation. The range of wire segment lengths is generally dependent on the layout.

The bundles in a wire segment can be grouped and, in one exemplary embodiment, the forward coupling values computed only between adjacent bundles. For example, according to one implementation, for n bundles, n−1 forward couplings are computed. Further, in one exemplary implementation, the correction to the self impedance of the wire segments is equal to twice the sum of the n−1 forward coupling values. In other embodiments, however, forward coupling values between other bundles are also computed (e.g., between the next adjacent bundles).

The mutual loop inductance between two bundles can be given by:

$$\mathcal{M}_{a,b} = \sum_{i \in bundle_a} \sum_{j \in bundle_b} \alpha_i \alpha_j \mathcal{M}_{ij}, \quad (34)$$

with $\mathcal{M}_{i,j}$ the partial mutual inductance between wire segment i in bundle a and wire segment j in bundle b.

As with the bundles, the wire segments can be grouped until the sum of their lengths is larger or equal than $L_{crit}$ or until there are not any more wire segments. The forward coupling between two adjacent wire segments can be computed (e.g., for n wire segments, n−1 forward coupling values can be computed). In one exemplary implementation, the sum of twice the n−1 forward coupling values is added to the sum of all the n self impedance values. This results in a loop impedance $Z_{big}$ that can be distributed among the n wire segments. For example, the value of $Z_{big}$ times the length of the wire segments divided by the sum of the lengths of the n wire segments can be attributed to each of the n wire segments.

In an exemplary implementation of the technique, the forward coupling between two adjacent wire segments is equal to the sum of the forward couplings between the bundles in one segment and the bundles in the other. Since the forward coupling between two non-adjacent bundles is negligible, the forward coupling between two adjacent wire segments can be approximated as the forward coupling between the closest two bundles in one segment and its neighbor.

5. Skin Effect Considerations

The frequency spectrum in which IC applications typically operate can be classified in the following exemplary fashion (though the bounds of this classification should not be construed as limiting):

1. Low frequencies ($R \gg \omega\mathcal{L}$). No inductance phenomena. Static resistance and capacitance suffices to describe wires.
2. Mid frequencies ($R > \omega\mathcal{L}$) while $\omega\mathcal{L}$ is normegligible. Uniform current distribution, varying of inductance due to proximity effects. $R\mathcal{L}C$ distributed descriptions apply. Dynamic Resistance replaces static resistance. R varies with frequency.
3. High frequencies ($\omega\mathcal{L}$ is comparable or larger than R). Current ceases to be uniform inside the conductors and as frequency increases it crowds towards the surfaces.

Consider the high frequency regime where current inside the conductors ceases to be uniform. In order to account for the physics of current crowding, and according to one exemplary embodiment of the disclosed technology, the conductors can be broken into filaments to discretize the non-constant current distribution. The current distribution in each filament of a small transverse area can be considered uniform across its area. Thus, for a bundle with wires partitioned into filaments, the following linear system results:

$$ZI=V$$

where Z is the partial impedance matrix including all filaments contained in a wire segment, I is the vector of unknown currents at each filament and V is the vector of voltages. Given a bundle (one signal-wire subsegment plus parallel and equal length return path subseqments), the voltage vector V can be given by:

$$v_i=1-v \text{ if } i\in \text{ signal wire } (35)$$

$$v_i=-v \text{ otherwise} \quad (35)$$

where the value v is the unknown voltage at the end of the signal line. This system can be solved, according to one exemplary embodiment, using the following technique, where $$x=Z^{-1}e \quad (36)$$

$$y=Z^{-1}1 \quad (37)$$

with vector e being the vector with "1"s for filaments in the signal wire, and "0" for the rest of the filaments. The vector 1 is a vector with all entries equal to "1".

With x and y the ZI=V system can be rewritten as:

$$I=x-vy$$

Since the sum of all currents in I has to be zero (Kirchoff's law), the unknown voltage v can be given by:

$$v=\frac{\sum x}{\sum y}$$

with Σx and Σy being the sums of the elements in x and y, respectively. Therefore, the unknown vector I can be given by:

$$I=x-\frac{\sum x}{\sum y}$$

The loop impedance of the bundle can then be given by the inverse of the current going through the signal wire. This current is equal to the sum of currents passing through the filaments into which the signal was partitioned:

$$Z_{loop}=\left(\sum_{i\in signal} I_i\right)^{-1}$$

5.1. The Partitioning Scheme

Figure 10:
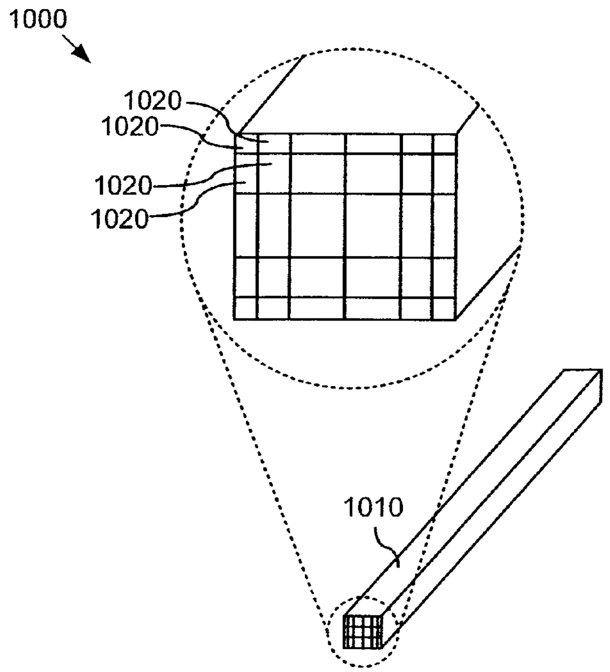
FIG. 10 is a schematic block diagram showing an example of partitioning a signal wire to represent the skin effect according to exemplary embodiments of the disclosed technology.

In the presence of the skin effect, currents in a conductor's cross-section crowd near its surface as the frequency increases. The current crowding effect is exponential in nature as a function of penetration from the surface. To account for this physics, the conductor can be partitioned into filaments with transverse dimensions that increase exponentially towards the center. FIG. 10 is a schematic block diagram 1000 showing an example of this partitioning for an exemplary wire 1010. As seen in the blown-up cross-section of FIG. 10, the wire 1010 can be divided into filaments 1020 (only four of which are referenced for ease of illustration), with filaments closer to the surface and corners of the wire having smaller areas than those on the interior of the wire 1010.

According to one exemplary procedure, a filament's width and thickness follows the following parametrization:

$$\omega_i=\pi^i\omega_0 \text{ and } t_i=\lambda^i t_0$$

where $\omega_0$ and $t_0$ are the width and thickness of the filaments at the corners. For a given frequency and λ, the optimal number of filaments can be found into which the wire is going to be partitioned. An extra condition can also be applied—namely that:

$$\omega_0(1+\lambda)<\delta \text{ and } t_0(1+\lambda)<\delta$$

where δ is the skin effect, given by:

$$\delta=(\sqrt{\pi\mu\sigma f})^{-1} \quad (38)$$

with σ the conductivity of the metal (e.g., $\sigma=58\Omega^{-1}\ \mu m^{-1}$ for copper), μ the magnetic permeability (e.g., $\mu=4\pi 10^{-7}$H/m), and f the frequency.

6. Self Inductance for Non-Manhattan Configurations

For non-Manhattan configurations, a third sweep (or multiple additional sweeps) can be performed (after the X and Y coordinate sweeps). In these additional sweeps, non-Manhattan signal-wire segments can be included (e.g., only non-Manhattan signal-wire segments). For instance, according to certain exemplary embodiments, bundles can be formed with ground wire segments (if any) parallel to the signal-wire segment. In this way, the linearity of the loop self inductance with the length of the bundle can be maintained.

7. Mutual Inductance

In an exemplary embodiment of the disclosed technology, the computation of the mutual inductance between two unrelated bundles can be performed according to any one or more of the following rules: (1) only signals whose path lengths are in the interval $L_{min}<L<L_{max}$, as defined by the electrical filtering on self inductance, are considered for mutual inductance purposes (e.g., as aggressor wires or as affected wires); (2) power and ground wires are used indistinctly as possible return paths—for instance, no differentiation is made between one and the other when computing mutual inductance; (3) affected wire segments can be externally identified (e.g., user defined); and (4) aggressor wire segments can be identified by the software tool. Certain embodiments use all of these rules.

In general, the mutual inductance computation concerns the inductive coupling between signal nets in an IC. Given the size and the number of nets a design, it is typically computationally too expensive to consider all the nets together in computing the mutual inductance among these nets. Therefore, and according to one exemplary embodiment of the disclosed technology, the fracturing already performed for the self-inductance computation is taken advantage of. For example, and according to one exemplary embodiment, the self impedance of wire segments (e.g., of each wire segment) is stored in the PDB. The mutual loop impedance between two signal segments can also be stored and represented as an element joining two segments.

Figure 11:
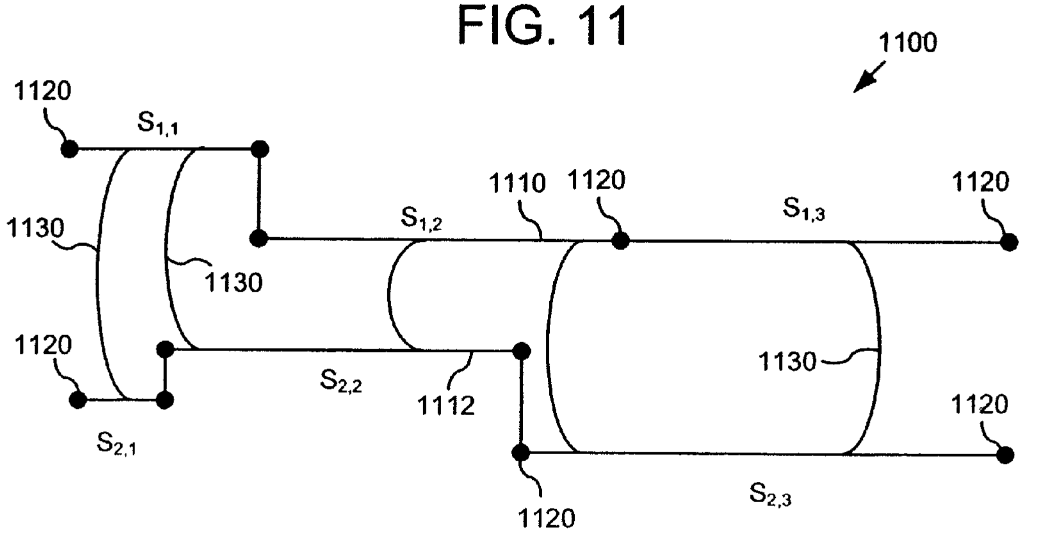
FIG. 11 is a schematic block diagram illustrating one exemplary method for using a fractured layout as part of determining mutual inductance according to embodiments of the disclosed technology.

FIG. 11 is a schematic block diagram 1100 illustrating one exemplary method for using the fractured layout in determining mutual inductance. In FIG. 11, a first signal-wire path 1110 and a second signal-wire path 1112 are shown, each comprising multiple segments. For example, the first segment of the first signal-wire path is designated as "$S_{1,1}$" and the second segment of the first signal-wire path is designated as "$S_{1,2}$". Furthermore, the circular markers 1120 represent the boundaries of each signal segment in the PDB, and the curved lines 1130 represent the inductive coupling among the segments. For ease of illustration, only a few representative circular marker 1120, and curved lines 1130 are designated in FIG. 11.

In one exemplary implementation, each segment is represented as a resistance in series with an inductance, as seen in the previous sections. Further, in one exemplary embodiment, the signal segments in one signal-wire path are coupled with all the segments in the other signal-wire path. In certain exemplary embodiments of the disclosed technology, the mutual loop inductance between two signal-wire segments is computed as the mutual inductance between two circuits, each one comprising the signal-wire segment and its corresponding return paths. For this, consider n and m as the number of bundles in which each of the two signal segments was partitioned in the self inductance step. The total mutual loop inductance between the two signal segments can be expressed as the sum of the n×m mutual inductance values among the m bundles in one signal segment and the n bundles in the other.

7.1. Mutual Inductance Between Bundles

In order to compute the mutual inductance between two bundles, and according to one exemplary embodiment, the values α computed during the self inductance computation can be used:

$$\alpha_k=I_k/I_t \tag{39}$$

With these values, the mutual impedance between bundle a and bundle b can be computed according to on exemplary embodiment using the following expression:

$$Z_{a,b}=\sum_{i\in a}\sum_{j\in b}\alpha_i\alpha_j Z_{i,j}, \tag{40}$$

where $Z_{i,j}$ is the partial impedance between segment i in bundle α and segment j in bundle b. The current coefficient $\alpha_i$ corresponds to bundle α, and $\alpha_j$ corresponds to bundle b.

In this exemplary embodiment, the mutual resistance between bundles is defined as the real part of $Z_{ab}$, and the mutual inductance as its imaginary part:

$$R_{a,b}\equiv\Re(Z_{a,b}) \tag{41}$$

$$\Omega L_{a,b}\equiv\Im(Z_{a,b}) \tag{42}$$

Additionally, the coupling constants can be defined as:

$$K_{R_{a,b}}=\frac{R_{a,b}}{\sqrt{R_aR_b}} \tag{43}$$

$$K_{L_{a,b}}=\frac{L_{a,b}}{\sqrt{L_aL_b}} \tag{44}$$

This method of splitting the problem up results in considerable savings in both time and memory, as it avoids the inversion of a matrix of size $n_{tot}$, where $n_{tot}$ is the total number of wire segments.

7.2. Detailed Implementation

In this section, a more specific exemplary implementation of a method for computing mutual inductance according to the disclosed technology is provided. In general, the mutual loop inductance between two closed circuits falls off, at long distances, with the square (in 2D) or cube (in 3D) of the distance between the centers of the loops. (See, e.g., R. Escovar, S. Ortiz, and R. Suaya, "An improved long distance treatment for mutual inductance," *IEEE Trans. Computer-Aided Design*, vol. 24, no. 5, pp. 783-793 (May 2005).) For purposes of this discussion, just those signal loops that are "close" to the affected signal loop are discussed.

Figure 34:
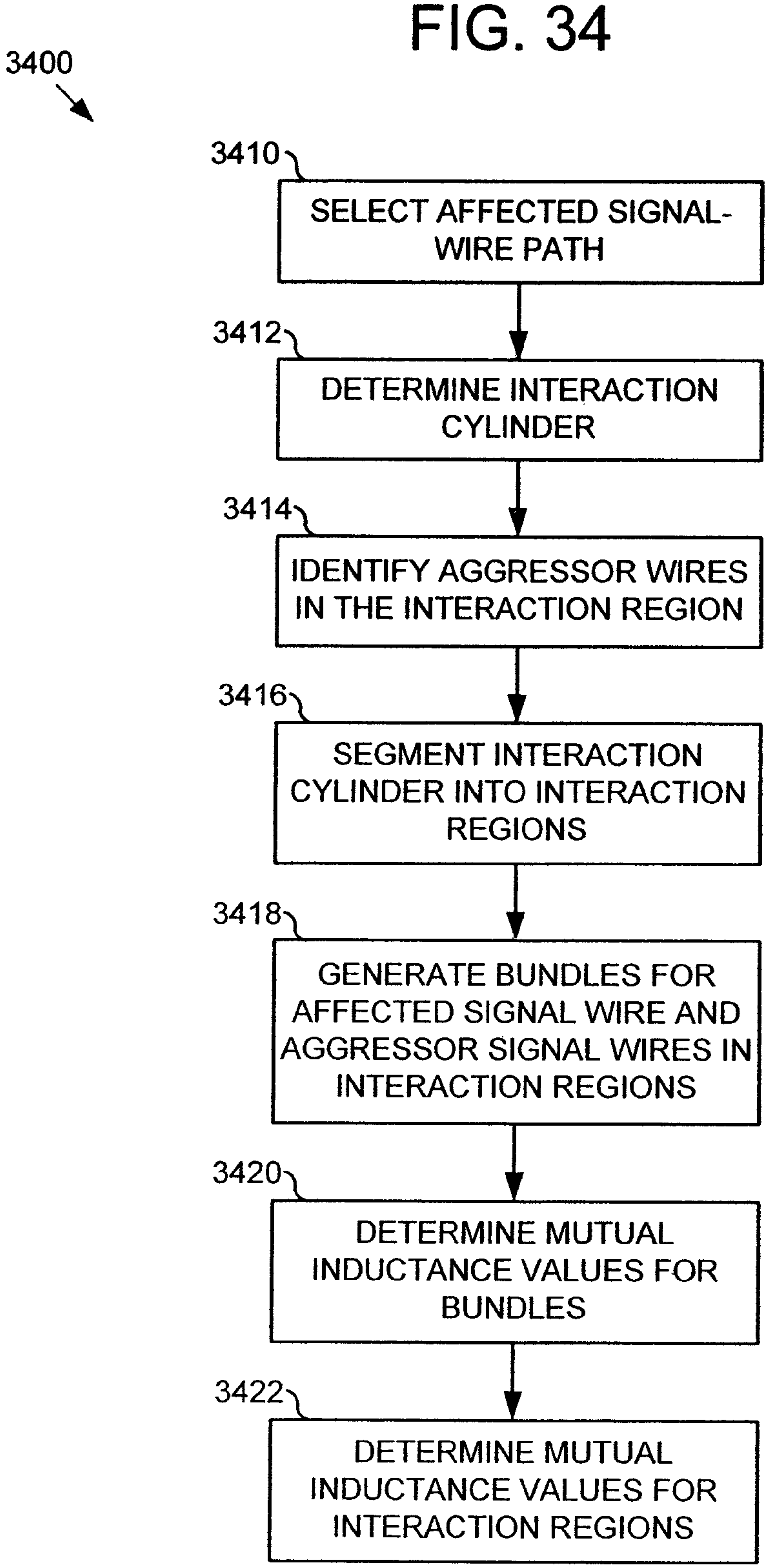
FIG. 34 is a flowchart illustrating an exemplary method of performing mutual impedance extraction according to embodiments of the disclosed technology.

FIG. 34 is a flowchart 3400 of an exemplary embodiment for computing mutual inductance between bundles. The particular embodiment shown in FIG. 34, however, should not be construed as limiting in any way, as any of the illustrated method acts can be performed alone or in various other combinations and subcombinations that are shown in FIG. 34. Some of the method acts shown in FIG. 34 are more specifically described in the subsequent sections.

At 3410, an affected signal path is selected. The signal path to be analyzed, for example, can be selected by the user (via a user interface) and may be a particularly critical or important path. Alternatively, the affected signal path can be selected automatically according to one or more criteria (e.g., frequency of the signal on the path, length, distance to nearest neighboring path, or other such criteria).

Figure 12:
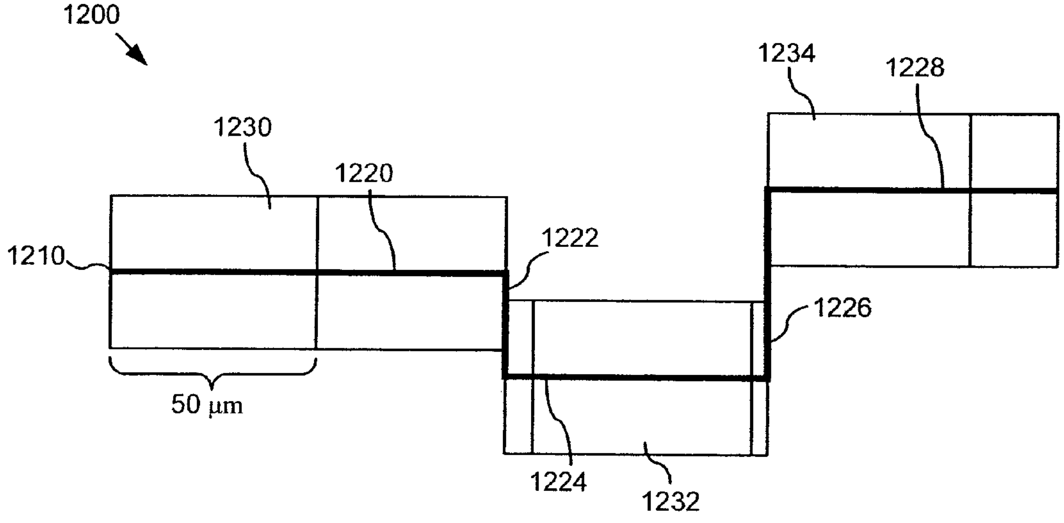
FIG. 12 is a schematic block diagram illustrating an interaction cylinder formed along an exemplary signal-wire segment as part of determining mutual inductances according to exemplary embodiments of the disclosed technology.

At 3412, a so-called "interaction cylinder" of diameter W is determined for the affected signal path. The interaction cylinder for a given signal path is illustrated, for instance, in FIG. 12. In particular, FIG. 12 is a schematic block diagram 1200 of an affected signal wire 1210 having five signal-wire segments—three signal-wire segments 1220, 1222, 1224 that extend in the X direction and two signal-wire segments 1226, 1228 that extend in the Y direction. The interaction cylinders 1230, 1232, 1234 of width W are shown for signal-wire segments 1220, 1222, 1224. Corresponding cylinders for the signal-wire segments 1226, 1228 can also be generated (e.g., in a separate mutual inductance computation for signal-wire segments in the Y direction).

In certain embodiments, W can be selected by the user (via a user interface, such as a graphic user interface). Further, although a cylinder is described in this exemplary embodiment, other three-dimensional regions or shapes can be used to determine which neighboring wires might create mutual inductance effects that are desirably analyzed.

At 3414, the aggressor wires for the affected signal wire are determined. For example, according to one exemplary embodiment, the aggressor wires are defined as signal wires that have at least a predetermined or user-defined percentage (e.g., 70%) of their common length inside the length of the interaction cylinder (in other embodiments, each individual signal-wire segment of a signal-wire path is considered individually).

Figure 13:
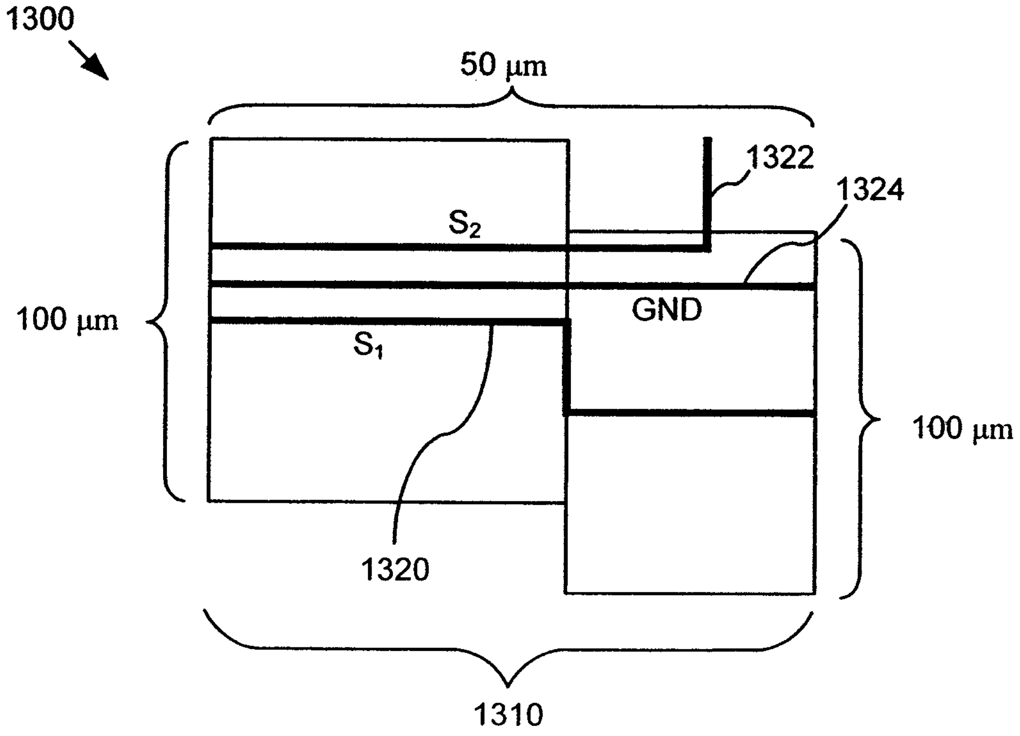
FIG. 13 is a schematic block diagram of a portion of the interaction cylinder of FIG. 12 illustrating the signal-wire segment as well as a neighboring ground wire and other signal wire within the interaction cylinder.

At 3416, the cylinder is further divided into regions of a predetermined or user-defined length (e.g., 50 μm long). This results in regions that are referred to herein as "interaction regions." An exemplary interaction region is shown, for instance, in the schematic block diagram 1300 shown in FIG. 13. In FIG. 13, interaction region 1310 for the affected signal wire 1320 ($S_1$) has a length of 50 μm. Furthermore, in this example, signal wire 1322 ($S_2$) is considered as the aggressor of the affected signal wire 1320 ($S_1$) and ground wire 1324 (G) is present as a possible return path for both signal wires 1320, 1322.

Figure 14:
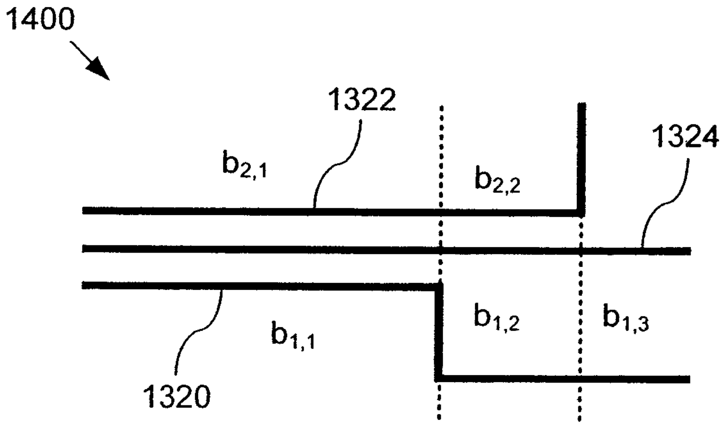
FIG. 14 is a schematic block diagram illustrating the interaction-cylinder portion of FIG. 13 segmented into bundles according to exemplary embodiments of the disclosed technology.

At 3418, a bundling procedure is performed between the affected signal wire and any aggressor signal wires in the interaction regions and identified at 3414. The bundling procedure can be performed, for example, as described above with respect to FIG. 32. For instance, for a given bundle, the aggressor signal line, the affected signal line, and the ground/power lines associated with each one can be considered all together. FIG. 14 is a block diagram 1400 that illustrates, for instance, the bundling of the interaction region presented in FIG. 13. For example, in FIG. 14, three bundles are created for the affected signal wire 1320 and designated as "$b_{1,3}$", "$b_{1,2}$", and "$b_{1,3}$". A similar labeling convention is used for the two bundles formed for the aggressor signal wire 1322. In this example, each bundle comprises a signal wire and its closest ground/power return wires, here ground wire 1324.

At 3520, the mutual inductances between the bundles in each interaction region are computed. In certain embodiments, bundles of a length smaller than some predetermined or user-defined value (e.g., 1 μm) are neglected.

At 3522, the overall mutual impedance between the affected signal wire and its one or more aggressor signal wires is computed. The mutual impedance between the affected signal wire and one of the aggressor signal wire can be expressed as the algebraic sum of all mutual impedances between the bundles in which the affected signal wire was fractured and the bundles in which the aggressor signal wire was fractured:

$$Z_{S_1,S_2} = \sum_{a \in S_1} \sum_{b \in S_2} Z_{a,b} \tag{45}$$

where $Z_{a,b}$ is given in expression (40). Furthermore, in certain embodiments, forward couplings between bundles within an interaction region are computed. In some embodiments, however, the mutual couplings between different interaction regions are neglected.

In other exemplary embodiments, any subset of these method acts is performed. In still other embodiments, any one or more of the method acts are performed individually or in various other combinations and subcombinations with one another. Furthermore, any of the techniques described in U.S. Patent Application Publication No. 2005/0120316 and R. Escovar, S. Ortiz, and R. Suaya, "Mutual inductance extraction and the dipole approximation," in *International Symposium on Physical Design* (*ISPD*) (April 2004)), which are incorporated herein by reference, can be used.

7.3. Dipole Selection Rules

In certain exemplary embodiments, dipole approximation selection rules are used inside an interaction region to reduce the unnecessary computations of small mutual inductances. This technique is discussed more fully in U.S. Patent Application Publication No. 2005/0120316, U.S. Patent Application Publication No. 2006/0282492, and R. Escovar, S. Ortiz, and R. Suaya, "Mutual inductance extraction and the dipole approximation," in *International Symposium on Physical Design* (*ISPD*) (April 2004)), all of which are incorporated herein by reference. Any of the additional techniques described therein can also be used in connection with the present technology. In general, the technique results from an analysis of the leading term in the interaction between bundles.

Figure 15A:
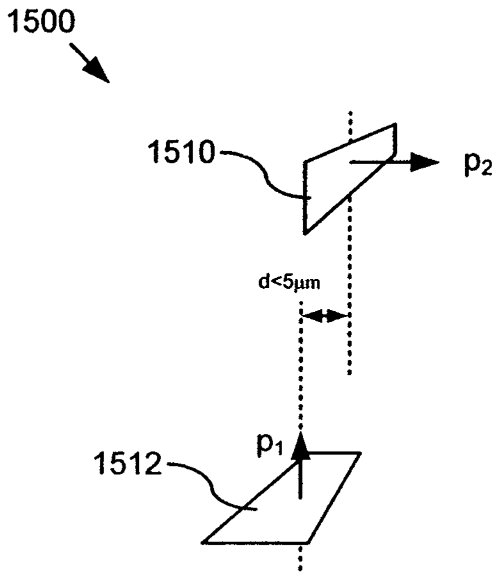
FIG. 15A is a schematic block diagram illustrating a first relationship between two dipole moments as may be used to determine whether mutual inductance should be computed between two bundles and according to exemplary embodiments of the disclosed technology.
Figure 15B:
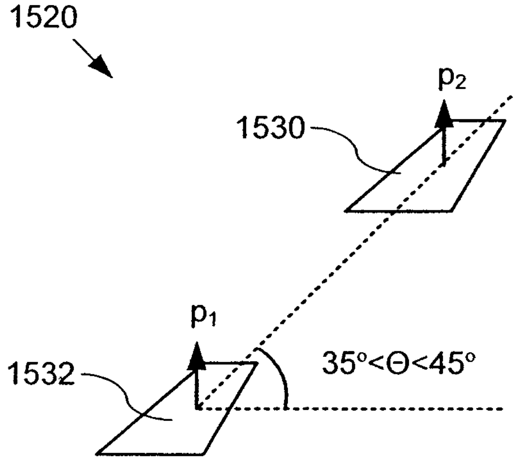
FIG. 15B is a schematic block diagram illustrating a second relationship between two dipole moments as may be used to determine whether mutual inductance should be computed between two bundles and according to exemplary embodiments of the disclosed technology.

In an exemplary implementation, at least one or more of the following rules is used: (1) if either the aggressor or affected-signal-wire bundles have a null dipole moment, they are determined not to interact (e.g., mutual inductance=0); (2) if two bundles have perpendicular dipole moments, and if the center of one is located within a predetermined or user-defined distance of the axis of the other, then they are determined not to interact (this relationship is illustrated in the schematic block diagram 1500 of FIG. 15A, which shows a first bundle 1510 having a dipole moment that is perpendicular to the dipole moment of a second bundle 1512); (3) if two bundles have parallel dipole moments, and their relative orientation with respect to this common horizontal is $f$, then they are determined not to interact if $f$ is between a predetermined or user-defined range of angles (e.g., between 35° and 45)° (this relationship is illustrated in the schematic block diagram 1520 of FIG. 15B, which shows a first bundle 1530 having a parallel dipole moment with a second bundle 1532); and (4) if the distance between two bundles is greater than a predetermined or user-defined distance, the dipole approximation method is used in the computation of mutual inductance in the core. In one exemplary embodiment, a dipole approximation technique is used to compute the mutual inductance between two intentional inductors, and is used only if the distance between the inductors (the border-to-border separation) is greater than 1/10 of the largest radius of the two inductors.

In exemplary implementations, any subset of these rules is used. Furthermore, in one exemplary implementation, the above rules hold if and only if the two bundles do not share any grounds. Note also that the distances between bundles refer to the distance between the centers of mass for the bundles. Also, as noted above, the parameters recited can be user-defined and controllable.

7.4. Non-Manhattan Configurations

If any of the signal wires in the configuration possesses non-Manhattan wire segments, computing the loop mutual inductance between this wire and any other signal wire can result in calculations of loop mutual inductance between non-parallel bundles. In certain exemplary embodiments of the disclosed technology, the mutual inductance between two nonparallel bundles is computed in the same manner as when computing mutual inductance between two parallel bundles but using expression (18) when computing partial mutual inductance.

8. Mutual and Self Impedance in the Presence of a Ground Plane

When a ground plane participates as a return path for currents, its width is generally much larger than δ for all except very low frequencies. Thus, skin-effect-like computations are desirable for ground planes, starting at frequencies of about 1 GHz. For substrate effects, the frequency of reference for the skin effect is significantly higher than that of ground planes using metals, such as Cu. This section discusses exemplary methods for including ground planes into the general self-plus-mutual-inductance extraction procedure. The discussion proceeds with reference to a nonlimiting example, which is used to illustrate several subtleties of the exemplary techniques. Typically, however, the implementation will be more general.

Figure 16:
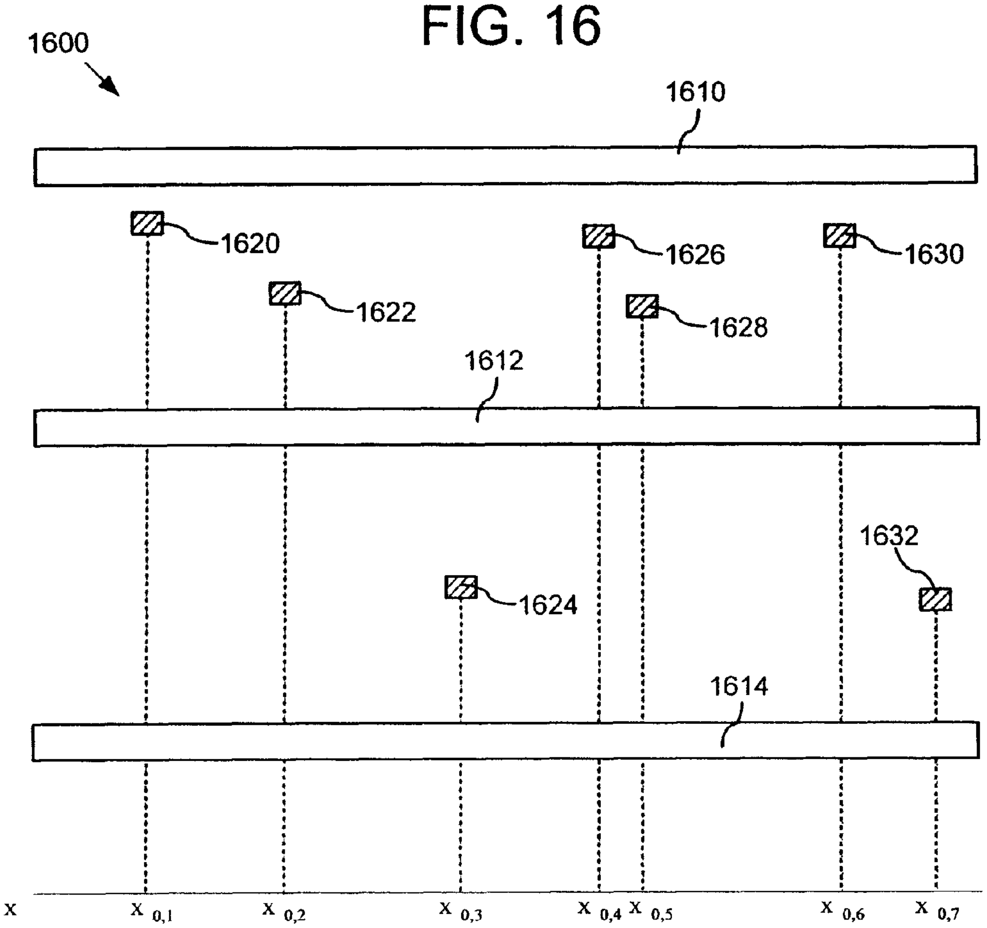
FIG. 16 is a schematic block diagram of an exemplary configuration of signal-wire segments in the presence of a ground plane illustrating how ground planes are analyzed according to exemplary embodiments of the disclosed technology.

Consider as an exemplary configuration 1600 illustrated in FIG. 16. The exemplary configuration 1600 comprises three respective ground planes 1610, 1612, 1614 and seven respective signal lines 1620, 1622, 1624, 1626, 1628, 1630, 1632. The problem can be defined as finding the impedance matrix of the configuration in which each signal line uses the three ground planes as return paths. Further, in order to account for frequency effects (such as skin and proximity effect), it is desirable to partition the ground planes into filaments such that the current in each of them can be considered homogeneous.

Current density in a ground plane at any but very low frequencies is larger nearest to the signal and decreases farther from the signal. For this reason, the ground plane can be finely partitioned in the "shadow" of the signal wires. The farther from the shadow of a signal line, the more homogeneous the current in the ground plane will be.

Figure 17:
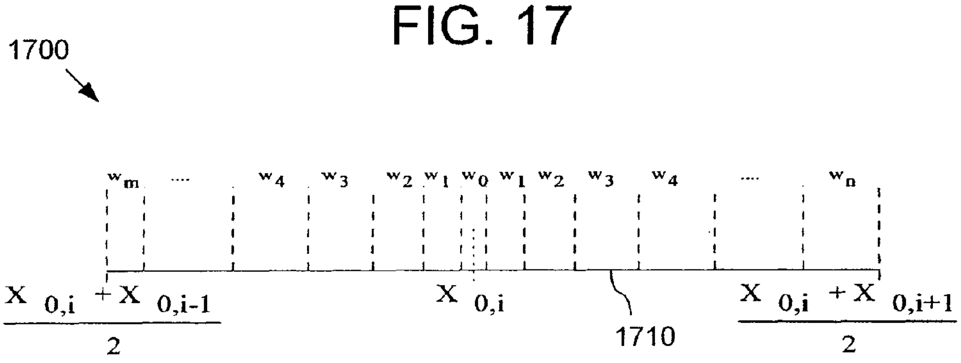
FIG. 17 is a schematic block diagram illustrating how one of the ground planes of FIG. 16 can be partitioned according to exemplary embodiments of the disclosed technology.

In one exemplary embodiment, the cross-section of the ground plane is partitioned with filaments whose widths increase exponentially with distance starting at the (closest) filament width located at the center of the signal's shadow (illustrated by the dotted lines in FIG. 10 and generally referring to a line in the Z direction in the X-Z plane that extends through the center of a signal wire). The partition of the ground plane is therefore signal dependent. For a signal wire i, for example, the ground plane can be partitioned with an exponential partitioning starting from the center of each signal wire's shadow. For a single signal line, this exemplary method is trivial. For multiple signals, the distance between the center of the shadows can be computed. The cross sections can then be computed to fall off exponentially in width in between the mid-points of the current signal and its nearest neighbors. FIG. 17 is a schematic block diagram 1700 showing a cross-section of a ground plane 1710 (such as a ground plane in the configuration 1600) and illustrating this exemplary partitioning scheme for a signal wire i (not shown but assumed to be above or below the position $x_{0,1}$ in the diagram 1700).

Referring to the example illustrated in FIG. 17, the exemplary partitioning scheme can start with a filament of width $w_0$ centered at $x_{0,i}$. The x coordinates of the center of each filament and their respective widths are stored in four vectors using the following exemplary recursion:

To the right:

$$w^+(i)=w^+(i-1)\delta_w$$

$$x^+(i)=x^+(i-1)+0.5(w^+(i-1)+w^+(i)) \tag{46}$$

To the left:

$$w^-(i)=w^-(i-1)\delta_w$$

$$x^-(i)=x^-(i-1)-0.5(w^-(i-1)+w^-(i)) \tag{47}$$

with $w^+(1)=w^-(1)=w_0$, $x^-(1)=(1)=x_{0,i}$ and $(\partial_w>1$ the growth coefficient. Notice that the last width on the right or on the left may not correspond exactly to that obtained with the recursion given in expressions (46) or (47). Its value can be adjusted, however, to cover the interval.

Once the ground planes are partitioned, the partial impedance matrix can be computed for a given frequency f. The partial impedance matrix can comprise the self impedance of the signals and the ground plane filaments, and the mutual inductance values among themselves. For example, $$Z(i,i)=R_i+j(2\pi fL_i) \text{ and } Z(i,k)=j(2\pi fM_{i,k}), \tag{48}$$

with $R_i$ and $L_i$ being the low frequency resistance and partial inductance of filament i, respectively, and $M_{i,k}$ being the low frequency partial mutual inductance between filaments i and k.

8.1 Reduced Impedance Matrix

Given n conductors broken into a total of m filaments, the n×n impedance matrix Z can be computed from the m×m partial impedance matrix 2 using the following exemplary methodology: for i=1, . . . , n, solve the linear system $\tilde{Z}I_i=V_i$, with $V_i$ formed as: $V_i(k)=1$ if filament k belongs to conductor i and $V_i(k)=0$, otherwise, for k=1, . . . , m, assign to the i-th column of matrix Y the vector $I_i$. Next, invert the n×n matrix Y to obtain Z.

Since n linear systems will be solved using the same matrix 2 in this exemplary approach, the matrix can be decomposed using a modified version of the $LDL^T$ factorization for complex and symmetric matrices. Instead of having $O(nm^3)$ operations, $O(m^3+n*m^2)$ operations can be performed. The size of the systems for analysis is sufficiently small for using direct methods.

The disclosed technology described above was implemented and tested to verify its functionality. For a configuration as shown in FIG. 16, the computations using the exemplary implementation described and FastHenry agreed to better than a 1% difference for frequencies up to 20 GHz. No partitioning of the signal wires into filaments was included for these frequencies. For frequencies larger than 20 GHz, partitioning was performed for the signal wire using an embodiment as described above in Section 5.1 The performance observed was a factor of three better than the corresponding performance with FastHenry for the same example and the accuracy was within 1% of FastHenry.

9. Foster Pairs

To represent frequency-dependent impedance, exemplary embodiments of the disclosed technology use circuit representations comprising Foster pairs. There are several ways of doing this, according to the number of input/output parameters and the types of constraints to be imposed on the system For applications where the regime when proximity effects and skin effects are non-overlapping, a simple representation can be used. For instance, one can use proximity effect variation of the loop inductance and the dynamic resistance as that associated with the change in the number of ground wires that participate in the return path. There are other so-called proximity effects at higher frequencies that correspond to multiple wire versions of the skin effect. Except for ground planes not normally included on modem designs, the first appearance of frequency dependent phenomena which modify the values of inductance and dynamic resistance is a result of the proximity effects that emerge in the manner described in this section.

9.1. Foster Pairs for Proximity Effects

Figure 18A:
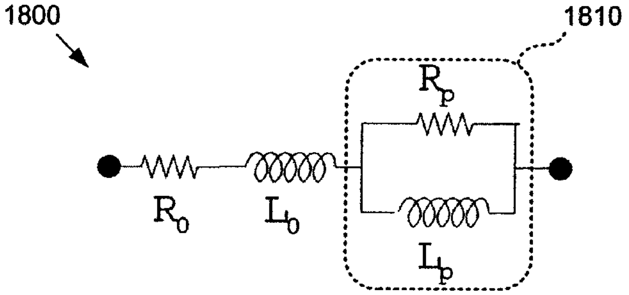
FIG. 18A is a schematic block diagram of a broadband representation having one Foster pair as can be used in exemplary embodiments of the disclosed technology.

In certain exemplary embodiments of the disclosed technology, a minimal representation comprising one Foster pair in series with a resistor and an inductor suffices to describe the physics in the regime where proximity effects appear (representations for representing broadband behavior, including representation comprises one or more Foster pairs, are referred to herein as "broadband representations" or "frequency-dependent representations"). FIG. 18A is a schematic block diagram 1800 of such a representation, which includes a single Foster pair 1810 (a parallel-coupled inductance component and resistance component). This result holds true due to the patterns of signal and ground configurations present in an IC, which are such that there is ordinarily no need to make use of multiple Foster pairs to fit the data. To understand the benefit of this property, it should be noted that in the presence of many Foster pairs, parameter determination involves solving higher order algebraic equations, whose solutions often involve nonphysical parameters (e.g. negative or complex values for the resistance and or inductances in the solution). The inclusion of these solutions can lead to nonphysical results that violate the passivity of the resulting circuit. The appearance of unphysical parameters can be prevented for single Foster pairs (or dual Foster pairs) in series with a resistor inductor pair by making certain adjustments and assumptions that are discussed below.

The exemplary circuit representation of FIG. 18A comprises four parameters to be determined—namely, $R_0$, $L_0$, $R_p$, $L_p$ (note that in this discussion inductance is labeled L). The four parameters can be computed in certain exemplary embodiments from extraction values at two different frequencies $f_L=\omega_L/2\pi$ and $f_H=\omega_h/2\pi$ as follows:

$$R_L=R(\omega_L), R_H=R(\omega_H)$$

$$L_L=L(\omega_L, L_H=L(\omega_H) \tag{49}$$

and satisfying the consistency conditions:

$$\omega_L<\omega_H \Longleftrightarrow (R_L<R^H \text{ and } L_{L>LH}). \tag{50}$$

In these embodiments, the equations to solve are:

$$R_0+\frac{R_p\omega_L^2L_p^2}{R_p^2+\omega_L^2L_p^2}=R_L \quad R_0+\frac{R_p\omega_H^2L_p^2}{R_p^2+\omega_H^2L_p^2}=R_H \tag{51}$$

$$L_0+\frac{R_p^2L_p}{R_p^2+\omega_L^2L_p^2}=L_L \quad L_0+\frac{R_p^2L_p}{R_p^2+\omega_H^2L_p^2}=L_H.$$

This system has an analytic solution, given by:

$$R_p=K(R_H-R_L) \qquad R_0=R_L-\frac{\beta_L^2}{1+\beta_L^2}R_p \tag{52}$$

$$L_p=K(L_L-L_H) \qquad L_0=L_L-\frac{1}{1+\beta_L^2}L_p$$

$$K=\frac{(1+\beta_L^2)(1+\beta_H^2)}{\beta_H^2-\beta_L^2}, \quad \beta_i=\frac{\omega_i}{\omega_c},$$

and the characteristic frequency of the circuit is defined as $$\omega_c\equiv\frac{R_H-R_L}{L_L-L_H}. \tag{53}$$

Figure 19A:
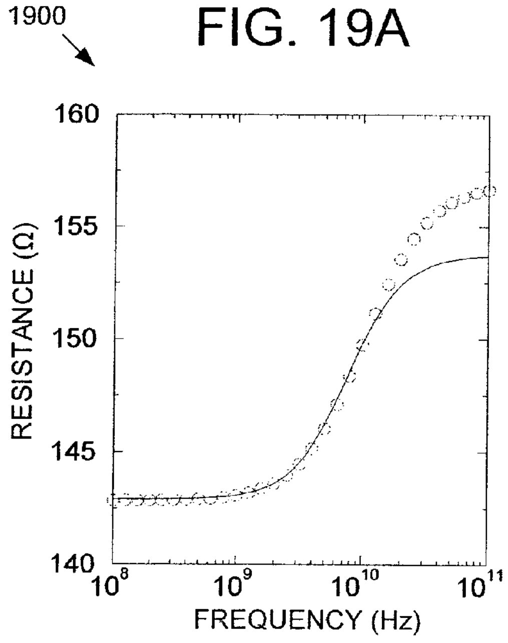
FIGS. 19A and 19B are graphs of the resistance and inductance responses, respectively, of an exemplary wire segment across a wide band of frequencies as modeled by a field solver and by the representation of FIG. 18A.
Figure 19B:
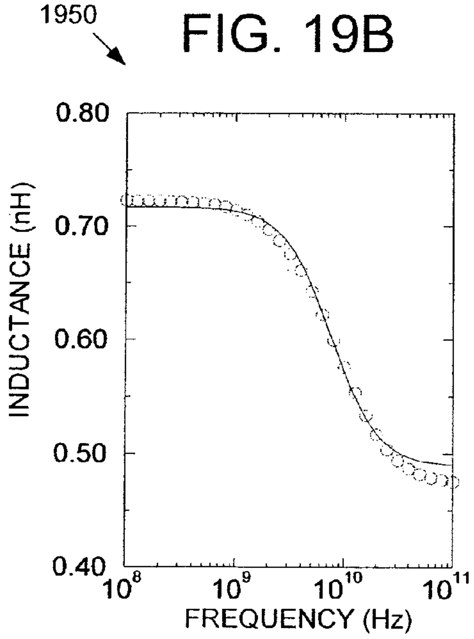

FIG. 19A is a graph 1900 showing the change in resistance (in Ohms) of an exemplary wire segment across a range of frequencies (in Hz), and FIG. 19B is a graph 1950 showing the change in inductance (in nH) of the exemplary wire segment across the same range. The solid lines in the graphs indicate the results computed using a field solver (in this example, FastHenry), whereas the circular plots show results from using a circuit representation having a single Foster pair as in FIG. 18A. FIGS. 19A and 19B show the fit for a typical signal-wire segment across a wide frequency range. It can be observed that the fit is generally good in the interpolation range (1 Ghz-10 Ghz), where proximity effects manifest.

The exemplary solution described above provides an accurate interpolation in the range $[\omega_L,\omega_H]$ for the values of resistance and inductance. The quality of this particular interpolation relies on whether or not the system undergoes a significant transition in this range.

A Foster pair circuit representation (such as the circuit representation shown in FIG. 18A) is a valid representation of the system as long as $\omega_c$ is in the vicinity of the input data. More precisely, the step transitions in FIGS. 19A and 19B go from about 10% to 90% in the range $[\omega_c/3, 3\omega_c]$. Thus, in order to help ensure that a significant part of the transition is captured (or at least partially captured), the following condition is desirably met in embodiments of the disclosed technology:

$$[\omega_L,\omega_H]\cap\left[\frac{\omega_c}{3},3\omega_c\right]\neq\emptyset \tag{54}$$

In other words, in embodiments of the disclosed technology, a Foster pair representation is desirably used as long as:

$$\frac{2\pi}{3}f_L=\frac{\omega_L}{3}\leq\omega_c\leq3\omega_H=6\pi f_H \tag{55}$$

Such a condition can help ensure that the input data points are not "too close", meaning that the data points do not both fall in the same flat domains at the right and left of the graphs in FIGS. 19A and 19B. This statement can be viewed as also meaning that the denominator in expression (52) should not be small. This denominator can be factored, for example, as $(\beta_L+\beta_H)(\beta_H-\beta_L)$, and can be considered small if and only if $$\beta_H-\beta_L\ll1 \Longleftrightarrow \omega_H-\omega_L\ll\omega_C \tag{56}$$

It is in this sense that the term "closeness" is used above. By preventing this situation, unphysical output values can be avoided (e.g., a negative $R_0$ or $L_0$).

If the input data does not satisfy these conditions, it is ordinarily due to the fact that no significant transition occurs in the given frequency range. Thus, and according to certain exemplary embodiments of the disclosed technology, a representation having no Foster pairs is used. For example, a simple representation of an inductance component in series with a resistance component can instead be used, wherein each component has a fixed value for the resistance and inductance.

These exemplary techniques can provide a solution to the problem of broadband representation of the loop self impedance of a wire in an IC for frequencies below skin-effect manifestation.

9.2. An Exemplary Implementation

Figure 20A:
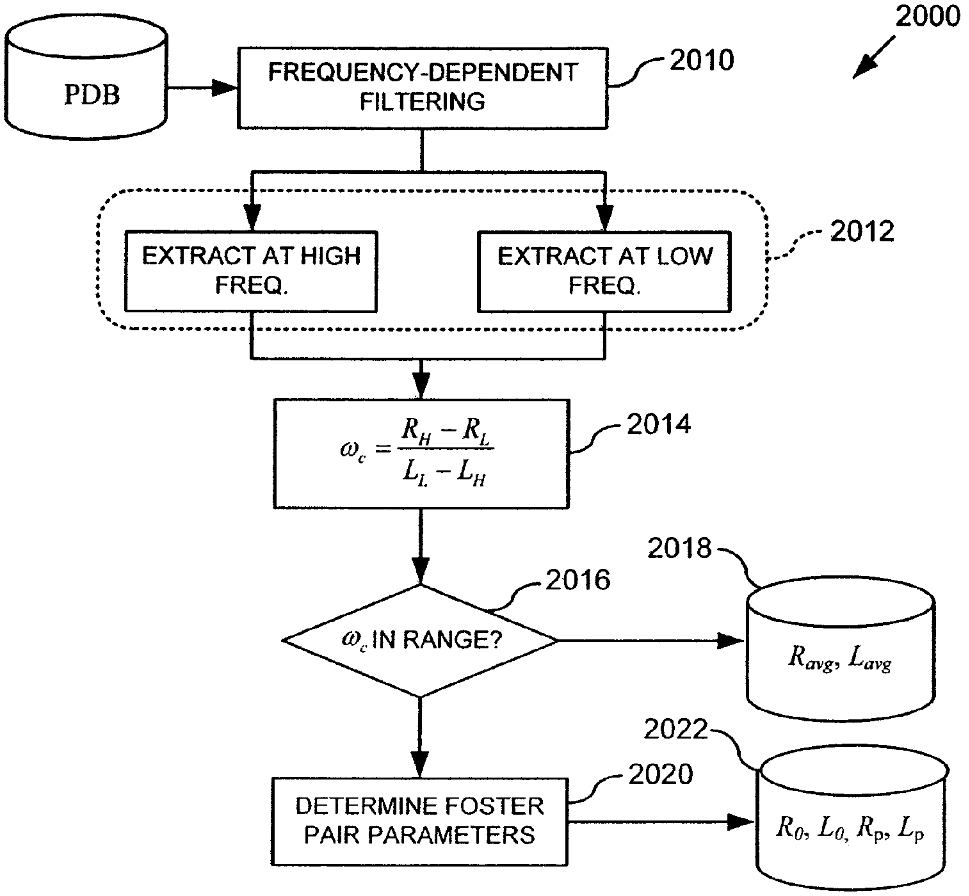
FIG. 20A is a flowchart of en exemplary embodiment for performing impedance extraction across a plurality of frequencies using representations comprising one or fewer Foster pairs.

In FIG. 20, a flowchart 2000 for an exemplary implementation of the method for representing frequency dependence for two data points in a frequency range [$f_L$, $f_H$] using a single Foster pair is illustrated. In the illustrated embodiment, just the deviations from the extraction flow discussed above are illustrated.

At 2010, frequency dependent filtering is performed. For example, in certain desirable implementations, the wire-path segments to be considered satisfy the $L_{min}$, $L_{max}$ conditions (described above) as well as the conditions on the operating frequency. For instance, for digital circuits, the HI frequency of extraction can be bounded by a predetermined or user-defined value (e.g., 15 GHz) beyond which skin effect needs to be included. For example, according to one exemplary implementation:

$$f_H = \min\left(\frac{1}{t_r}, 15\ \text{GHz}\right) \tag{57}$$

where $t_r$ is the minimum rise time for the signal wire.

At 2012, impedance parameters are extracted at a plurality of different frequencies in the frequency range, and in the illustrated embodiment at the HI frequency and the LO frequency range. Extraction can be performed as described above in section 4. In certain embodiments, PDB single frequency input values can be used for resistance and inductance.

At 2014, the characteristic frequency is determined. For example, the characteristic frequency can be determined from the extracted inductance and resistances values using Expression (53).

At 2016, a determination is made as to whether the characteristic frequency is in the desired range. For example, in certain desirable embodiments, the condition for the characteristic frequency to be "in range" can be a parameterized version of Expression (55), such as:

$$\frac{2\pi}{\gamma} f_L \le \omega_c \le 2\gamma\pi f_H \tag{58}$$

where γ is a tunable value and may have a default value (e.g., 3).

If the characteristic frequency is not in range, then according to the illustrated implementation, a circuit representation with no Foster pairs is used at 2018 (e.g., an inductance and resistance component in series, each having respective averaged values $L_{avg}$ and $R_{avg}$). In certain embodiments, $L_{avg}$ and $R_{avg}$ are the average values:

$$L_{avg} \equiv \frac{L_H + L_L}{2},\ R_{avg} \equiv \frac{R_H + R_L}{2} \tag{59}$$

If the characteristic frequency is in range, Foster pair parameters are computed for the signal-wire segment at 2020 and stored at 2022. For example, in certain embodiments, Expression (51) is used in computing the Foster pair parameters, disaggregated in the usual way, proportional to length.

Figure 18B:
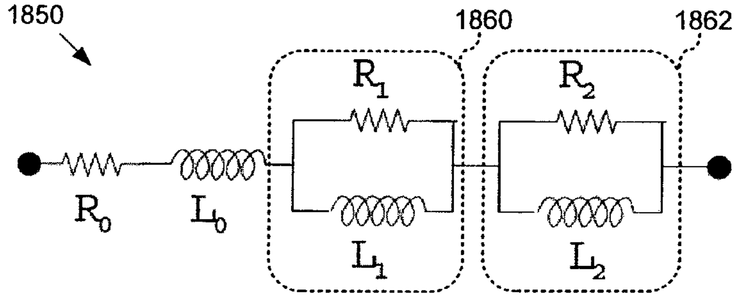
FIG. 18B is a schematic block diagram of a broadband representation having two Foster pairs as can be used in exemplary embodiments of the disclosed technology.

In other exemplary embodiments, any subset of these method acts is performed. In still other embodiments, any one or more of the method acts are performed individually or in various other combinations and subcombinations with one another Furthermore, in certain embodiments, broadband representations using two Foster pairs are utilized. FIG. 18B is a schematic block diagram 1850 of such a representation, which includes a first Foster pair 1860 and a second Foster pair 1862.

In particular embodiments, extraction can be performed at three or more frequencies and a determination made as to whether a representation having no Foster pair, one Foster pair, or two Foster pairs is made. This determination can be based, for example, on at least the frequency of operation or the significance of the step transition in the frequency range of interest. For example, as described below, a determination can be made as to whether there exist two significant transition in a circuit's response across a range of frequencies. If so, and according to one exemplary implementation, a broadband representation comprising two Foster pairs (and, in particular embodiments, no more than two) is used.

For frequency-dependent phenomena in interconnects, there are typically two different causes for transitions in R, L behavior: the redistribution of the total current among all possible return paths, and the crowding of currents near the borders of the conductors (known as proximity and skin effects). Both of these transitions ordinarily occur in frequency ranges on or above a few GHz for 90 nm technology, though the second one occurs at slightly higher frequencies than the first.

Figure 20B:
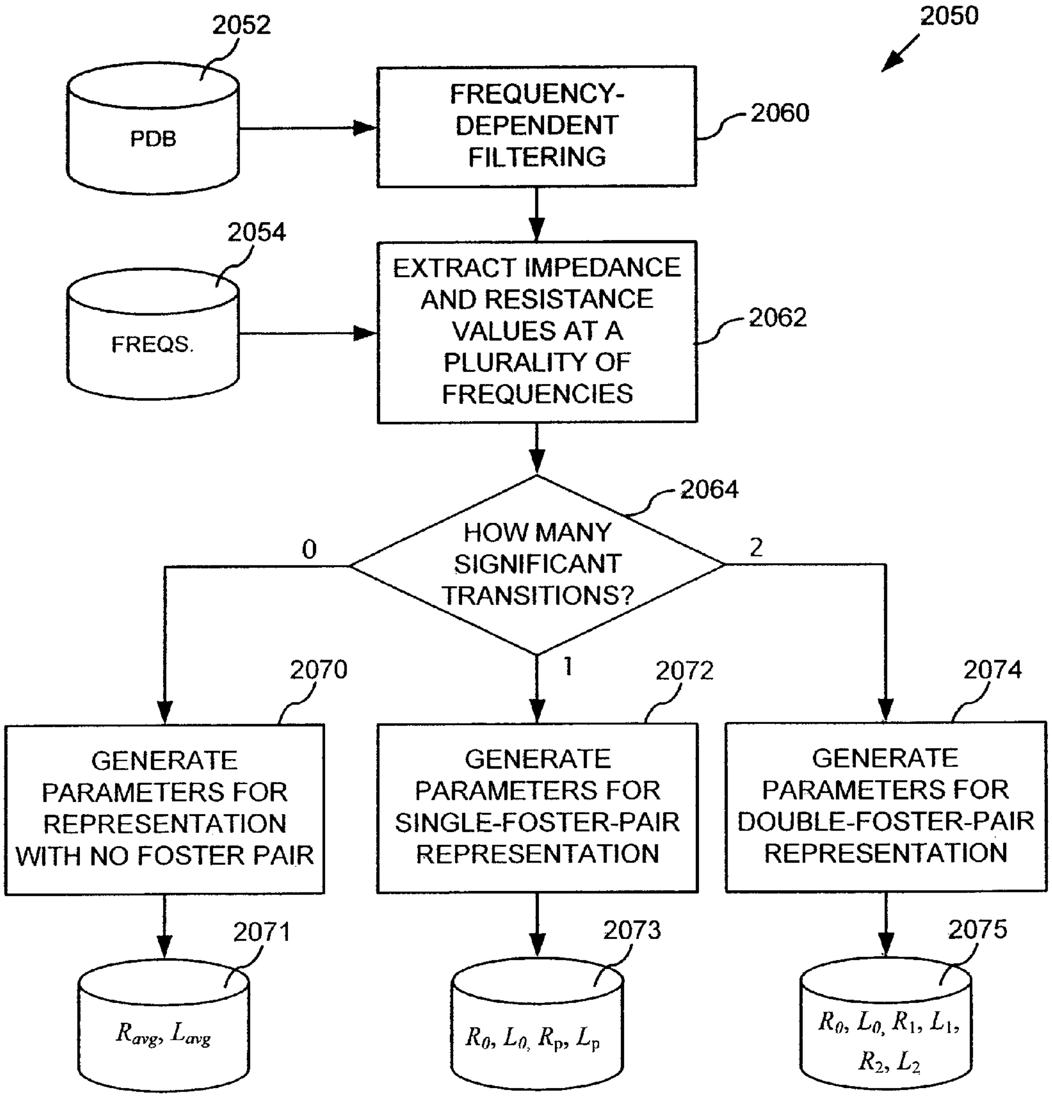
FIG. 20B is a flowchart of en exemplary embodiment for performing impedance extraction across a plurality of frequencies using representations comprising two or fewer Foster pairs.

According to certain embodiments of the disclosed technology, there are three different scenarios to consider in implementing the Foster pair representation of frequency dependent interconnects. An exemplary method 2050 for analyzing these scenarios and implementing the possible circuit representations is illustrated in FIG. 20B. At 2060, frequency dependent filtering is performed. For example, in certain desirable implementations, the wire-path segments are filtered (e.g., from the PDB 2052) to satisfy the $L_{min}$, $L_{max}$ conditions as well as the conditions on the operating frequency (e.g., as described above with respect to FIG. 20A).

At 2062, impedance parameters are extracted at three or more different frequencies in the frequency range (e.g., from stored frequencies 2054). In the illustrated embodiment, for example, a low ($f_1$), middle ($f_2$), and high frequency ($f_3$) are considered. Extraction can be performed as described above in section 4.

At 2064, the impedance and resistance values extracted are analyzed to determine the number of significant transitions. For example, according to one exemplary implementation, it is initially assumed that a representation having two foster pairs will be used and an analysis is performed to determine if the two characteristic frequencies of the foster pairs are distinct. The characteristic frequencies of the two pairs can be expressed as: $\omega_1=2\pi f_1$, $\omega_2=2\pi f_2$. To find the characteristic frequencies, the following unknowns can be defined:

$$x_1 \equiv \frac{\omega_1}{\omega_l} \qquad x_2 \equiv \frac{\omega_2}{\omega_l} \tag{60}$$

which can be obtained by solving the system of equations:

$$x_1 = F(x_2) \qquad x_2 = F(x_1) \tag{61}$$

$$F(x) = C + \frac{D}{x^2 + B} \tag{62}$$

$$C = -\frac{Ag_h - g_m}{1 - A}$$

$$D = \frac{A(k_m + k_h)(g_h - g_m)}{1 - A}$$

$$B = \frac{Ak_h - k_m}{1 - A}$$

where the following auxiliary parameters have been used:

$$A = \frac{(1 - k_m)(L_l - L_h)}{(1 - k_h)(L_l - L_m)} \tag{63}$$

$$k_m = \left(\frac{\omega_m}{\omega_l}\right)^2,\ k_h = \left(\frac{\omega_h}{\omega_l}\right)^2$$

$$g_m = \frac{1}{\omega_l}\frac{R_m - R_l}{L_l - L_m},\ g_h = \frac{1}{\omega_l}\frac{R_h - R_l}{L_l - L_h}.$$

The solution can be obtained efficiently by performing the fixed-point iteration:

$$x_1^{(n+1)} = F(x_2^{(n)})$$

$$x_2^{(n+1)} = F(x_1^{(n+1)}). \tag{64}$$

Furthermore, convergence of this method can be guaranteed under the following conditions:

$$B < 0,\ C > 0,\ D < 0 \tag{65}$$

$$\frac{B}{C} > C - \frac{D}{B}.$$

In particular embodiments, a starting point of $x_2^{(1)} = 0.9\sqrt{-B}$ is used.

In certain embodiments, a further determination is made as to whether the characteristic frequencies for the Foster pairs are distinct. For example, a criterion, such as $\omega_{c,1} < \gamma^2 \omega_{c,2}$, can be used, where $\gamma$ is a tunable value (e.g., around 3). If the characteristic frequencies are determined to be distinct, then two significant transitions exist and a representation having two Foster pairs will be used. If the characteristic frequencies are determined to be indistinct, then no more than one significant transition exists. In this scenario, and in certain embodiments, an additional determination is made as to whether one or zero significant transitions exist. For example, the procedure described above with respect to process blocks 2014 and 2016 of FIG. 20A can be used to determine whether a representation having one or no Foster pairs should be used.

If no significant transitions exist, then a representation with no Foster pairs is generated at 2070 and the corresponding parameters stored (e.g., as representation 2071 with $R_{avg}$ and $L_{avg}$). If one significant transition exists, then a representation with one Foster pair is generated at 2072 and the corresponding parameters stored (e.g., as representation 2073 with $R_0$, $L_0$, $R_p$, and $L_p$). The values for $R_{avg}$, $L_{avg}$ & $L_0$, $R_p$, and $L_p$ can be determined as described above with respect to FIG. 20A. Furthermore, if two significant transitions exist, then a representation with two Foster pairs is generated 2074 and the corresponding parameters stored (e.g., as representation 2075 with $R_0$, $L_0$, $R_1$, $L_1$, $R_2$, and $L_2$). The values for $R_0$, $L_0$, $R_1$, $L_1$, $R_2$, and $L_2$ can be computed as follows:

$$R_1 = \frac{(R_m - R_l)\left(1 - \frac{x_2}{g_m}\right)}{\left(1 - \frac{x_2}{x_1}\right)\left(\frac{k_m}{k_m + x_1^2} - \frac{1}{1 + x_1^2}\right)} \tag{66}$$

$$R_2 = \frac{(R_m - R_l)\left(1 - \frac{x_1}{g_m}\right)}{\left(1 - \frac{x_1}{x_2}\right)\left(\frac{k_m}{k_m + x_2^2} - \frac{1}{1 + x_2^2}\right)}$$

$$L_1 = \omega_l x_1 R_1$$

$$L_2 = \omega_l x_2 R_2$$

$$R_0 = R_l - \frac{R_1}{1 + x_1^2} - \frac{R_2}{1 + x_2^2}$$

$$L_0 = L_l - \frac{x_1^2 L_1}{1 + x_1^2} - \frac{x_2^2 L_2}{1 + x_2^2}$$

In other exemplary embodiments, any subset of these method acts is performed. In still other embodiments, any one or more of these method acts are performed, individually or in various other combinations and subcombinations with one another.

Figure 21:
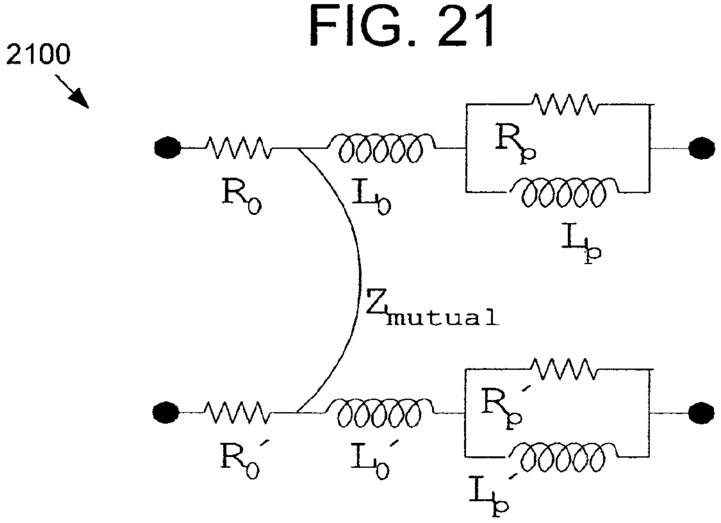
FIG. 21 is a schematic block diagram of two broadband representations, each having one Foster pair, and the mutual inductance joining the representations.

With regard to mutual impedance between interconnects, and in certain exemplary embodiments of the disclosed technology, the mutual impedance can be simplified as being frequency independent. For example, default values can be taken from the highest frequency of interest. As such, the representation of the broad band behavior for multiple signal wires can be schematically shown as in the exemplary foster circuit representation 2100 illustrated in FIG. 21. The exemplary representation 2100 includes the value $Z_{mutual}$ whose real part is $R_{mutual}$ and its imaginary part is $\omega M_{mutual}$, calculated as in Expression (40) for $f_{HI}$.

Figure 22:
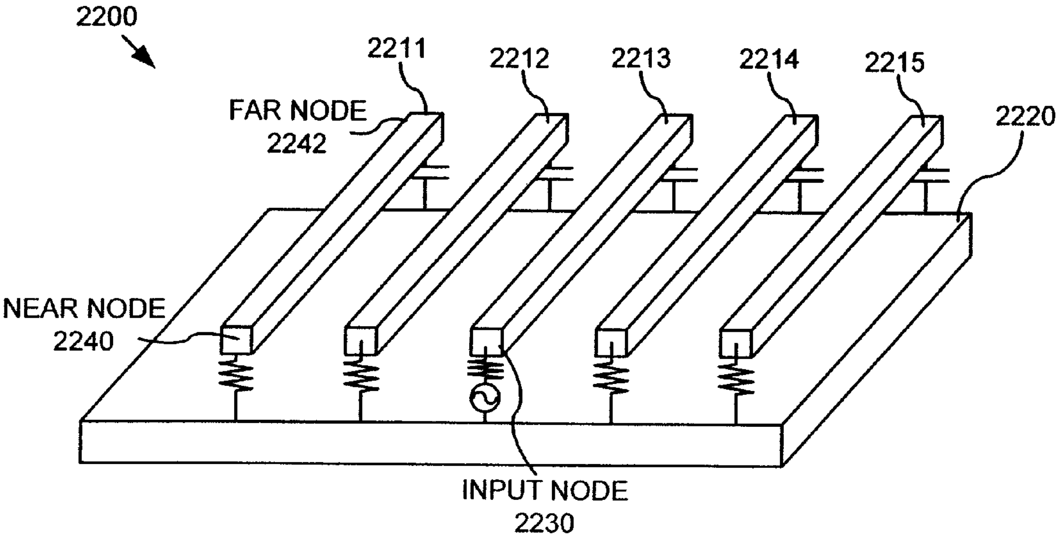
FIG. 22. is a schematic block diagram of a configuration comprising five signal-wire segments over a ground plane used during various experiments validating exemplary embodiments of the disclosed technology.

10. Validation of and Experimental Results for Exemplary Embodiments of the Disclosed Technology In this section, the application of an exemplary embodiment of the disclosed technology to an exemplary wire configuration formed by five parallel signal wires located over one ground plane is discussed. FIG. 22 is a schematic block diagram 2200 showing the exemplary configuration considered. Signal wires 2211, 2212, 2213, 2214, 2215 are parallel to each other and located over a ground plane 2220. An input node 2230 is also shown, as well as a representative near node 2240 and far node 2242 of signal wire 2211. It is to be understood, however, that each of the other signal wires 2212, 2213, 2214, 2215 similarly have respective near nodes and far nodes.

For purposes of this discussion, assume that the signal wires 2211, 2212, 2211, 2214, 2215 in the exemplary configuration have a length $L_s$=1 mm, width $w_s$=10 μm, and thickness $h_s$=3.5 μm. Furthermore, assume that the ground plane 2220 has a length $L_g$=1 mm, width $w_g$=110 μm, and thickness $h_g$=3.5 μm. Assume further that the edge-to-edge separation between the signal wires 2211, 2212, 2213, 2214, 2215 is s=5 μm and that the edge-to-edge separation between the signal wires 2211, 2212, 2213, 2214, 2215 and the ground plane 2220 is h=5 μm. Moreover, assume that the signal wires and ground plane are formed of copper (Cu) (σ=58 μm) and have a relative permeability of the medium ∈=3.9. Still further, assume that all lines have a load capacitance with the ground plane of $C_{load}$=2 pF and a resistance mimicking that of an active device $R_{tr}$=50Ω. Finally, assume that the middle signal line 2213 is fed by a sinusoidal voltage source with frequency f going from 1 GHz to 100 GHz at the input node 2230.

For this example, the interplay between capacitive and inductive effects is expected to be fully apparent. In addition, two of the most demanding issues for the exemplary inductance extraction method are present: shared ground configurations, and the existence of proximity effects in conjunction with fully developed skin effects.

The purpose of this configuration is to compare an exemplary embodiment of the methods described above (and in particular, the method described above with respect to FIGS. 31-34 and shown in the accompanying pseudocode) against the standard techniques, which are orders of magnitude slower than the described method.

For purposes of this comparison, the computation of the magnitude and phase of the transfer function (TF) was considered for the farthest quiet line $T(f)=V_{far}(f)/V_{input}(f)$ given an excitation to the center line, for each frequency of interest. The TF for this particular configuration has already been presented in M. Beattie, S. Gupta, and L. Pileggi, "Hierarchical interconnect circuit models," *Proc ICCAD* (November 2000), with RLC values coming from a field solver. It was desirable to reproduce these results using values of resistance, capacitance, and inductance coming from FastHenry and Quickcap (or FastCap), so that those tools could be used as a reference for the disclosed technology.

To perform the comparison, the matrices were reduced from the original 6×6 partial matrices to the loop 5×5 matrices. This was done by using the ground plane as the return path of all the signal wires. The loop R and L matrices were obtained with FastHenry. To this effect, the following was set in the FastHenry input file: a 4.equiv4 line in which all far nodes are short circuited followed by five 4.external4 lines, corresponding to sources between the near node of each signal line and the near node of the ground plane. The ground plane was represented as a solid wire instead of a mesh as in M. Beattie, S. Gupta, and L. Pileggi, "Hierarchical interconnect circuit models," *Proc ICCAD* (November 2000), in order to help ensure the equivalence of the examples. It was also verified that releasing this assumption had no significant impact in the shape of the waveform representing the TF.

The total capacitance matrix was obtained by running the capacitance simulator to the original configuration. The 5×5 submatrix of the output 6×6 matrix was stored:

$$\begin{pmatrix} C_1 & -C_{12} & -C_{13} & -C_{14} & -C_{15} & -C_{16} \\ -C_{21} & C_2 & -C_{23} & -C_{24} & -C_{25} & -C_{26} \\ -C_{31} & -C_{32} & C_3 & -C_{24} & -C_{35} & -C_{36} \\ -C_{41} & -C_{42} & -C_{43} & C_4 & -C_{45} & -C_{46} \\ -C_{51} & -C_{52} & -C_{53} & -C_{54} & C_5 & -C_{56} \\ -C_{61} & -C_{62} & -C_{63} & -C_{64} & -C_{65} & C_6 \end{pmatrix} \rightarrow \tag{67}$$

-continued $$\begin{pmatrix} C_1 & -C_{12} & -C_{13} & -C_{14} & -C_{15} \\ -C_{21} & C_2 & -C_{23} & -C_{24} & -C_{25} \\ -C_{31} & -C_{32} & C_3 & -C_{24} & -C_{35} \\ -C_{41} & -C_{42} & -C_{43} & C_4 & -C_{45} \\ -C_{51} & -C_{52} & -C_{53} & -C_{54} & C_5 \end{pmatrix}$$

with $C_{ij}$ the capacitance between wire i and wire j and $C_i=\Sigma_{j\neq i}C_{ij}$, where i=6 represents the ground plane.

Figure 23:
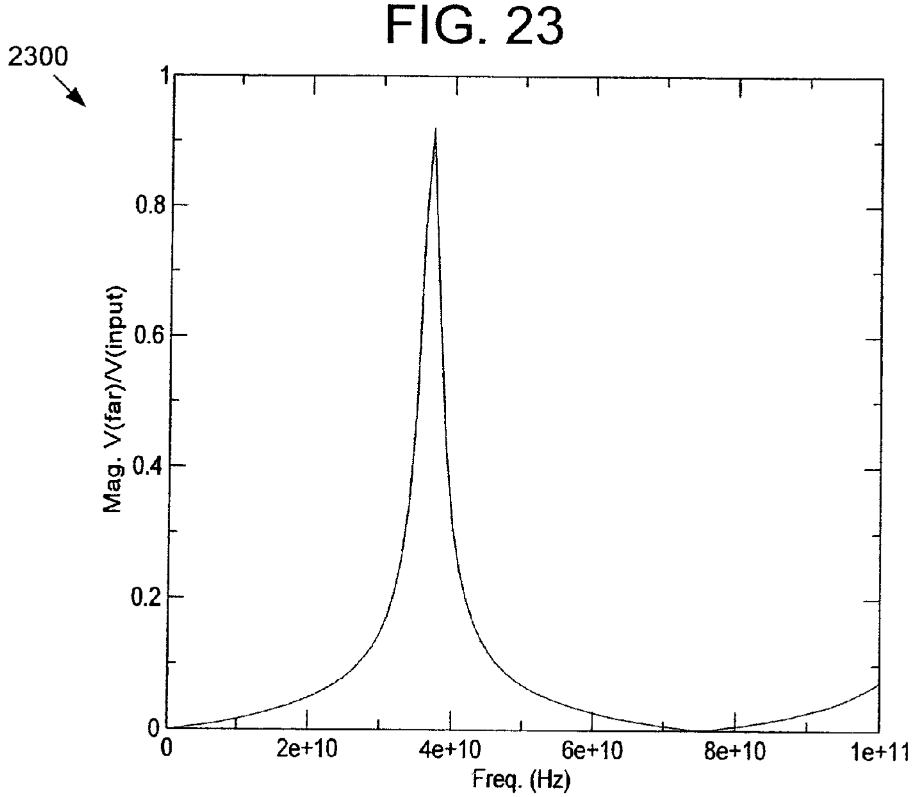
FIG. 23 is a graph of the magnitude of the transfer function for the far node of the farthest quiet line of the configuration illustrated in FIG. 22 computing using a circuit simulator with exemplary test parameters.

Once the impedance matrices for each frequency datapoint were computed, the impedance matrices were entered into a transmission line model inside a circuit netlist. The Mentor Graphics' Eldo® circuit simulator was run for each frequency datapoint, given the sinusoidal excitations. FIG. 23 is a graph 2300 of the results produced, in particular the magnitude of the transfer function for the far node of the farthest quiet line (far node 2242). The results from M. Beattie, S. Gupta, and L. Pileggi, "Hierarchical interconnect circuit models," *Proc ICCAD* (November 2000) and FIG. 23 agree well with each. In particular, the resonance frequency, the most sensitive parameter, matches well.

The previous investigation was repeated using RL parameters coming from a mutual inductance engine using the exemplary method described above and C parameters coming from Mentor Graphics' xRC production tool. The loop impedance of signal wires in the presence of a ground plane was computed using an exemplary technique as described in Section 8. Large ground planes are desirably not treated as standard wires, except at very low frequencies. Thus, partitioning of the current distribution in a nonuniform fashion as a function of frequency was desirable, as was the solving of the matrix system of linear equations representing the Ohm's KVL for the ensemble of filaments.

Figure 24:
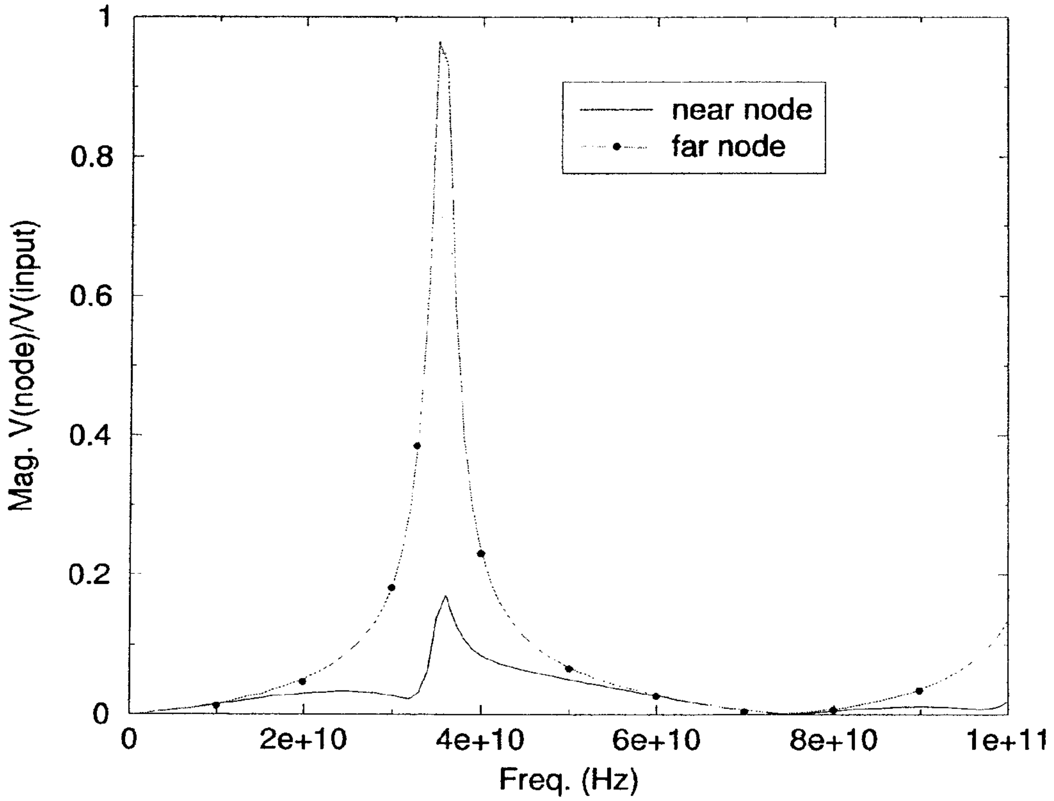
FIG. 24 is a graph of the magnitude of the transfer function for the far node and the near node of the farthest quiet line of the configuration illustrated in FIG. 22 computing using a circuit simulator with exemplary test parameters.

For this investigation, the sensitivity to the skin effect was not included on the signal wires themselves, as the skin effect is less important at frequencies that are accessible by today's leading technologies. Thus, for purposes of this discussion, the transverse dimensions of signal wires were not partitioned, since the typical application of the exemplary method is for frequencies for which the skin effect in signal wires is negligible. However, computations were still performed for frequencies up to where skin effects become important. This was done to illustrate some emerging aspects of parasitic influence that have been previously unseen in the digital domain—for example, resonance behavior and the asymmetry between forward and backward coupling. This last aspect is illustrated in graph 2400 shown in FIG. 24, where the magnitude of the voltage at the far node of the farthest quiet line (far node 2242) is compared to that at the near node in the same line (near node 2240), both of them normalized by the magnitude of the voltage at the input node (input node 2230).

For the test configuration used in the comparison, the signal lines were set as being $w_s$=10 μm wide, which is almost one order of magnitude larger than twice the skin depth at 10 GHz (δ(10 GHz)=0.65 μm) with the material being Cu. To make the comparison meaningful, no partitioning of the signal wires into filaments was done with FastHenry when computing the reference transfer function.

An input GDSII file and technology files were written in order to extract the electromagnetic parameters of the test configuration using the xRC and xM software tools available from Mentor Graphics and modified to perform exemplary embodiments of the disclosed technology (in particular, the embodiments illustrated in FIGS. 31-34). The mutual inductance parameters in the per unit length (p.u.l) description of the circuit introduced into the Eldo® simulation engine were the result of using xM technology at the reference frequency of 10 GHz. Since the dependence of the mutual inductance with frequency is almost negligible, significant deviations were not expected due to this.

Figure 25:
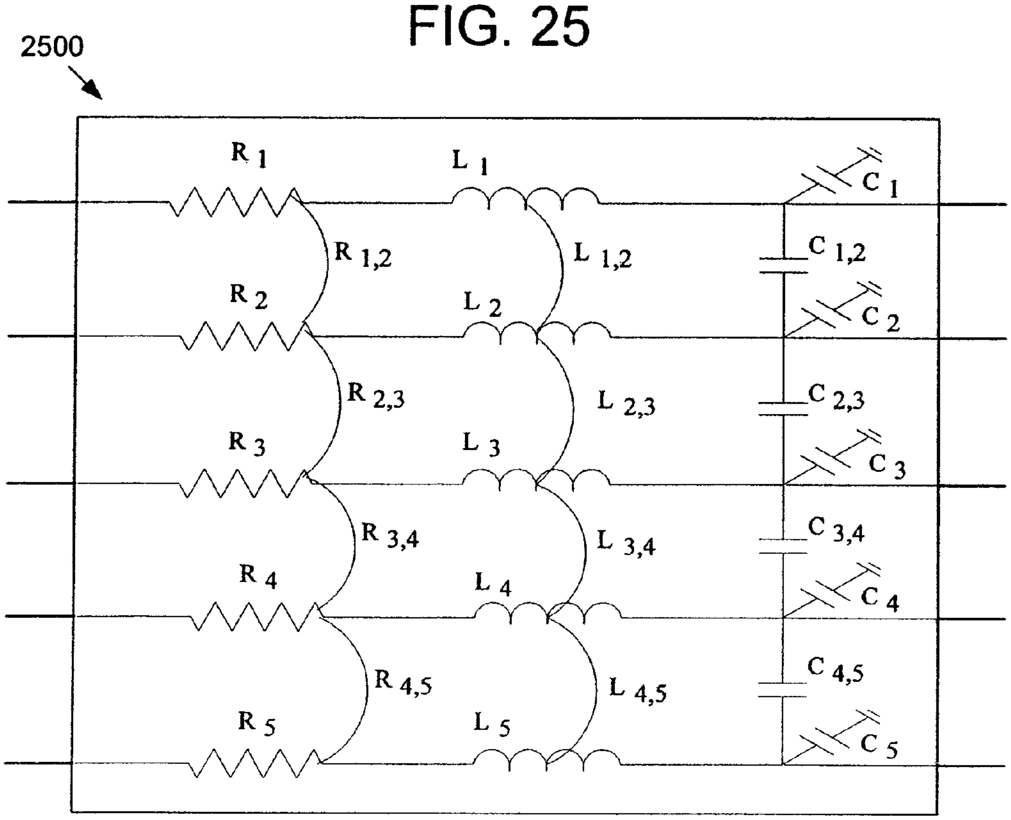
FIG. 25 is a schematic block diagram of a representation based on a cascade of RLC lumped elements considered during experiments validating exemplary embodiments of the disclosed technology.

Two different models were used for the timing simulation of the exemplary wire configuration: one based on a cascade of RLC lumped elements and the other based on a continuous transmission line model. The cascade of RLC lumped elements is illustrated as the 5-port RLC lumped element representation 2500 in FIG. 25. In FIG. 25, resistive, inductive, and capacitive couplings between non-nearest neighbor wires are included in the computation but not displayed for the sake of clarity.

Figure 26:
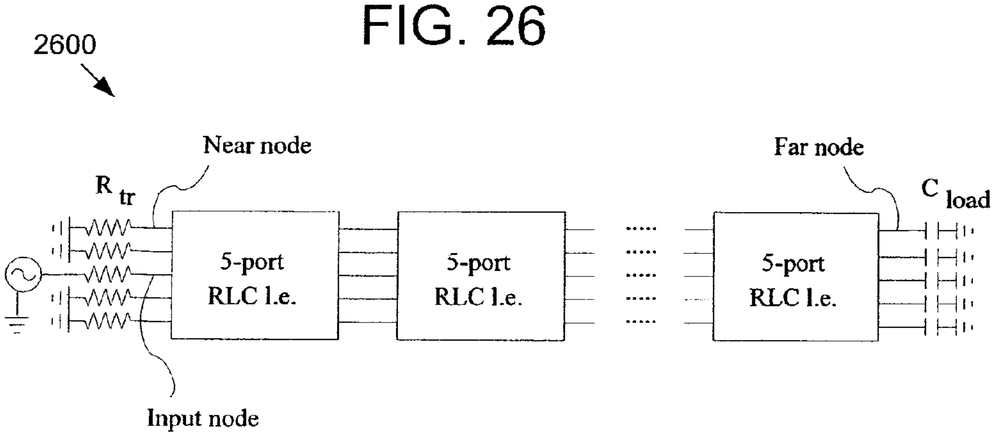
FIG. 26 is a schematic block diagram of a representation based on a continuous transmission line considered during experiments validating exemplary embodiments of the disclosed technology.

FIG. 26 shows a representation 2600 of the electrical view of the simulated configuration as a cascade of 5-port lumped elements. In the cascade model, the RLC elements were obtained by fracturing each of the signal lines into segments of ≈47.62 μm each. For this and other lengths on the order of 50 μm and beyond, forward coupling is ordinarily not needed. Since all the segments of this example were equal, it was straight forward to extract the p.u.l electrical parameters directly from the computation of a single unit of the above length (the total number of partitions being equal to 21). Since it was desired to represent accurately the physical system up to 100 GHz, the fracturing length was selected accordingly. For instance, the max length of a segment in this example, for a frequency f, can be given by $$L_{max} = \frac{c}{10f\sqrt{\varepsilon}} \tag{68}$$

with c the speed of light in the vacuum and ∈ the relative permeability of the medium. The selection of L=47.62 μm amply satisfied this bound.

In the continuous transmission line model, the p.u.l. parameters were extracted using the entire configuration without any fracturing. The Eldo® simulation engine has hardwired the frequency representation of the multiple transmission line model under the name of "W model". (See, *Eldo Circuit Simulator*, Mentor Graphics Corporation, http://www.mentor.com/eldo).

To perform the experiment, the following method acts were performed for each one of the two models: (1) select a configuration (e.g., number of wires, relative position, dielectric constant, wire material); (2) generate a GDSII; (3) generate technology files for the capacitance and inductance engines; (3) run the capacitance engine; (4) run Mentor's xRCC engine (extract the total R's, C's and CC's); (5) run the modified xM engine (with ground plane model on) and extract loop R and loop L and loop M at 10 GHz; (6) convert the electrical parameters to p.u.l.; (7) generate the corresponding netlists for the whole circuit; (8) run Mentor's model order reduction TICER reduction engine when using discrete version of the circuit; (9) perform timing simulation in the frequency space (AC simulation up to 100 GHz); (10) compare to results generated with the netlist containing FastHenry and FastCap parameters.

Figure 27:
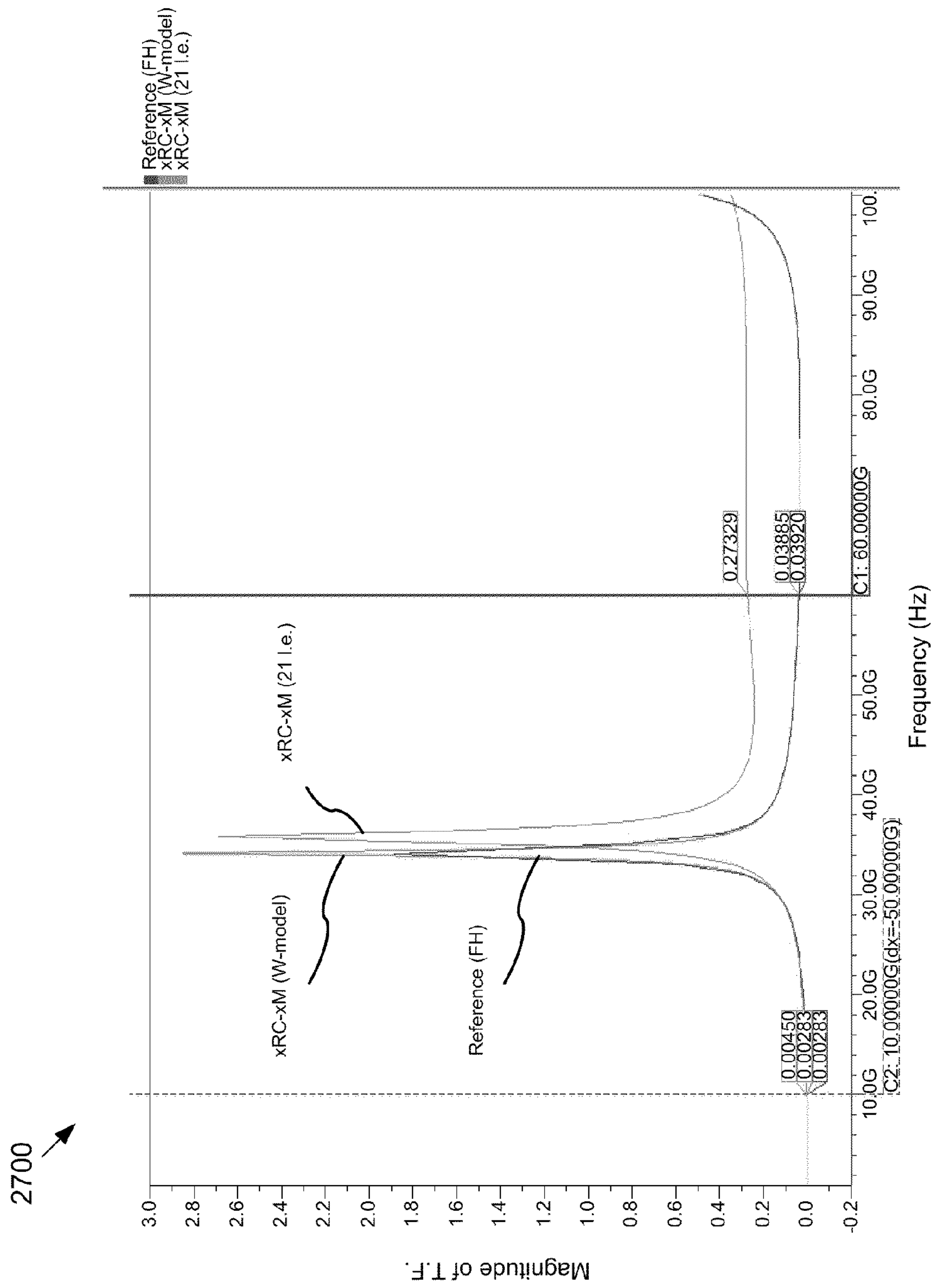
FIGS. 27-30 are graphs of the magnitude of the transmission function as a function of frequency obtained from various impedance analysis tools, including an exemplary test tool using embodiments of the disclosed technology, for the configuration of FIG. 22 with exemplary test parameters.
Figure 28:
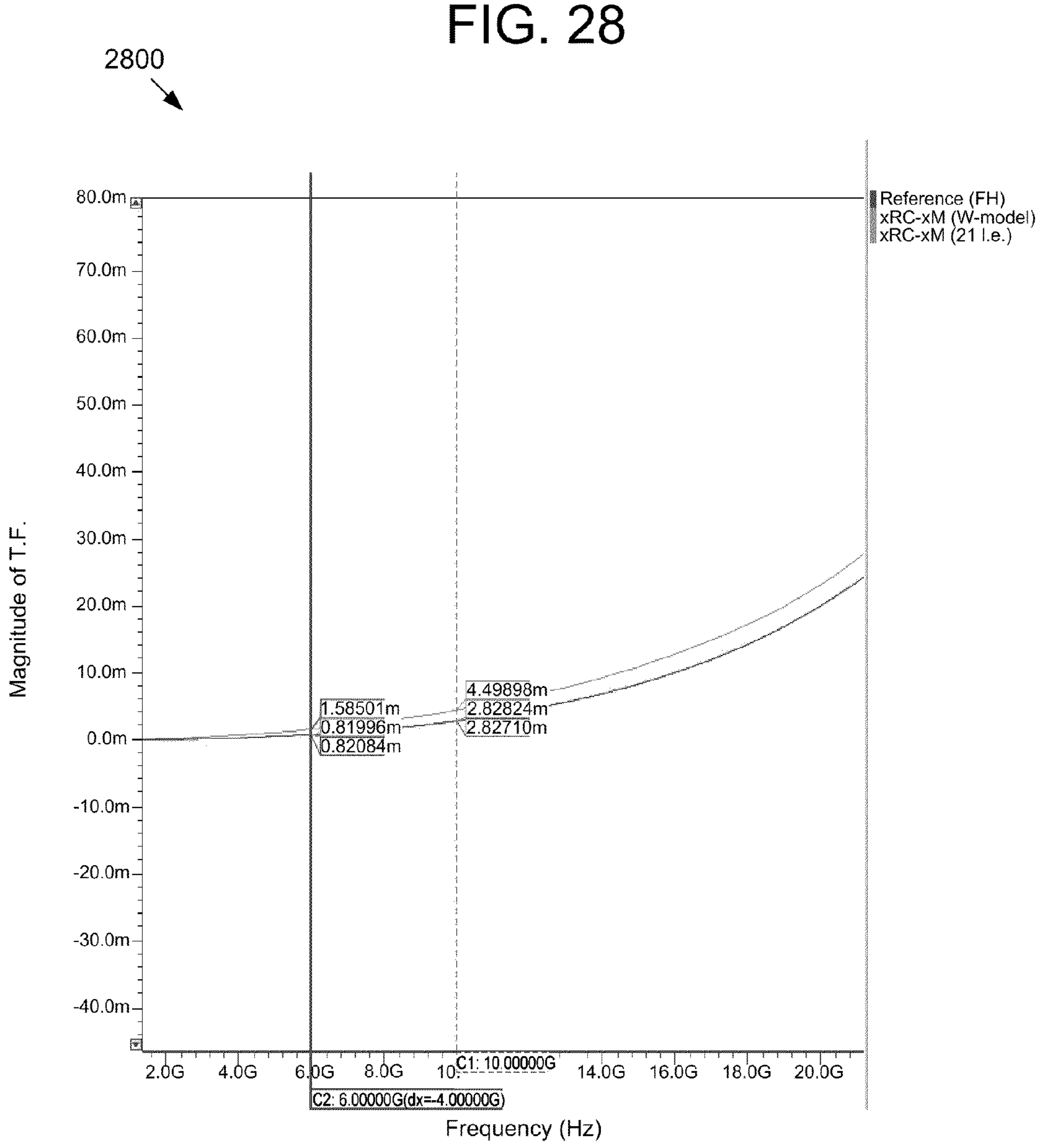

The magnitude of the transfer function of the far node of the farthest quiet line is presented in FIG. 27 and a zoom of the 1-20 GHz region in FIG. 28. In particular, FIG. 27 shows a graph 2700 of the magnitude of the TF as a function of frequency. In graph 2700, the reference (Fast Henry) is shown against the continuous (W-model in ELDO) and lumped netlist produced by the modified xRC-xM engines. FIG. 28 shows a graph 2800 of the magnitude of the TF for frequencies below 20 GHz. In graph 2800, the reference (Fast Henry) is shown against the W-model and lumped netlist produced by xRC-xM. It can be observed from the figures that the 21 lumped elements are not very accurate at frequencies below the resonance frequency due to the fact that mutual resistances were neglected. The W-model produced by the modified xRC-xM engines, however, was very accurate.

Figure 29:
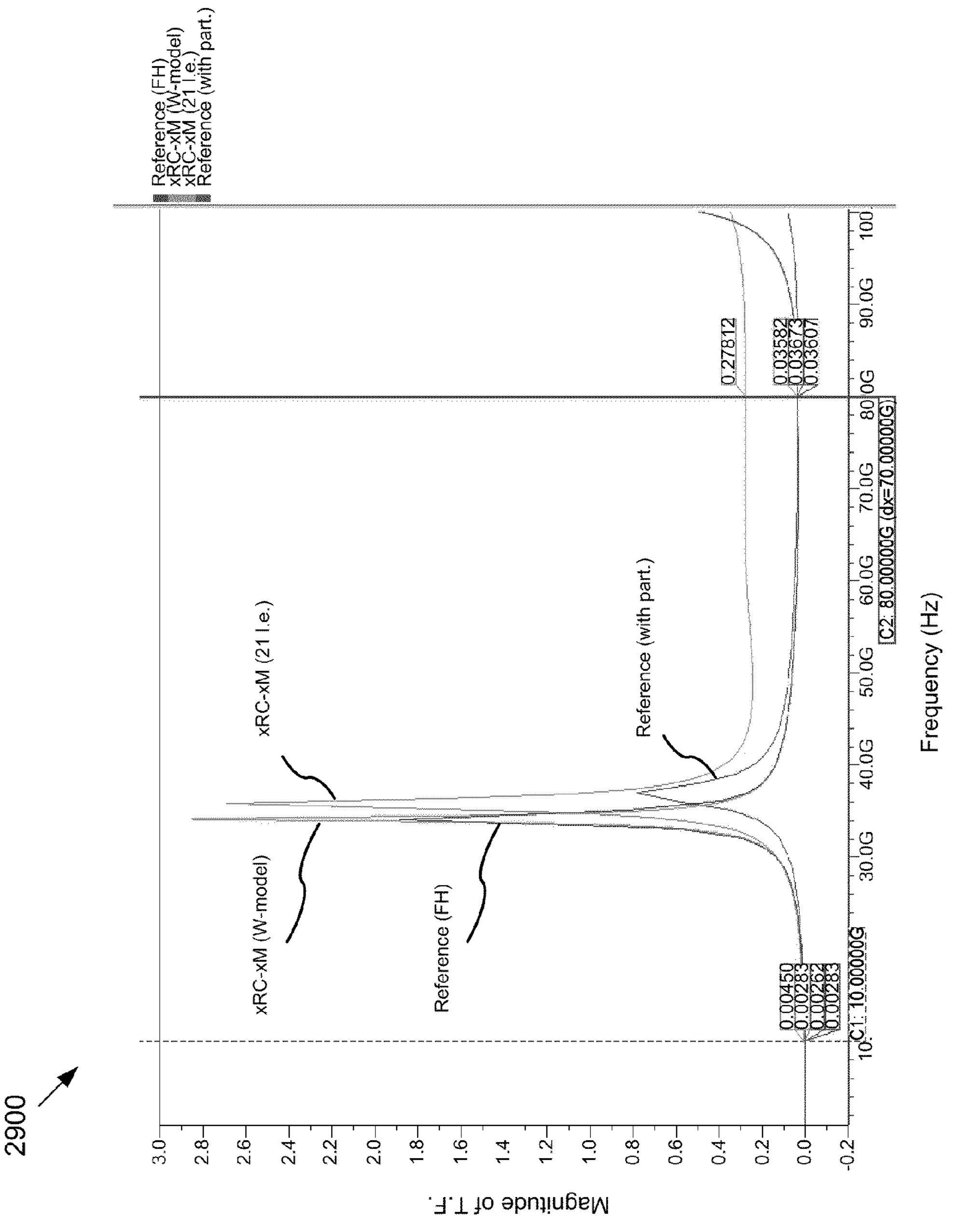
Figure 30:
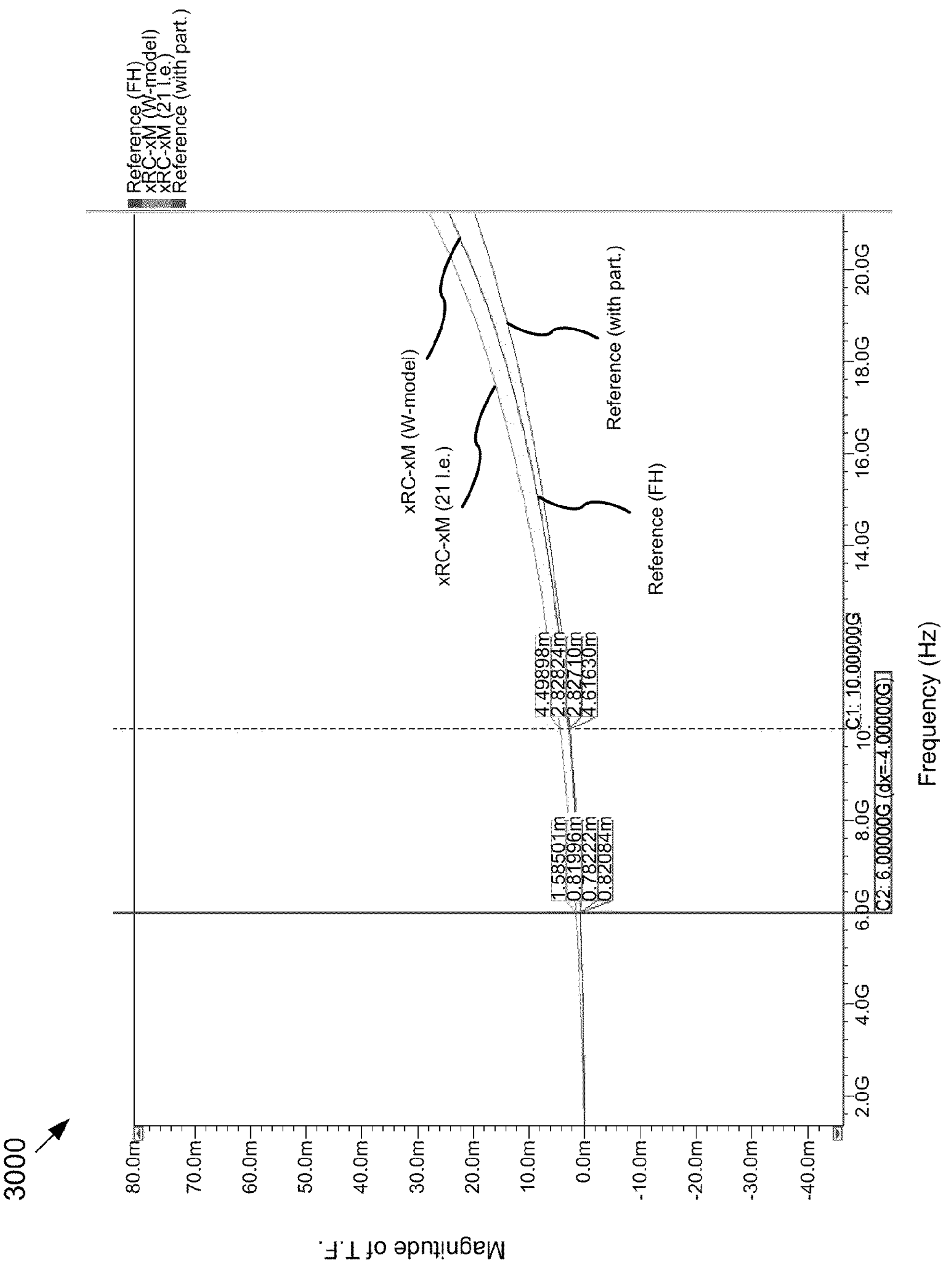

The reference function was also replotted by forcing FastHenry to partition into filaments the signal wires. This was done in order to have an idea of how the previous assumption of homogeneous currents going through the signals would affect the accuracy of the exemplary method. In FIG. 29 and FIG. 30, the new reference transfer function is compared with both the lumped elements and transmission line models. In particular, FIG. 29 is a graph 2900 of the magnitude of the TF as a function of frequency. In FIG. 29, the W-model is compared with the new reference with no partitioning of the signal wires. FIG. 30 is a graph 3000 of the magnitude of the TF for frequencies below 20 GHz. In FIG. 30, the W-model is compared with the new reference with no partitioning of the signal wires.

The results with the continuous W-model indicate that mutual resistances are desirably included in the discrete-lumped element netlist. With their inclusion as current controlled voltage sources, the results of the discrete model agree with those of the W model. The Eldo® timing simulator is desirably modified by replacing mutual inductance with a mutual impedance containing real and imaginary parts, where the real part is the mutual resistance and the imaginary part is ω times the mutual inductance. This permits the treatment of the mutual resistance as a linear element in solving the linear system, rather than a nonlinear general H device.

11. Exemplary Network Environments for Applying the Disclosed Techniques

Figure 35:
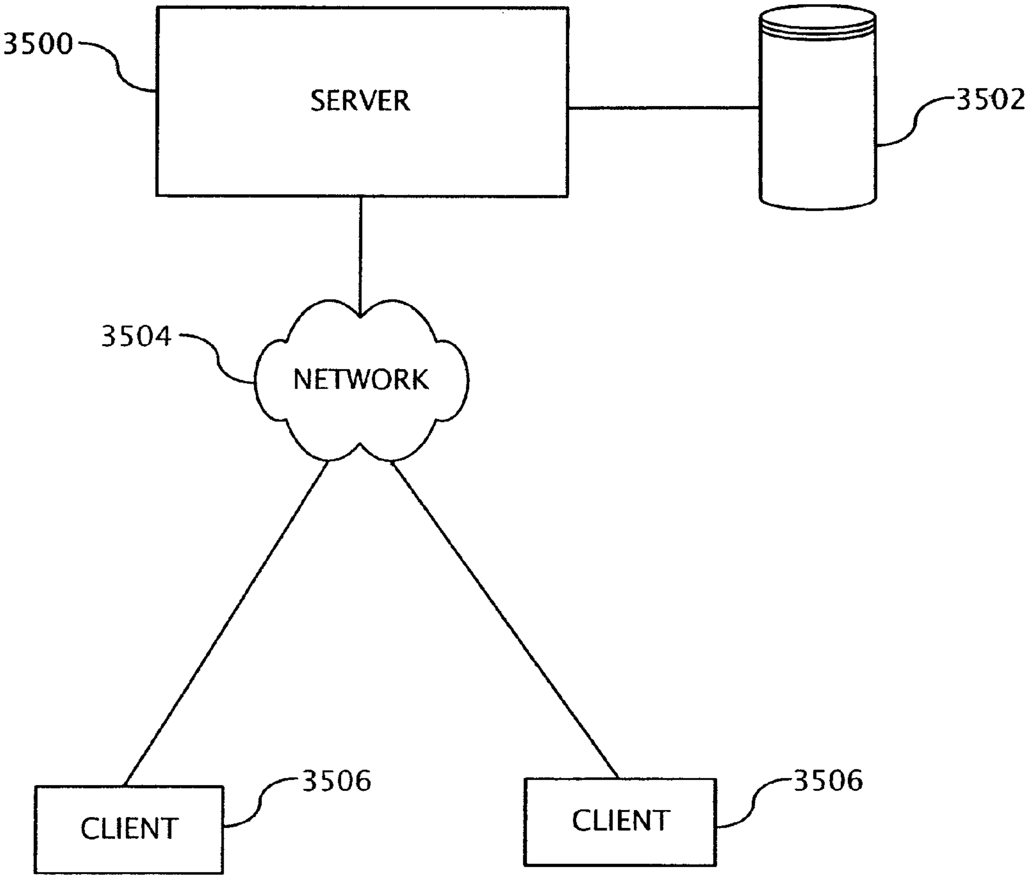
FIG. 35 is a block diagram of a first exemplary network that may be used to perform any of the disclosed impedance extraction techniques.

Any of the aspects of the technology described above may be performed using a distributed computer network. FIG. 35 shows one such exemplary network. A server computer 3500 can have an associated storage device 3502 (internal or external to the server computer). For example, the server computer 3500 can be configured to perform an impedance extraction technique according to any of the disclosed embodiments (e.g., as part of an EDA software tool, such as a physical verification or synthesis tool). The server computer 3500 can be coupled to a network, shown generally at 3504, which can comprise, for example, a wide-area network, a local-area network, a client-server network, the Internet, or other such network. One or more client computers, such as those shown at 3506, 3508, may be coupled to the network 3504 using a network protocol. The work may also be performed on a single, dedicated workstation, which has its own memory and one or more CPUs.

Figure 36:
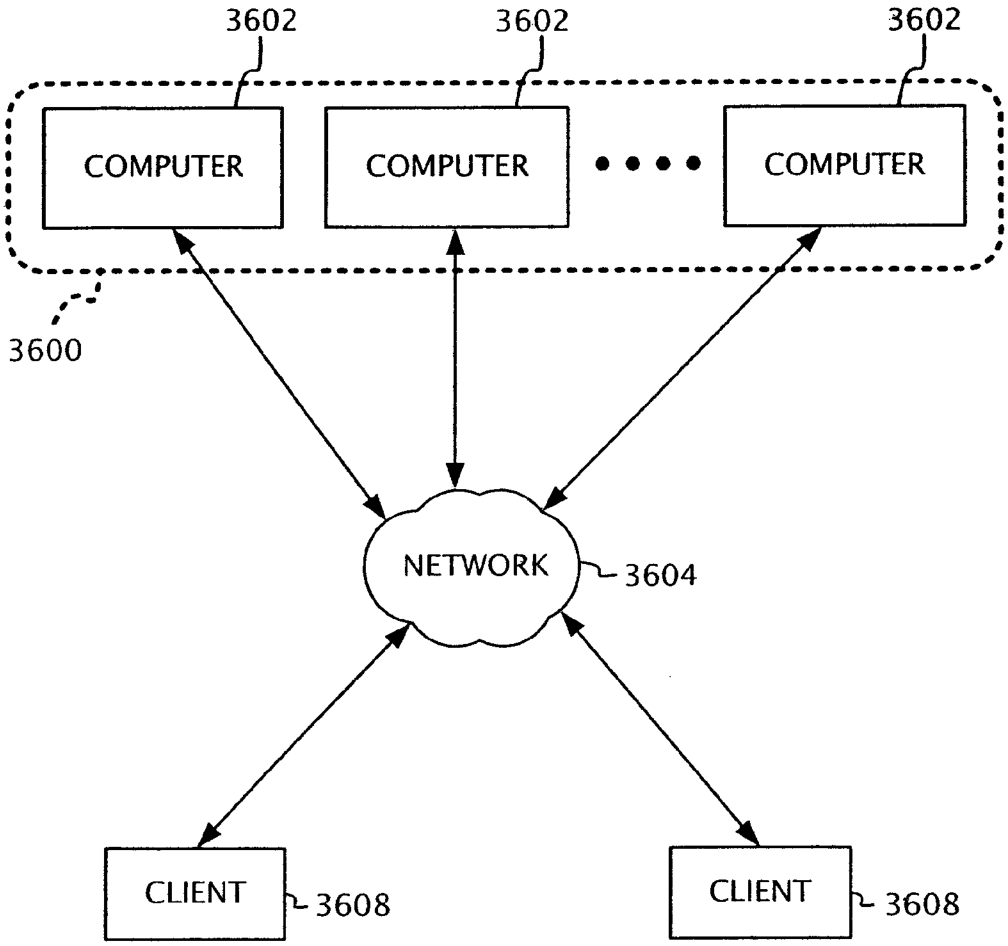
FIG. 36 is a block diagram of a second exemplary network that may be used to perform any of the disclosed impedance extraction techniques.

FIG. 36 shows another exemplary network. One or more computers 3602 communicate via a network 3604 and form a computing environment 3600 (e.g., a distributed computing environment). Each of the computers 3602 in the computing environment 3600 can be used to perform at least a portion of an impedance extraction technique according to any of the disclosed embodiments (e.g., as part of an EDA software tool, such as a physical verification or synthesis tool). For instance, each of the computers may perform impedance extraction for different portions of the circuit design or according to various other criteria. The network 3604 in the illustrated embodiment is also coupled to one or more client computers.

Figure 37:
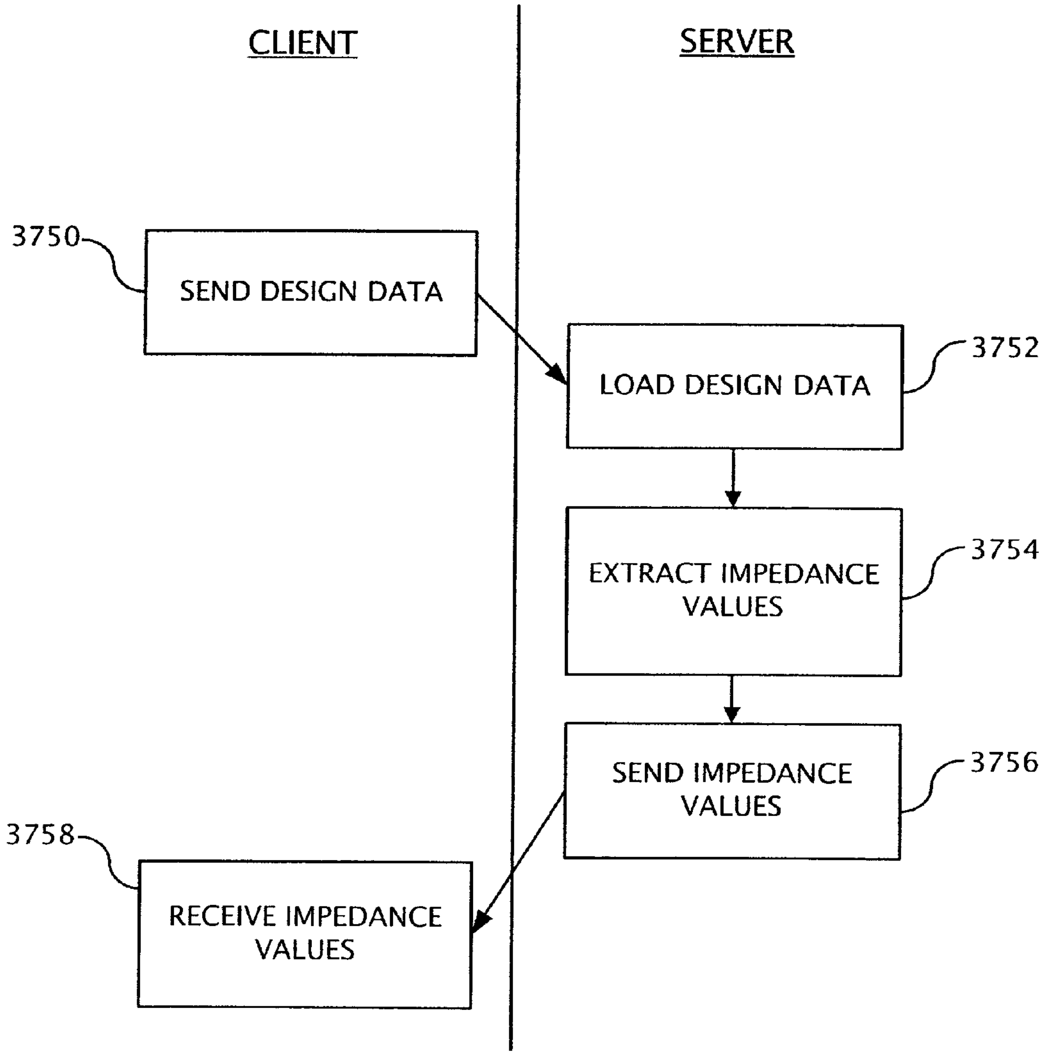
FIG. 37 is a flowchart showing an exemplary manner in which the network of FIG. 35 or FIG. 36 may be used.

FIG. 37 shows that a database or data structure containing design information (e.g., a GDSII, Oasis file, or other such file indicative of a circuit layout) can be analyzed using a remote server computer (such as the server computer 3500 shown in FIG. 35) or a remote computing environment (such as the computing environment 3600 shown in FIG. 36) in order to extract one or more parasitic inductance values (e.g., mutual inductance between inductors) using any of the embodiments disclosed herein. At process block 3702, for example, the client computer sends design data to the remote server or computing environment. For instance, the client computer may send a GDSII, Oasis file, or other EDA design file along with any other data used in the extraction process). In process block 3704, the design data is received and loaded by the remote server or by respective components of the remote computing environment. In process block 3706, impedance values (e.g., self inductance values, mutual inductance values, capacitance values, and the like) are determined using any of the disclosed embodiments. At process block 3708, the remote server or computing environment sends the impedance values determined to the client computer, which receives the data at process block 3710. For example, a database or data structure of the relevant impedance values computed by the impedance extraction procedure can be created. The impedance values can be stored, for example, as an updated version of the circuit design data (e.g., included in fields related to each signal wire) or as one or more separate files or data structures (e.g., a Spice file, such as a Spice netlist). It should be apparent to those skilled in the art that the example shown in FIG. 37 is not the only way to obtain parasitic extraction results using multiple computers. For instance, the design data may be stored on a computer-readable medium that is not on a network and that is sent separately to the server or computing environment (e.g., a CD-ROM, DVD, or portable hard drive). Or, the server computer or remote computing environment may perform only a portion of the extraction procedures.

Having illustrated and described the principles of the illustrated embodiments, it will be apparent to those skilled in the art that the embodiments can be modified in arrangement and detail without departing from such principles. In view of the many possible embodiments, it will be recognized that the illustrated embodiments include only examples and should not be taken as a limitation on the scope of the invention. Rather, the invention is defined by the following claims. We therefore claim as the invention all such embodiments that come within the scope of these claims.

What is claimed is:

1. One or more computer-readable storage media storing computer-executable instructions which when executed by a computer cause the computer to perform a method, the method comprising:

receiving from a user an indication of a number of paths n to be used as return paths for signal-wire segments during an impedance extraction process;

selecting a signal-wire segment from a circuit layout;

identifying return paths for the selected signal-wire segment without specification of the return paths by the user, wherein the number of return paths identified does not exceed and is based on the number of paths n; and determining one or more inductance values for the selected signal-wire segment based at least in part on the identified return paths.

2. The one or more computer-readable storage media of claim 1, wherein the return paths identified are the nearest n return paths to the selected signal-wire segment.

3. The one or more computer-readable storage media of claim 1, wherein the method further comprises determining one or more resistance values for the selected signal-wire segment based at least in part on the identified return paths.

4. The one or more computer-readable storage media of claim 1, wherein the circuit layout comprises GDSII or Oasis data.

5. The one or more computer-readable storage media of claim 1, wherein the return paths comprise one or more return path segments.

6. The one or more computer-readable storage media of claim 1, wherein the method further comprises providing a graphical user interface through which the user can input the indication of the number of paths n to be used as return paths.

7. The one or more computer-readable storage media of claim 1, wherein the method comprises storing the one or more inductance values as part of a Spice file or Spice netlist.

8. The one or more computer-readable storage media of claim 1, wherein the selecting the signal-wire segment is based on input from the user.

9. The one or more computer-readable storage media of claim 1, wherein the method further comprises generating one or more bundles for the signal-wire segment, the generating comprising bundling the signal-wire segment with return path subsegments of the return paths that have the same length and are parallel to the signal-wire segment.

10. The one or more computer-readable storage media of claim 9, wherein the method further comprises determining a signal current for the one or more bundles, and determining one or more inductance values for loops associated with the one or more bundles, and wherein the determining one or more inductance values for the selected signal-wire segment comprises computing a loop impedance using the one or more inductance values for the loops associated with the one or more bundles.

11. One or more computer-readable storage media storing computer-executable instructions which when executed by a computer cause the computer to perform a method, the method comprising:

selecting a signal-wire segment from a circuit layout;

receiving from a user an indication of a region around the signal-wire segment to search for return paths during an impedance extraction process;

identifying return paths for the selected signal-wire segment without specification of the return paths by the user, wherein the identified return paths are within the region indicated by the user; and determining one or more inductance values for the selected signal-wire segment, the determining of the one or more inductance values being based at least in part on the identified return paths.

12. The one or more computer-readable storage media of claim 11, wherein the indication of the region comprises a width of the region.

13. The one or more computer-readable storage media of claim 11, wherein the region is a three-dimensional region.

14. The one or more computer-readable storage media of claim 11, wherein the method further comprises determining one or more resistance values for the selected signal-wire segment based at least in part on the identified return paths.

15. The one or more computer-readable storage media of claim 11, wherein the circuit layout comprises GDSII or Oasis data.

16. The one or more computer-readable storage media of claim 11, wherein the return paths comprise one or more return path segments.

17. The one or more computer-readable storage media of claim 11, wherein the method further comprises providing a graphical user interface through which the user can input the indication of the region around the signal-wire segment to search for return paths.

18. The one or more computer-readable storage media of claim 11, wherein the method further comprises storing the one or more inductance values as part of a Spice file or Spice netlist.

19. The one or more computer-readable storage media of claim 11, wherein the selecting the signal-wire segment is based on input from the user.

20. A method, comprising:

selecting a signal-wire segment from a circuit layout;

receiving from a user one or more of an indication of a region around the signal-wire segment to search for return paths or an indication of a number of paths n to be used as return paths for the signal-wire segment during an impedance extraction process;

by a computer and without specification from the user of any return path, identifying return paths for the selected signal-wire segment, wherein the identified return paths are identified based on the number of paths indicated; and computing one or more inductance values for the selected signal-wire segment based at least in part on the identified return paths.

21. The method of claim 20, wherein the method further comprises determining one or more resistance values for the selected signal-wire segment based at least in part on the identified return paths.

22. The method of claim 20, wherein the return paths comprise one or more return path segments.

* * * * *